US012696747B2

(12) United States Patent
 Ohmori

(10) Patent No.: US 12,696,747 B2
(45) Date of Patent: Jul. 28, 2026

(54) SEMICONDUCTOR DEVICE

(71) Applicant: ROHM CO., LTD., Kyoto (JP)

(72) Inventor: Kengo Ohmori, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 566 days.

(21) Appl. No.: 18/023,754

(22) PCT Filed: Aug. 24, 2021

(86) PCT No.: PCT/JP2021/031058
§ 371 (c)(1),
(2) Date: Feb. 28, 2023

(87) PCT Pub. No.: WO2022/054572
PCT Pub. Date: Mar. 17, 2022

(65) Prior Publication Data
US 2023/0245951 A1     Aug. 3, 2023

(30) Foreign Application Priority Data

Sep. 8, 2020     (JP) ................................. 2020-150342

(51) Int. Cl.
| *H10W 20/20* | (2026.01) |
| *H10W 72/30* | (2026.01) |
| *H10W 72/50* | (2026.01) |
| *H10W 74/10* | (2026.01) |
| *H10W 72/00* | (2026.01) |
| *H10W 74/00* | (2026.01) |

(52) U.S. Cl.
CPC ........... *H10W 20/20* (2026.01); *H10W 72/30* (2026.01); *H10W 72/50* (2026.01); *H10W 74/111* (2026.01); *H10W 72/884* (2026.01); *H10W 74/00* (2026.01)

(58) Field of Classification Search
None
See application file for complete search history.

(56) References Cited

U.S. PATENT DOCUMENTS

| 2011/0227069 A1 | 9/2011 | Hashimoto |
| 2013/0193479 A1 | 8/2013 | Hashimoto |
| (Continued) | | |

FOREIGN PATENT DOCUMENTS

| JP | 2011-198891 A | 10/2011 |
| JP | 2018-163919 A | 10/2018 |

OTHER PUBLICATIONS

International Search Report and Written Opinion mailed on Nov. 22, 2021, received for PCT Application PCT/JP2021/031058, filed on Aug. 24, 2021, 12 pages including English Translation.
(Continued)

*Primary Examiner* — Cory W Eskridge
(74) *Attorney, Agent, or Firm* — XSENSUS LLP

(57) ABSTRACT

This semiconductor device includes a first switching element, a second switching element, and a resin layer that seals each switching element. The semiconductor device includes: a power supply electrode which is formed on the surface of the resin layer and of which at least a part overlaps the first switching element when viewed from a z direction; and a power supply via conductor that electrically connects the first switching element and the power supply electrode through the resin layer in the z direction.

13 Claims, 40 Drawing Sheets

(56) References Cited

U.S. PATENT DOCUMENTS

| | | | |
|---|---|---|---|
| 2013/0256912 A1* | 10/2013 | Prueckl | H01L 24/95 |
| | | | 438/109 |
| 2014/0367685 A1 | 12/2014 | Hashimoto | |
| 2015/0115458 A1* | 4/2015 | Palm | H01L 21/568 |
| | | | 257/774 |
| 2016/0233140 A1 | 8/2016 | Lai et al. | |
| 2020/0058592 A1* | 2/2020 | Kim | H01L 21/4857 |

OTHER PUBLICATIONS

Office Action mailed Feb. 25, 2025 in corresponding Japanese
patent application No. 2022-547481 (12 pages; with English machine
translation).

* cited by examiner

SEMICONDUCTOR DEVICE

CROSS-REFERENCE TO RELATED APPLICATIONS

The present application is based on PCT filing PCT/JP2021/031058, filed Aug. 24, 2021, which claims priority to Japanese Patent Application No. 2020-150342, filed Sep. 8, 2020, the entire contents of each are incorporated herein by reference.

TECHNICAL FIELD

The present disclosure relates to a semiconductor device.

BACKGROUND ART

It is known in the prior art that a semiconductor device is packaged by encapsulating a plurality of semiconductor elements with an encapsulation resin. Patent Literature 1 discloses an example of a semiconductor device that includes a plurality of switching elements as semiconductor elements, a driver that drives the switching elements, metal lead frame terminals that support the switching elements and the driver, and an encapsulation resin that encapsulates the switching elements and the driver. The lead frame terminal includes an external electrode exposed to the outside of the semiconductor device.

CITATION LIST

Patent Literature

Patent Literature 1: Japanese Laid-Open Patent Publication No. 2011-198891

SUMMARY OF INVENTION

Technical Problem

In the semiconductor device of Patent Literature 1, the switching elements and the lead frame terminals are electrically connected by wires formed through wire bonding. Thus, each of the switching elements is electrically connected to the driver. In this case, the wires are curved and bulged. Hence, it is difficult to shorten the wires. Accordingly, it is difficult to shorten a conductive path in the semiconductor device. There is room for improvement in reduction in inductance related to the length of the conductive wire.

It is an objective of the present disclosure to provide a semiconductor device that reduces inductance.

Solution to Problem

To achieve the above objective, a semiconductor device includes a switching element, a specified element, a resin layer that encapsulates the switching element and the specified element. A thickness-wise direction of the resin layer conforms to a height-wise direction of the semiconductor device. The semiconductor device further includes an external electrode formed on a surface of the resin layer, at least a portion of the external electrode overlapping the switching element as viewed in the height-wise direction, and an element drive via conductor extending through the resin layer in the height-wise direction to electrically connect the switching element and the external electrode.

In this structure, the switching element and the external electrode are connected by the element drive via conductor extending through the resin layer in the height-wise direction. This shortens the conductive path between the switching element and the external electrode as compared to a structure in which the switching element and the external electrode are connected by a wire formed through wire bonding. Accordingly, inductance caused by the length of the conductive path is reduced.

To achieve the above objective, a semiconductor device includes a switching element, a driver configured to drive the switching element, and a resin layer that encapsulates the switching element and the driver. A thickness-wise direction of the resin layer conforms to a height-wise direction of the semiconductor device. The switching element and the driver are spaced apart from each other in a direction orthogonal to the height-wise direction. An element control via conductor is embedded in the resin layer and connects the switching element and the driver.

In this structure, the switching element and the driver are connected by the element control via conductor embedded in the resin layer. This shortens the conductive path between the switching element and the driver as compared to a structure in which the switching element and the driver are connected by a wire formed through wire bonding. Accordingly, inductance caused by the length of the conductive path is reduced.

Advantageous Effects of Invention

The semiconductor device described above reduces inductance.

BRIEF DESCRIPTION OF DRAWINGS

FIG. 2 is a plan view showing a substrate of the semiconductor device of FIG. 1 on which switching elements and a driver are mounted.

FIG. 29 is a plan view showing the semiconductor device of the modified example.

DESCRIPTION OF EMBODIMENTS

Embodiments of a semiconductor device will be described below with reference to the drawings. The embodiments described below exemplify configurations and methods for embodying a technical concept and are not intended to limit the material, shape, structure, layout, dimensions, and the like of each component to those described below. The embodiments described below may undergo various modifications.

Structure of Semiconductor Device

An embodiment of a semiconductor device 10 will now be described with reference to FIGS. 1 to 9.

Figure 1:
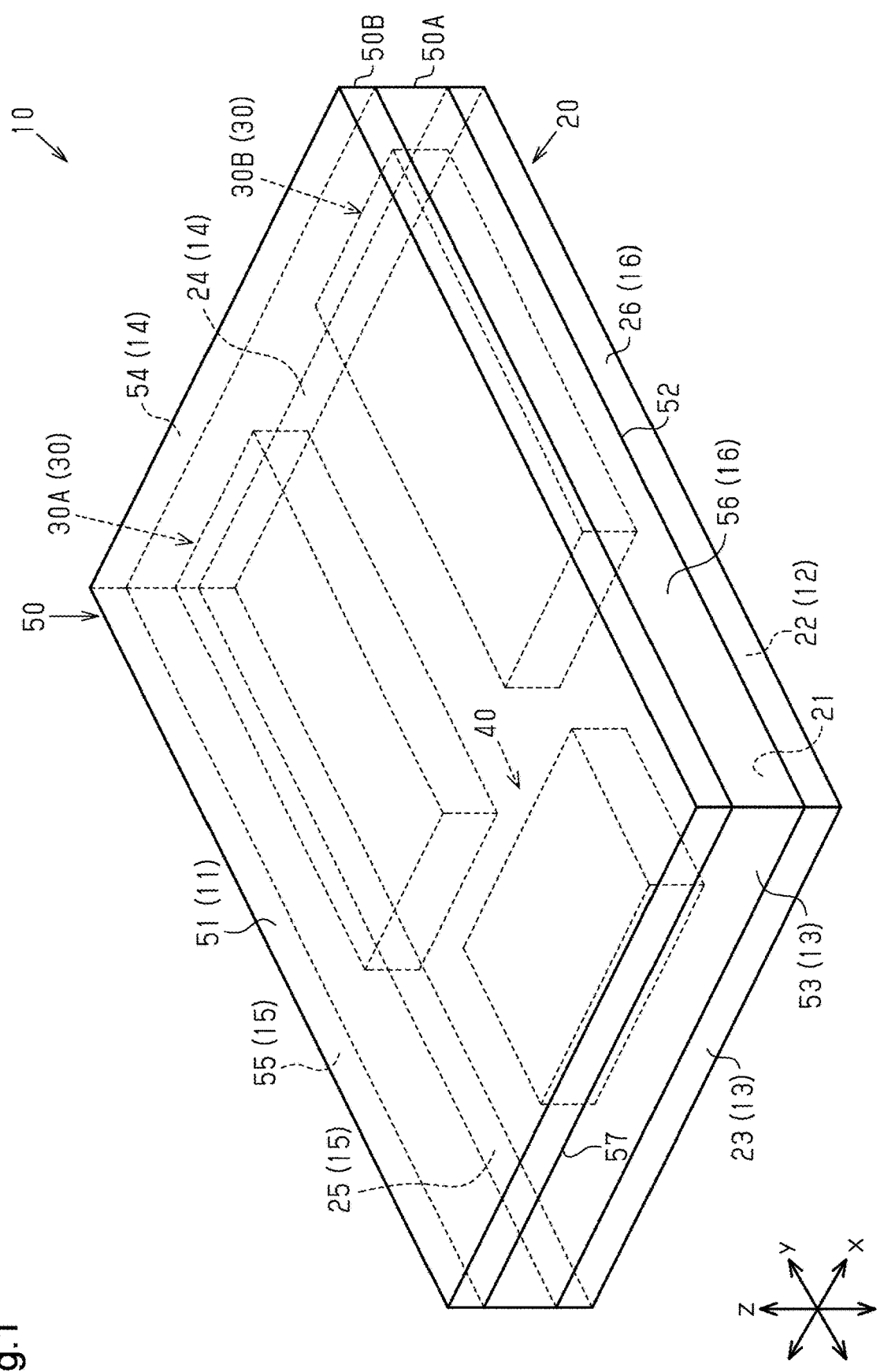
FIG. 1 is a perspective view showing a perspective structure of a semiconductor device in an embodiment.

As shown in FIG. 1, the semiconductor device 10 is rectangular and flat. The semiconductor device 10 includes a device main surface 11 and a device back surface 12, which face in opposite directions, and device side surfaces 13 to 16, which extend in directions intersecting the device main surface 11 and the device back surface 12. In the present embodiment, the device side surfaces 13 to 16 extend in directions orthogonal to the device main surface 11 and the device back surface 12.

The device main surface 11 and the device back surface 12 are spaced apart from each other. In the description hereafter, the arrangement direction of the device main surface 11 and the device back surface 12 is referred to as a z-direction. The z-direction may also be referred to as a height-wise direction of the semiconductor device 10. Two directions that are orthogonal to each other and orthogonal to the z-direction are referred to as an x-direction and a y-direction. The x-direction is an example of a first direction. The y-direction is an example of a second direction.

In the present embodiment, as viewed in the z-direction, the device side surfaces 13 and 14 extend in the x-direction, and the device side surfaces 15 and 16 extend in the y-direction. The device side surfaces 13 and 14 face in opposite directions in the y-direction. The device side surfaces 15 and 16 face in opposite directions in the x-direction. In the present embodiment, as viewed in the z-direction, the semiconductor device 10 is rectangular such that the short sides extend in the x-direction and the long sides extend in the y-direction.

The semiconductor device 10 includes a support layer 20 and a resin layer 50 formed on the support layer 20.

The support layer 20 is formed from an electrically-insulative material and is formed from, for example, an epoxy resin. The support layer 20 is rectangular and flat and has a thickness-wise direction conforming to the z-direction. The thickness-wise direction of the support layer 20 may be referred to as the height-wise direction of the semiconductor device 10. The support layer 20 is located closer to the device back surface 12 than the device main surface 11 of the semiconductor device 10 in the z-direction. The support layer 20 includes the device back surface 12 and a portion of each of the device side surfaces 13 to 16 in the z-direction.

The support layer 20 includes a support main surface 21 and a support back surface 22, which face in opposite directions in the z-direction, and support side surfaces 23 to 26, which extend in directions orthogonal to the support main surface 21 and the support back surface 22. The support main surface 21 and the device main surface 11 face in the same direction. The support back surface 22 and the device back surface 12 face in the same direction. In the present embodiment, the support back surface 22 includes the device back surface 12. The support side surface 23 and the device side surface 13 face in the same direction. The support side surface 24 and the device side surface 14 face in the same direction. The support side surface 25 and the device side surface 15 face in the same direction. The support side surface 26 and the device side surface 16 face in the same direction. The support layer 20 as viewed in the z-direction is rectangular so that the short sides extend in the x-direction and the long sides extend in the y-direction.

As shown in FIG. 1, the resin layer 50 is rectangular and flat and has a thickness-wise direction conforming to the z-direction. The thickness-wise direction of the resin layer 50 may be referred to as the height-wise direction of the semiconductor device 10. The resin layer 50 is formed on the support main surface 21 of the support layer 20. The resin layer 50 includes the device main surface 11 and a portion of each of the device side surfaces 13 to 16 in the z-direction. The thickness of the resin layer 50 is greater than the thickness of the support layer 20. The resin layer 50 is formed of an electrically insulative material. In an example, the resin layer 50 and the support layer 20 are formed from the same material. In the present embodiment, the resin layer 50 is formed from a black epoxy resin.

Figure 4:
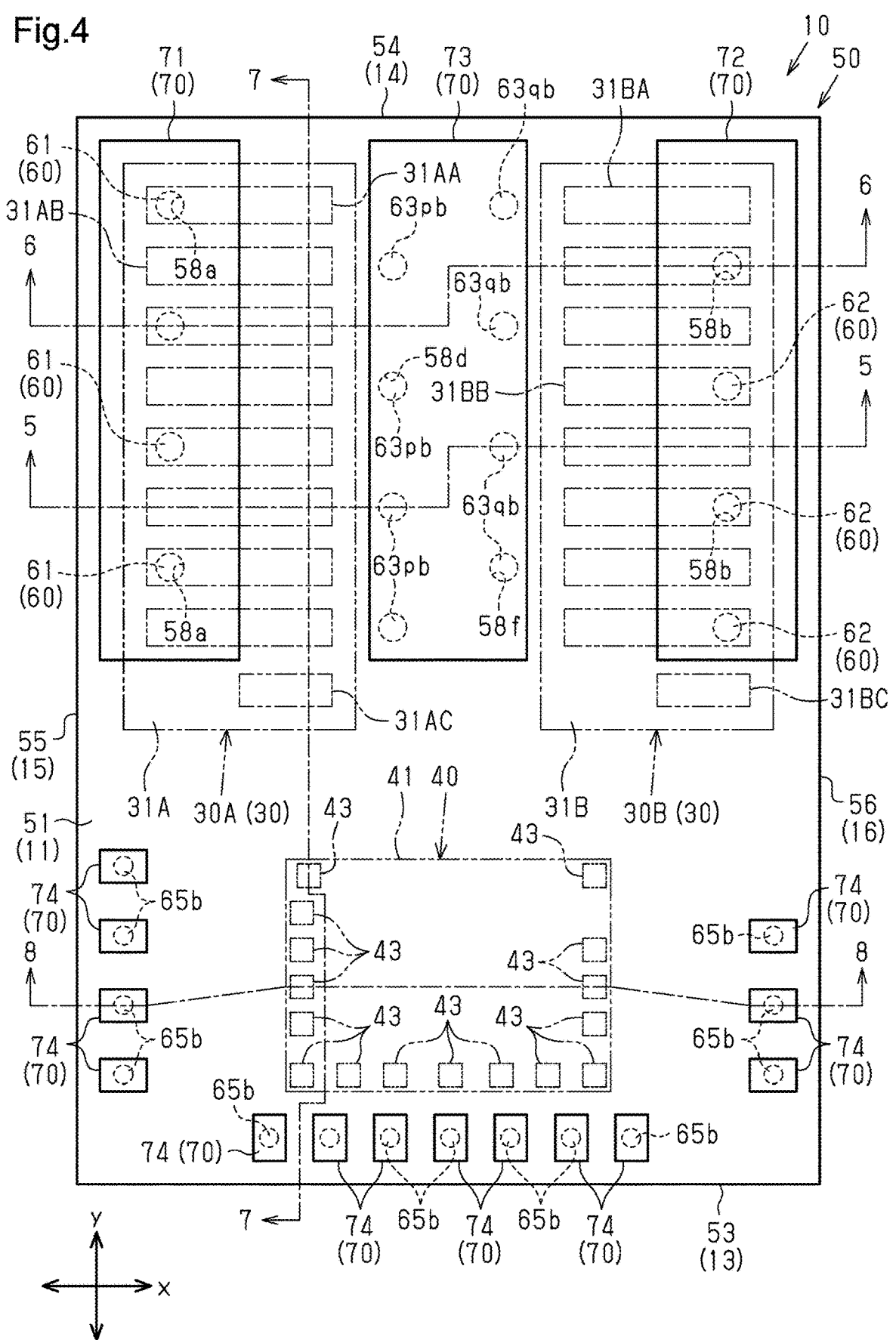
FIG. 4 is a plan view of the semiconductor device shown in FIG. 1.

As shown in FIGS. 1 and 4, the resin layer 50 includes a resin main surface 51 and a resin back surface 52 (refer to FIG. 5), which face in opposite directions in the z-direction, and resin side surfaces 53 to 56, which extend in directions orthogonal to the resin main surface 51 and the resin back surface 52. The resin main surface 51 and the device main surface 11 face in the same direction. The resin back surface 52 and the device back surface 12 face in the same direction. In the present embodiment, the resin main surface 51 defines the device main surface 11. The resin back surface 52 is in contact with the support main surface 21 of the support layer 20. The resin side surface 53 and the device side surface 13 face in the same direction. The resin side surface 54 and the device side surface 14 face in the same direction. The resin side surface 55 and the device side surface 15 face in the same direction. The resin side surface 56 and the device side surface 16 face in the same direction. The resin layer 50 as viewed in the z-direction is rectangular so that the long sides extend in the y-direction and the short sides extend in the x-direction. As shown in FIG. 1, in the present embodiment, the resin side surface 53 and the support side surface 23 are flush with each other. The resin side surface 54 and the support side surface 24 are flush with each other. The resin side surface 55 and the support side surface 25 are flush with each other. The resin side surface 56 and the support side surface 26 are flush with each other. The resin side surface 53 and the support side surface 23 define the device side surface 13. The resin side surface 54 and the support side surface 24 define the device side surface 14. The resin side surface 55 and the support side surface 25 define the device side surface 15. The resin side surface 56 and the support side surface 26 define the device side surface 16.

Figure 5:
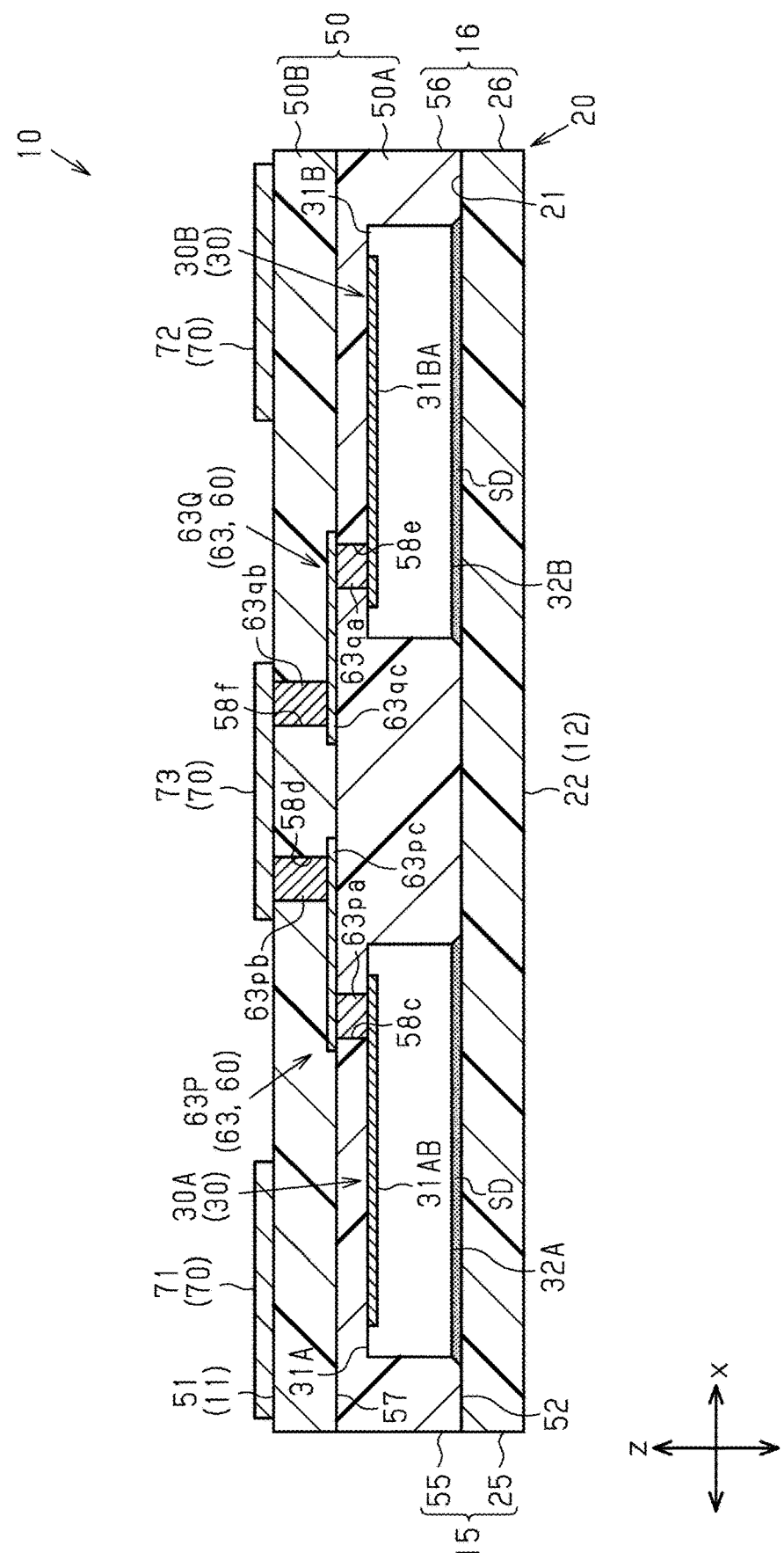
FIG. 5 is a cross-sectional view of the semiconductor device taken along line 5-5 in FIG. 4.

As shown in FIGS. 1 and 5, the resin layer 50 includes an element encapsulation layer 50A formed on the support main surface 21 and a surface-side resin layer 50B formed on the element encapsulation layer 50A. That is, the element encapsulation layer 50A and the surface-side resin layer 50B are stacked in the thickness-wise direction of the resin layer 50 (z-direction). The element encapsulation layer 50A includes the resin back surface 52 and a portion of the resin side surfaces 53 to 56 in the z-direction. The surface-side resin layer 50B includes the resin main surface 51 and the remaining portion of the resin side surfaces 53 to 56 in the z-direction.

As shown in FIG. 5, the thickness of the surface-side resin layer 50B is smaller than the thickness of the element encapsulation layer 50A. Preferably, the thickness of the surface-side resin layer 50B is one-half of the thickness of the element encapsulation layer 50A or less. The surface-side resin layer 50B may have any thickness that is sufficient to encapsulate via connection wires 63pc and 63qc and other wires formed on the element encapsulation layer 50A, which will be described later. It is preferred to minimize the thickness of the surface-side resin layer 50B within the range in which the wires are encapsulated. An interface 57 is formed at the boundary between the element encapsulation layer 50A and the surface-side resin layer 50B. In the present embodiment, the interface 57 is formed in an xy-plane.

As shown in FIG. 4, external electrodes 70 are disposed on the resin main surface 51, which corresponds to a surface of the resin layer 50. The external electrodes 70 serve as external terminals that are used when the semiconductor device 10 is, for example, mounted on a circuit substrate and electrically connected to wires or the like on the circuit substrate. That is, the resin main surface 51 serves as a mount surface when the semiconductor device 10 is mounted on, for example, a circuit substrate. The external electrode 70 includes a copper (Cu) layer and a plated layer covering the Cu layer. The Cu layer includes a seed layer formed on the resin main surface 51 and a plated layer formed on the seed layer. The seed layer is formed of, for example, Cu or titanium (Ti). The plated layer is formed from Cu. The plated layer covering the Cu layer includes, for example, a lamination of a nickel (Ni) layer, a palladium (Pd) layer, and a gold (Au) layer. The external electrodes 70 include a power supply electrode 71, a ground electrode 72, an output electrode 73, and driver connection electrodes 74. The power supply electrode 71, the ground electrode 72, and the output electrode 73 are arranged on the resin main surface 51 at a position closer to the resin side surface 54 than the driver connection electrodes 74 in the y-direction. The power supply electrode 71, the ground electrode 72, and the output electrode 73 are aligned with each other in the y-direction and spaced apart from each other in the x-direction. The driver connection electrodes 74 are arranged at opposite ends of the resin main surface 51 in the x-direction and at one of opposite ends of the resin main surface 51 in the y-direction located closer to the resin side surface 53. The number of driver connection electrodes 74 may be changed in any manner.

The internal structure of the semiconductor device 10 will now be described.

Figure 2:
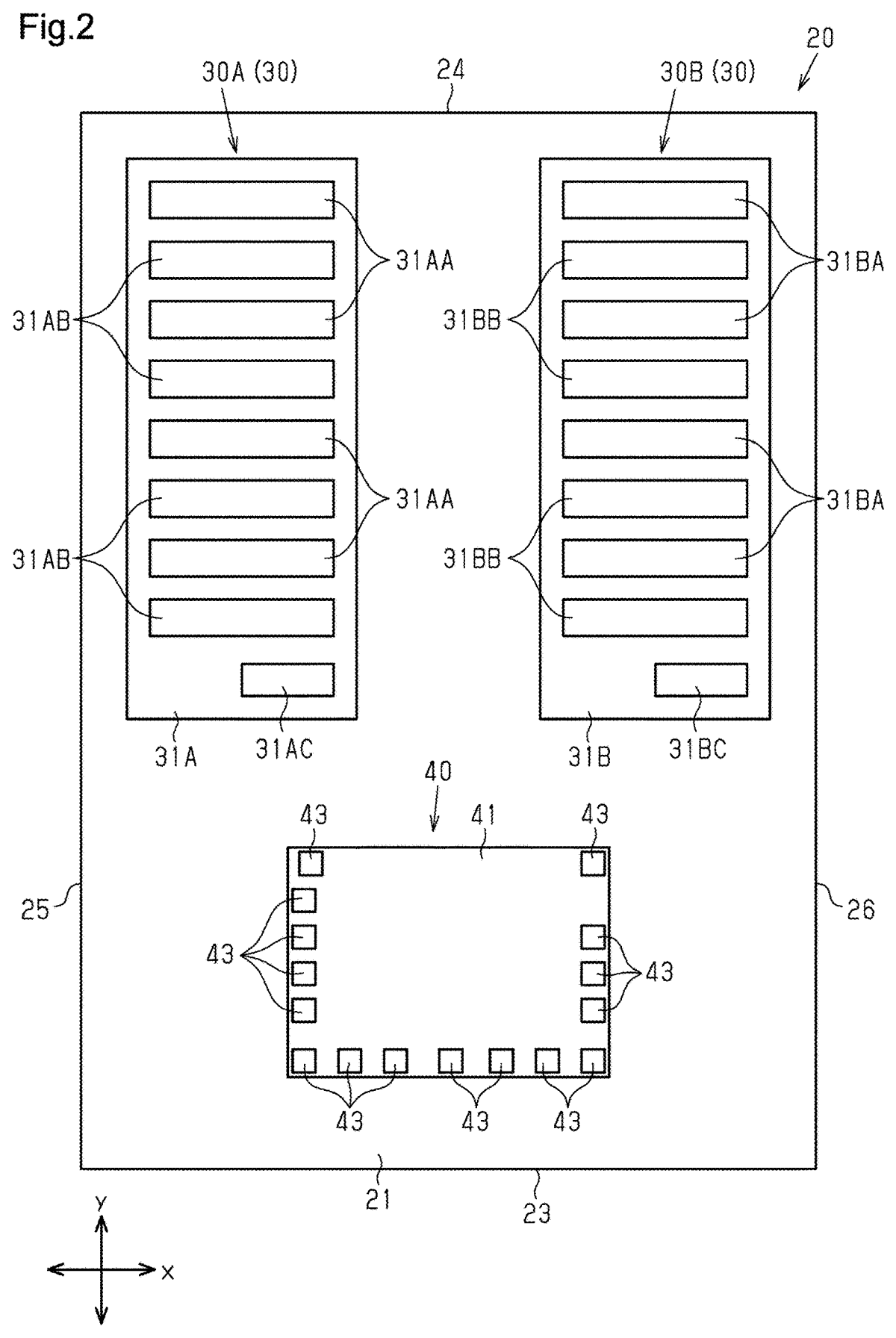
Figure 3:
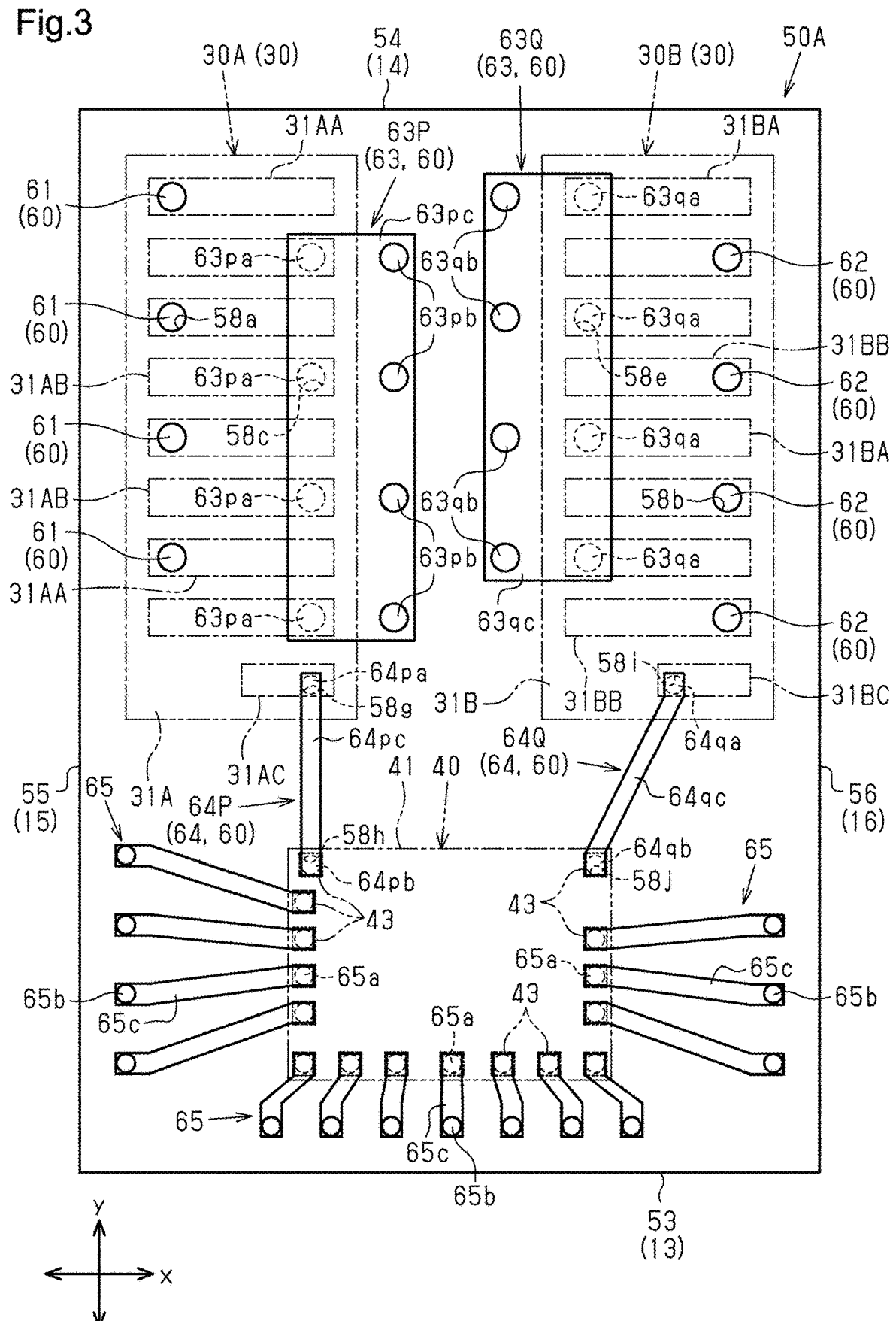
FIG. 3 is a plan view showing an element encapsulation layer of a resin layer in the semiconductor device of FIG. 1.

As shown in FIGS. 2 and 3, the semiconductor device 10 includes switching elements 30, a driver 40, and via conductors 60 respectively electrically connected to the switching elements 30 and the driver 40. In the present embodiment, the switching elements 30 include a first switching element 30A and a second switching element 30B. That is, the semiconductor device 10 includes a plurality of switching elements. The driver 40 includes a drive circuit that drives each of the switching elements. In the present embodiment, the driver 40 includes drive circuits that separately drive the first switching element 30A and the second switching element 30B.

Figure 7:
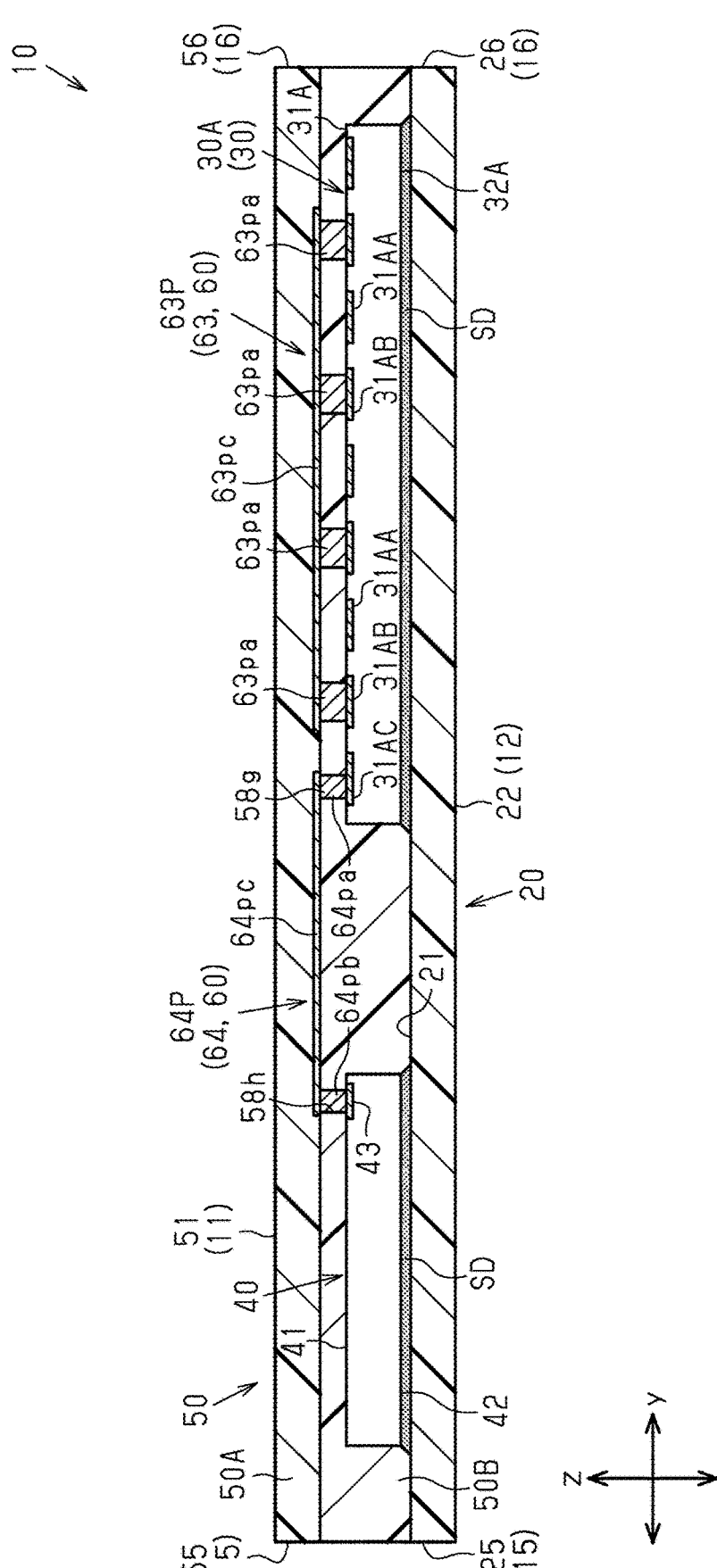
FIG. 7 is a cross-sectional view of the semiconductor device taken along line 7-7 in FIG. 4.

The switching elements 30A and 30B and the driver 40 are mounted on the support layer 20. More specifically, as shown in FIGS. 5 and 7, the switching elements 30A and 30B and the driver 40 are bonded to the support main surface 21 of the support layer 20 by a bonding material SD. An example of the bonding material SD is an epoxy resin adhesive or a silicone resin adhesive. In another example, the bonding material SD may be a material demonstrating good thermal conductivity. When metal films are formed on the surfaces of the switching elements 30A and 30B and the driver 40 and the surface of the support layer 20 that are opposed to each other, an electrically-conductive adhesive such as a silver (Ag) paste or solder may be used as the bonding material SD. The bonding material SD may be omitted.

As shown in FIGS. 2 and 3, the switching elements 30A and 30B are each, for example, a transistor. Each of the switching elements 30A and 30B is a transistor that operates at a high frequency of 1 MHz or higher. In an example, each of the switching elements 30A and 30B is formed of gallium nitride (GaN). In the present embodiment, the switching elements 30A and 30B each include a gallium nitride high electron mobility transistor (GaN HEMT). The GaN HEMTs used in the switching elements 30A and 30B are the same in size. In the present embodiment, the GaN HEMTs used in the switching elements 30A and 30B are the same in structure. Each of the switching elements 30A and 30B is flat and rectangular and has a thickness-wise direction conforming to the z-direction. The thickness-wise direction of each of the switching elements 30A and 30B may be referred to as the height-wise direction of the semiconductor device 10. As viewed in the z-direction, the switching elements 30A and 30B are each rectangular, having a long-side direction and a short-side direction. In the present embodiment, the switching elements 30A and 30B are disposed on the support main surface 21 so that the long-side direction conforms to the y-direction and the short-side direction conforms to the x-direction.

The switching elements 30A and 30B are spaced apart from each other in a direction orthogonal to the height-wise direction of the semiconductor device 10 (z-direction). As shown in FIG. 2, the switching elements 30A and 30B are aligned with each other in the y-direction and spaced apart from each other in the x-direction. The first switching element 30A is disposed on the support main surface 21 at a position closer to the support side surface 25 than the second switching element 30B. Thus, the x-direction may also be referred to as an arrangement direction of the first switching element 30A and the second switching element 30B.

As shown in FIG. 5, the first switching element 30A includes a first element main surface 31A and a first element back surface 32A that face in opposite directions in the z-direction. The first element main surface 31A and the device main surface 11 (support main surface 21) face in the same direction. The first element back surface 32A and the device back surface 12 (support back surface 22) face in the same direction.

As shown in FIG. 2, first drive pad electrodes 31AA, second drive pad electrodes 31AB, and a control pad electrode 31AC are formed on the first element main surface 31A. In the present embodiment, the first drive pad electrode 31AA includes a drain electrode of the first switching element 30A, the second drive pad electrode 31AB includes a source electrode of the first switching element 30A, and the control pad electrode 31AC includes a gate electrode of the first switching element 30A. As described above, the drive pad electrodes 31AA and 31AB and the control pad electrode 31AC are formed on the surface of the first switching element 30A at a position closer to the external electrodes 70 in the z-direction. This shortens the distances from the drive pad electrodes 31AA and 31AB to the power supply electrode 71 and the output electrode 73.

The drive pad electrodes 31AA and 31AB are the same in size and, as viewed in the z-direction, are rectangular, having a long-side direction and a short-side direction. The drive pad electrodes 31AA and 31AB are formed on the first element main surface 31A so that the long-side direction conforms to the x-direction and the short-side direction conforms to the y-direction. That is, the drive pad electrodes 31AA and 31AB extend in the x-direction, which is the arrangement direction of the first switching element 30A and the second switching element 30B. As shown in FIG. 2, the first drive pad electrodes 31AA and the second drive pad electrodes 31AB are formed on the first element main surface 31A. The first drive pad electrodes 31AA and the second drive pad electrodes 31AB are alternately arranged in the y-direction. The control pad electrode 31AC is disposed on one of the two ends of the first element main surface 31A in the y-direction located closer to the support side surface 23 (driver 40). Thus, the control pad electrode 31AC is disposed on the first element main surface 31A at a position closer to the support side surface 23 (driver 40) than the drive pad electrodes 31AA and 31AB.

As shown in FIG. 5, the second switching element 30B includes a second element main surface 31B and a second element back surface 32B that face in opposite directions in the z-direction. The second element main surface 31B and the device main surface 11 (support main surface 21) face in the same direction. The second element back surface 32B and the device back surface 12 (support back surface 22) face in the same direction.

As shown in FIG. 2, first drive pad electrodes 31BA, second drive pad electrodes 31BB, and a control pad electrode 31BC are formed on the second element main surface 31B. In the present embodiment, the first drive pad electrode 31BA includes a drain electrode of the second switching element 30B, the second drive pad electrode 31BB includes a source electrode of the second switching element 30B, and the control pad electrode 31BC includes a gate electrode of the second switching element 30B. As described above, the drive pad electrodes 31BA and 31BB and the control pad electrode 31BC are formed on the surface of the second switching element 30B at a position closer to the external electrodes 70 in the z-direction. This shortens the distances from the drive pad electrodes 31BA and 31BB to the ground electrode 72 and the output electrode 73.

The drive pad electrodes 31BA and 31BB are the same in size and, as viewed in the z-direction, are rectangular, having a long-side direction and a short-side direction. The drive pad electrodes 31BA and 31BB are formed on the second element main surface 31B so that the long-side direction conforms to the x-direction and the short-side direction conforms to the y-direction. That is, the drive pad electrodes 31BA and 31BB extend in the x-direction, which is the arrangement direction of the first switching element 30A and the second switching element 30B. As shown in FIG. 2, the first drive pad electrodes 31BA and the second drive pad electrodes 31BB are formed on the second element main surface 31B. The first drive pad electrodes 31BA and the second drive pad electrodes 31BB are alternately arranged in the y-direction. As viewed in the z-direction, the first drive pad electrodes 31BA are aligned with the first drive pad electrodes 31AA of the first switching element 30A in the y-direction, and the second drive pad electrodes 31BB are aligned with the second drive pad electrodes 31AB of the first switching element 30A in the y-direction. In other words, as viewed in the z-direction, the first drive pad electrodes 31BA are shifted from the second drive pad electrodes 31AB in the y-direction, and the second drive pad electrodes 31BB are shifted from the first drive pad electrodes 31AA in the y-direction. The control pad electrode 31BC is disposed on one of the two ends of the second element main surface 31B in the y-direction located closer to the support side surface 23 (driver 40). Thus, the control pad electrode 31BC is disposed on the second element main surface 31B at a position closer to the support side surface 23 (driver 40) than the drive pad electrodes 31BA and 31BB.

As described above, each of the switching elements 30A and 30B is a lateral transistor in which a first drive electrode (drain electrode), a second drive electrode (source electrode), and a control electrode (gate electrode) are formed on the same surface facing in the z-direction.

The switching elements 30A and 30B are not limited to a gallium nitride high electron mobility transistor and may include a metal-oxide-semiconductor field-effect transistor (MOSFET) that includes silicon (Si) or a MOSFET that includes silicon carbide (SiC).

As shown in FIGS. 2 and 4, the driver 40 is spaced apart from the switching elements 30A and 30B in the y-direction. As viewed in the z-direction, the driver 40 is disposed on the support main surface 21 at a position closer to the support side surface 23 than the switching elements 30A and 30B in the y-direction. In the present embodiment, the driver 40 is disposed in the center of the support main surface 21 in the x-direction. As shown in FIG. 7, the driver 40 is aligned with the switching elements 30A and 30B in the z-direction. That is, the switching elements 30A and 30B and the driver 40 are coplanar with each other.

As shown in FIGS. 1 and 2, the driver 40 is rectangular and flat and has a thickness-wise direction conforming to the z-direction. The thickness-wise direction of the driver 40 may be referred to as the height-wise direction of the semiconductor device 10. In the present embodiment, as viewed in the z-direction, the driver 40 is rectangular such that the long sides extend in the x-direction and the short sides extend in the y-direction. The shape of the driver 40 as viewed in the z-direction may be changed in any manner. In an example, as viewed in the z-direction, the driver 40 is square.

As shown in FIG. 7, the driver 40 includes a driver main surface 41 and a driver back surface 42 that face in opposite directions in the z-direction. The driver main surface 41 and the device main surface 11 face in the same direction. The driver back surface 42 and the device back surface 12 face in the same direction. The driver 40 further includes driver pad electrodes 43. The driver pad electrodes 43 are exposed from the driver main surface 41. More specifically, the driver pad electrodes 43 are exposed from the driver main surface 41 of the driver 40, which faces in the same direction as the element main surfaces 31A and 31B on which the control pad electrodes 31AC and 31BC are formed. This reduces variations in the positions of the driver pad electrodes 43 and the positions of the control pad electrodes 31AC and 31BC in the z-direction. The driver pad electrodes 43 are exposed from a surface of the driver 40 located closer to the external electrodes 70 in the z-direction. This shortens the distances from the driver pad electrodes 43 to the driver connection electrodes 74 in the z-direction.

As shown in FIGS. 5 and 7, the switching elements 30A and 30B and the driver 40 are encapsulated by the resin layer

50. More specifically, the switching elements 30A and 30B and the driver 40 are encapsulated by the element encapsulation layer 50A. The interface 57 between the element encapsulation layer 50A and the surface-side resin layer 50B is formed at a position closer to the resin main surface 51 (device main surface 11) than the element main surfaces 31A and 31B of the switching elements 30A and 30B and the driver main surface 41 of the driver 40. That is, the element encapsulation layer 50A covers the element main surfaces 31A and 31B of the switching elements 30A and 30B and the driver main surface 41 of the driver 40.

As shown in FIG. 4, the first switching element 30A is disposed to overlap the power supply electrode 71 as viewed in the z-direction. In other words, the power supply electrode 71 is disposed to overlap the first switching element 30A as viewed in the z-direction. More specifically, as viewed in the z-direction, the power supply electrode 71 is disposed to overlap the first drive pad electrodes 31AA of the first switching element 30A. The power supply electrode 71 is disposed to extend out of the first switching element 30A in the x-direction. As shown in FIG. 4, the power supply electrode 71 includes an extension extending out of the first switching element 30A toward the device side surface 15.

As viewed in the z-direction, the second switching element 30B is disposed to overlap the ground electrode 72. In other words, the ground electrode 72 is disposed to overlap the second switching element 30B as viewed in the z-direction. More specifically, as viewed in the z-direction, the ground electrode 72 is disposed to overlap the second drive pad electrodes 31BB of the second switching element 30B. The ground electrode 72 is disposed to extend out of the second switching element 30B in the x-direction. As shown in FIG. 4, the ground electrode 72 includes an extension extending out of the second switching element 30B toward the device side surface 16.

As viewed in the z-direction, the first switching element 30A and the second switching element 30B are disposed so as not to overlap the output electrode 73. In other words, the output electrode 73 is disposed so as not to overlap the first switching element 30A and the second switching element 30B. In the present embodiment, as viewed in the z-direction, the output electrode 73 is disposed between the first switching element 30A and the second switching element 30B in the x-direction.

As viewed in the z-direction, the driver 40 is disposed so as not to overlap the driver connection electrodes 74. In other words, as viewed in the z-direction, the driver connection electrodes 74 are disposed so as not to overlap the driver 40. More specifically, the driver connection electrodes 74 are arranged to surround the driver 40 as viewed in the z-direction.

As shown in FIGS. 3 and 5 to 8, the via conductors 60 are disposed in the resin layer 50 to electrically connect the external electrodes 70 to the switching elements 30A and 30B, electrically connect the switching elements 30A and 30B to the driver 40, or electrically connect the driver 40 to the external electrodes 70. The via conductors 60 include a power supply via conductor 61, a ground via conductor 62, an output via conductor 63, an element control via conductor 64, and driver via conductors 65. In an example, the via conductors 60 are formed from Cu.

Figure 6:
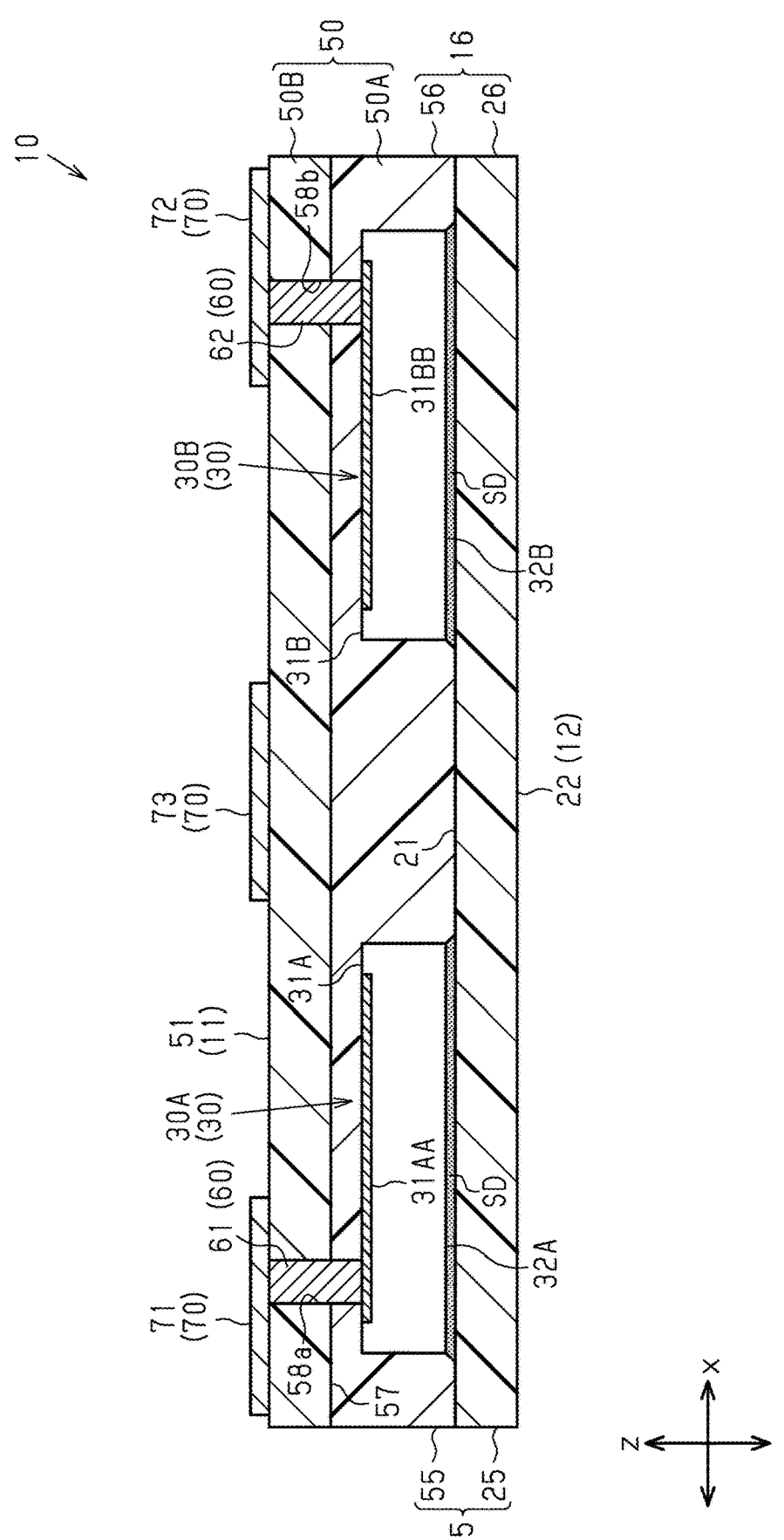
FIG. 6 is a cross-sectional view of the semiconductor device taken along line 6-6 in FIG. 4.

As shown in FIGS. 3 and 6, the power supply via conductor 61 electrically connects the first drive pad electrode 31AA of the first switching element 30A to the power supply electrode 71 of the external electrodes 70. In the present embodiment, a plurality of power supply via conductors 61 is provided. The power supply via conductors 61 are aligned with each other in the x-direction and spaced apart from each other in the y-direction.

As shown in FIG. 3, the power supply via conductors 61 are disposed to overlap the first drive pad electrodes 31AA of the first switching element 30A as viewed in the z-direction. In the present embodiment, the power supply via conductor 61 is disposed to overlap one of the two ends of the first drive pad electrode 31AA in the x-direction located closer to the support side surface 25. In other words, the power supply via conductor 61 is disposed on one of the two ends of the first drive pad electrode 31AA in the x-direction located farther from the output electrode 73.

As shown in FIG. 4, the power supply via conductors 61 are disposed to overlap the power supply electrode 71 as viewed in the z-direction. Thus, as shown in FIG. 6, the power supply via conductors 61 are disposed to overlap both the first drive pad electrodes 31AA and the power supply electrode 71 as viewed in the z-direction. The power supply via conductors 61 are each formed of a via extending in the z-direction. In the present embodiment, each power supply via conductor 61 is circular as viewed in the z-direction. The power supply via conductor 61 has a diameter of, for example, greater than or equal to 100 μm and less than or equal to 200 μm. The shape of the power supply via conductor 61 as viewed in the z-direction is not limited to a circle and may be changed in any manner. For example, the shape of the power supply via conductor 61 as viewed in the z-direction may be a polygon such as a quadrangle, or an ellipse.

As shown in FIG. 6, the power supply via conductor 61 extends through the resin layer 50 in the z-direction. In other words, the power supply via conductor 61 extends through the element encapsulation layer 50A and the surface-side resin layer 50B in the z-direction. More specifically, the resin layer 50 has a through hole 58a extending through the entirety of the surface-side resin layer 50B in the z-direction and a portion of the element encapsulation layer 50A between the first element main surface 31A of the first switching element 30A and the interface 57 in the z-direction. The first drive pad electrode 31AA is exposed through the through hole 58a in the z-direction. In the z-direction, the through hole 58a exposes one of the two ends of the first drive pad electrode 31AA in the x-direction located closer to the resin side surface 55. The power supply via conductor 61 is disposed to fill the through hole 58a. Thus, the power supply via conductor 61 is in contact with the first drive pad electrode 31AA and is exposed from the resin main surface 51 of the resin layer 50. In other words, the power supply via conductor 61 is connected to one of the two ends of the first drive pad electrode 31AA in the x-direction located farther from the output electrode 73 (end located closer to the resin side surface 55). As viewed in the z-direction, the power supply via conductor 61 is exposed in the resin main surface 51 of the resin layer 50 from a position overlapping one of the two ends of the first drive pad electrode 31AA in the x-direction located farther from the output electrode 73 (end located closer to the resin side surface 55). The portion of the power supply via conductor 61 exposed from the resin main surface 51 is covered with the power supply electrode 71. That is, the power supply via conductor 61 is in contact with the power supply electrode 71. This connects the power supply via conductor 61 to the first drive pad electrode 31AA and the power supply electrode 71.

In the present embodiment, the dimension of the power supply via conductor 61 in the z-direction is slightly greater than the dimension of the first switching element 30A in the z-direction (the thicknesses of the first switching element 30A) and is less than the thicknesses of the element encapsulation layer 50A.

As shown in FIGS. 3 and 6, the ground via conductor 62 electrically connects the second drive pad electrode 31BB of the second switching element 30B to the ground electrode 72 of the external electrodes 70. In the present embodiment, a plurality of ground via conductors 62 is provided. The ground via conductors 62 are aligned with each other in the x-direction and spaced apart from each other in the y-direction. As viewed in the z-direction, the ground via conductors 62 are shifted from the power supply via conductors 61 in the y-direction.

As shown in FIG. 3, the ground via conductors 62 are disposed to overlap the second drive pad electrodes 31BB of the second switching element 30B as viewed in the z-direction. In the present embodiment, the ground via conductor 62 is disposed to overlap one of the two ends of the second drive pad electrode 31BB in the x-direction located closer to the support side surface 26. In other words, the ground via conductor 62 is disposed on one of the two ends of the second drive pad electrode 31BB in the x-direction located farther from the output electrode 73.

As shown in FIG. 4, the ground via conductors 62 are disposed to overlap the ground electrode 72 as viewed in the z-direction. Thus, as shown in FIG. 6, the ground via conductors 62 are disposed to overlap both the second drive pad electrodes 31BB and the ground electrode 72 as viewed in the z-direction. The ground via conductors 62 are each formed of a via extending in the z-direction. In the present embodiment, each ground via conductor 62 is circular as viewed in the z-direction. The ground via conductor 62 has a diameter of, for example, greater than or equal to 100 μm and less than or equal to 200 μm. The shape of the ground via conductor 62 as viewed in the z-direction is not limited to a circle and may be changed in any manner. For example, the shape of the ground via conductor 62 as viewed in the z-direction may be a polygon such as a quadrangle, or an ellipse.

As shown in FIG. 6, the ground via conductor 62 extends through the resin layer 50 in the z-direction. In other words, the ground via conductor 62 extends through the element encapsulation layer 50A and the surface-side resin layer 50B in the z-direction. More specifically, the resin layer 50 has a through hole 58b extending through the entirety of the surface-side resin layer 50B in the z-direction and a portion of the element encapsulation layer 50A between the second element main surface 31B of the second switching element 30B and the interface 57 in the z-direction. The second drive pad electrode 31BB is exposed through the through hole 58b in the z-direction. In the z-direction, the through hole 58b exposes one of the two ends of the second drive pad electrode 31BB in the x-direction located closer to the support side surface 26. The ground via conductor 62 is disposed to fill the through hole 58b. Thus, the ground via conductor 62 is in contact with the second drive pad electrode 31BB and is exposed from the resin main surface 51 of the resin layer 50. In other words, the ground via conductor 62 is connected to one of the two ends of the second drive pad electrode 31BB in the x-direction located farther from the output electrode 73 (end located closer to the support side surface 26). As viewed in the z-direction, the ground via conductor 62 is exposed in the resin main surface 51 of the resin layer 50 from a position overlapping one of the two ends of the second drive pad electrode 31BB in the x-direction located farther from the output electrode 73 (end located closer to the support side surface 26). The portion of the ground via conductor 62 exposed from the resin main surface 51 is covered with the ground electrode 72. That is, the ground via conductor 62 is in contact with the ground electrode 72. This connects the ground via conductor 62 to the second drive pad electrode 31BB and the ground electrode 72.

In the present embodiment, the dimension of the ground via conductor 62 in the z-direction is slightly greater than the dimension of the second switching element 30B in the z-direction (the thicknesses of the second switching element 30B) and is less than the thicknesses of the element encapsulation layer 50A. The dimension of the ground via conductor 62 in the z-direction is equal to the dimension of the power supply via conductor 61 in the z-direction. When the difference in the dimension in the z-direction between the ground via conductor 62 and the power supply via conductor 61 is, for example, less than or equal to 10% of the dimension of the ground via conductor 62 in the z-direction, it is considered that the dimension of the ground via conductor 62 in the z-direction is equal to the dimension of the power supply via conductor 61 in the z-direction.

As shown in FIGS. 3 and 5, the output via conductors 63 electrically connect the second drive pad electrodes 31AB of the first switching element 30A, the first drive pad electrodes 31BA of the second switching element 30B, and the output electrode 73 of the external electrodes 70.

The output via conductors 63 include a first output via conductor 63P, which connects the second drive pad electrodes 31AB to the output electrode 73, and a second output via conductor 63Q, which connects the first drive pad electrodes 31BA to the output electrode 73. The first output via conductor 63P and the second output via conductor 63Q are electrically connected by the output electrode 73. In other words, the first output via conductor 63P and the second output via conductor 63Q are not directly electrically connected to each other. As viewed in the z-direction, the second drive pad electrodes 31AB are shifted from the first drive pad electrodes 31BA in the y-direction. Accordingly, the first output via conductor 63P is shifted from the second output via conductor 63Q in the y-direction. One of the two ends of the first output via conductor 63P in the y-direction located closer to the resin side surface 53 is disposed closer to the resin side surface 53 than the second output via conductor 63Q. In other words, one of the two ends of the second output via conductor 63Q in the y-direction located closer to the resin side surface 54 is disposed closer to the resin side surface 54 than the first output via conductor 63P.

As shown in FIG. 5, the first output via conductor 63P is disposed closer to the resin side surface 55 than the second output via conductor 63Q in the x-direction. The resin layer 50 fills the space between the first output via conductor 63P and the second output via conductor 63Q in the x-direction.

The first output via conductor 63P extends through the resin layer 50 in the z-direction. More specifically, the first output via conductor 63P extends in the z-direction through the surface-side resin layer 50B and a portion of the element encapsulation layer 50A that covers the first element main surface 31A of the first switching element 30A. As shown in FIG. 5, the first output via conductor 63P is crank-shaped. The first output via conductor 63P includes a first element connection via 63*pa* connected to the second drive pad electrode 31AB, a first electrode connection via 63*pb* connected to the output electrode 73, and a first via connection wire 63*pc* connecting the first element connection via 63*pa* and the first electrode connection via 63*pb*.

As shown in FIG. 3, in the present embodiment, a plurality of first element connection vias 63*pa* is provided.

The first element connection vias 63*pa* are aligned with each other in the x-direction and spaced apart from each other in the y-direction. As viewed in the z-direction, the first element connection vias 63*pa* are disposed to overlap the second drive pad electrodes 31AB. More specifically, as viewed in the z-direction, the first element connection via 63*pa* is disposed to overlap one of the two ends of the second drive pad electrode 31AB in the x-direction located closer to the support side surface 26. In other words, the first element connection via 63*pa* is disposed to overlap one of the two ends of the second drive pad electrode 31AB in the x-direction located closer to the output electrode 73. More specifically, the first element connection vias 63*pa* are disposed closer to the support side surface 26 (closer to the output electrode 73) than the power supply via conductors 61 in the x-direction. As viewed in the z-direction, the first element connection vias 63*pa* are shifted from the power supply via conductors 61 in the y-direction. As viewed in the z-direction, the first element connection vias 63*pa* are aligned with the ground via conductors 62 in the y-direction.

As shown in FIG. 5, the first element connection via 63*pa* extends in the z-direction through a portion of the element encapsulation layer 50A that covers the first element main surface 31A. More specifically, the element encapsulation layer 50A has a through hole 58*c* extending in the z-direction through a portion of the element encapsulation layer 50A that covers the first element main surface 31A. The second drive pad electrode 31AB is exposed through the through hole 58*c* in the z-direction. The through hole 58*c* exposes one of the two ends of the second drive pad electrode 31AB in the x-direction located closer to the support side surface 26 (end located closer to the output electrode 73) in the z-direction. The first element connection via 63*pa* is disposed to fill the through hole 58*c*. Thus, the first element connection via 63*pa* extends in the z-direction and is in contact with the second drive pad electrode 31AB. In other words, the first element connection via 63*pa* is connected to one of the two ends of the second drive pad electrode 31AB in the x-direction located closer to the output electrode 73 (end located closer to the resin side surface 56). As viewed in the z-direction, the first element connection via 63*pa* is exposed in the element encapsulation layer 50A from a position overlapping one of the two ends of the second drive pad electrode 31AB in the x-direction located closer to the output electrode 73 (end located closer to the resin side surface 56).

As shown in FIG. 3, as viewed in the z-direction, each first element connection via 63*pa* is circular. The diameter of the first element connection via 63*pa* is equal to the diameter of the power supply via conductor 61 and is, for example, greater than or equal to 100 μm and less than or equal to 200 μm. The shape of the first element connection via 63*pa* as viewed in the z-direction is not limited to a circle and may be changed in any manner. For example, the shape of the first element connection via 63*pa* as viewed in the z-direction may be a polygon such as a quadrangle, or an ellipse. In the present embodiment, the dimension of the first element connection via 63*pa* in the z-direction is smaller than the dimension of the first switching element 30A in the z-direction. The dimension of the first element connection via 63*pa* in the z-direction is less than 1 mm. The dimension of the first element connection via 63*pa* in the z-direction is approximately a few hundred μm.

As shown in FIG. 5, the first via connection wire 63*pc* is disposed on the element encapsulation layer 50A. In other words, the first via connection wire 63*pc* is disposed in the interface 57 between the element encapsulation layer 50A and the surface-side resin layer 50B. As shown in FIG. 3, the shape of the first via connection wire 63pc as viewed in the z-direction is rectangular so that the short sides extend in the x-direction and the long sides extend in the y-direction. As viewed in the z-direction, the first via connection wire 63pc extends over the second drive pad electrodes 31AB in the y-direction. As viewed in the z-direction, the first via connection wire 63pc covers the first element connection vias 63pa. In other words, each of the first element connection vias 63pa is disposed to overlap the first via connection wire 63pc as viewed in the z-direction. More specifically, the first element connection vias 63pa are disposed to overlap both the second drive pad electrodes 31AB and the first via connection wire 63pc as viewed in the z-direction.

In the present embodiment, the first element connection vias 63pa are disposed to overlap one of the two ends of the first via connection wire 63pc in the x-direction located closer to the resin side surface 55 (end located farther from the output electrode 73). As viewed in the z-direction, the end of the first via connection wire 63pc located closer to the resin side surface 55 in the x-direction is a portion extending out of the output electrode 73 in the x-direction. Thus, as shown in FIG. 5, as viewed in the z-direction, the first element connection vias 63pa are disposed so as not to overlap the output electrode 73. More specifically, the first element connection vias 63pa are disposed closer to the resin side surface 55 than the output electrode 73 in the x-direction.

As shown in FIG. 3, as viewed in the z-direction, the first via connection wire 63pc is shifted from the first switching element 30A in the x-direction. More specifically, as viewed in the z-direction, the first via connection wire 63pc includes an extension extending out of the first switching element 30A toward the resin side surface 56 in the x-direction. As shown in FIG. 5, the extension of the first via connection wire 63pc extends to a position at which the first via connection wire 63pc overlaps the output electrode 73 as viewed in the z-direction. In the present embodiment, as viewed in the z-direction, the center of the first via connection wire 63pc in the y-direction is aligned with the center of the first switching element 30A in the y-direction.

As shown in FIG. 3, in the present embodiment, a plurality of first electrode connection vias 63pb is provided. The first electrode connection vias 63pb are aligned with each other in the x-direction and spaced apart from each other in the y-direction. In the present embodiment, the first electrode connection vias 63pb are aligned with the first element connection vias 63pa in the y-direction. Therefore, the first electrode connection vias 63pb and the first element connection vias 63pa are shifted from the power supply via conductors 61 in the y-direction. The arrangement position of the first electrode connection vias 63pb in the y-direction may be changed in any manner. In an example, the first electrode connection vias 63pb may be shifted from the first element connection vias 63pa in the y-direction. At least one of the first electrode connection vias 63pb may be aligned with the power supply via conductors 61 in the y-direction.

As shown in FIG. 4, as viewed in the z-direction, the first electrode connection vias 63pb are disposed to overlap the output electrode 73. More specifically, as viewed in the z-direction, the first electrode connection vias 63pb are disposed to overlap one of the two ends of the output electrode 73 in the x-direction located closer to the support side surface 25. As viewed in the z-direction, the first electrode connection vias 63pb are disposed to overlap the first via connection wire 63pc. In the present embodiment, the first electrode connection vias 63pb are disposed to overlap one of the two ends of the first via connection wire 63pc in the x-direction located closer to the resin side surface 56 (end located closer to the output electrode 73). Also, as shown in FIG. 5, the end of the first via connection wire 63pc located closer to the resin side surface 56 in the x-direction is a portion overlapping the output electrode 73 as viewed in the z-direction. In other words, as viewed in the z-direction, the first electrode connection vias 63pb are disposed to overlap the extension of the first via connection wire 63pc. As described above, as viewed in the z-direction, the first electrode connection vias 63pb are disposed to overlap the output electrode 73 without overlapping the first switching element 30A. As viewed in the z-direction, the first electrode connection vias 63pb are disposed between the first switching element 30A and the second switching element 30B in the x-direction.

As shown in FIG. 5, the first electrode connection via 63pb is shifted from the first element connection via 63pa in the z-direction. The first electrode connection via 63pb extends through the surface-side resin layer 50B in the z-direction. More specifically, the resin layer 50 has a through hole 58d extending through the surface-side resin layer 50B in the z-direction. The first via connection wire 63pc is exposed through the through hole 58d in the z-direction. The through hole 58d exposes one of the two ends of the first via connection wire 63pc in the x-direction located closer to the support side surface 26 (end located closer to the output electrode 73) in the z-direction. The first electrode connection via 63pb is disposed to fill the through hole 58d. Thus, the first electrode connection via 63pb extends in the z-direction and is in contact with the first via connection wire 63pc. The first electrode connection via 63pb is also exposed from the resin layer 50 in the z-direction. In other words, the first electrode connection via 63pb is connected to one of the two ends of the first via connection wire 63pc in the x-direction located closer to the output electrode 73 (end located closer to the resin side surface 56). Also, as viewed in the z-direction, the first electrode connection via 63pb is exposed in the resin main surface 51 of the resin layer 50 from a position overlapping one of the two ends of the first via connection wire 63pc in the x-direction located closer to the output electrode 73 (end located closer to the resin side surface 56). The portion of the first electrode connection via 63pb exposed from the resin layer 50 is covered with the output electrode 73. Thus, the first electrode connection via 63pb is in contact with the output electrode 73. In other words, the first electrode connection via 63pb is connected to both the first via connection wire 63pc and the output electrode 73.

As shown in FIG. 3, as viewed in the z-direction, each first electrode connection via 63pb is circular. The diameter of the first electrode connection via 63pb is equal to the diameter of the first element connection via 63pa and is, for example, greater than or equal to 100 μm and less than or equal to 200 μm. The shape of the first electrode connection via 63pb as viewed in the z-direction is not limited to a circle and may be changed in any manner. For example, the shape of the first electrode connection via 63pb as viewed in the z-direction may be a polygon such as a quadrangle, or an ellipse. In the present embodiment, the dimension of the first electrode connection via 63pb in the z-direction is greater than the dimension of the first element connection via 63pa in the z-direction. The dimension of the first electrode connection via 63pb in the z-direction may be changed in any manner. In an example, the dimension of the first electrode connection via 63pb in the z-direction may be equal to the dimension of the first element connection via 63$pa$ in the z-direction. In this case, the thickness of a portion of the element encapsulation layer 50A that covers the first element main surface 31A of the first switching element 30A is equal to the thickness of the surface-side resin layer 50B.

As shown in FIG. 5, the second output via conductor 63Q extends through the resin layer 50 in the z-direction. More specifically, the second output via conductor 63Q extends in the z-direction through the surface-side resin layer 50B and a portion of the element encapsulation layer 50A that covers the second element main surface 31B of the second switching element 30B. As shown in FIG. 5, the second output via conductor 63Q is crank-shaped. The second output via conductor 63Q and the first output via conductor 63P are symmetrical in shape. The second output via conductor 63Q includes a second element connection via 63$qa$ connected to the first drive pad electrode 31BA, a second electrode connection via 63$qb$ connected to the output electrode 73, and a second via connection wire 63$qc$ connecting the second element connection via 63$qa$ and the second electrode connection via 63$qb$.

As shown in FIG. 3, in the present embodiment, a plurality of second element connection vias 63$qa$ is provided. The second element connection vias 63$qa$ are aligned with each other in the x-direction and spaced apart from each other in the y-direction. As viewed in the z-direction, the second element connection vias 63$qa$ are disposed to overlap the first drive pad electrodes 31BA. More specifically, as viewed in the z-direction, the second element connection via 63$qa$ is disposed to overlap one of the two ends of the first drive pad electrode 31BA in the x-direction located closer to the resin side surface 55. More specifically, the second element connection vias 63$qa$ are disposed closer to the resin side surface 55 than the ground via conductors 62 in the x-direction. The second element connection vias 63$qa$ are shifted from the ground via conductors 62 in the y-direction. The second element connection vias 63$qa$ are shifted from the first element connection vias 63$pa$ and the first electrode connection vias 63$pb$ in the y-direction. In the present embodiment, the second element connection vias 63$qa$ are aligned with the power supply via conductors 61 in the y-direction.

As shown in FIG. 5, the second element connection via 63$qa$ extends in the z-direction through a portion of the element encapsulation layer 50A that covers the second element main surface 31B. More specifically, the element encapsulation layer 50A has a through hole 58$e$ extending in the z-direction through a portion of the element encapsulation layer 50A that covers the second element main surface 31B. The first drive pad electrode 31BA is exposed through the through holes 58$e$ in the z-direction. The second element connection via 63$qa$ is disposed to fill the through hole 58$e$. Thus, the second element connection via 63$qa$ extends in the z-direction and is in contact with the first drive pad electrode 31BA. In other words, the second element connection via 63$qa$ is connected to one of the two ends of the first drive pad electrode 31BA in the x-direction located closer to the output electrode 73 (end located closer to the resin side surface 55). As viewed in the z-direction, the second element connection via 63$qa$ is exposed in the element encapsulation layer 50A from a position overlapping one of the two ends of the first drive pad electrode 31BA in the x-direction located closer to the output electrode 73 (end located closer to the resin side surface 55).

As shown in FIG. 3, as viewed in the z-direction, each second element connection via 63$qa$ is circular. In the present embodiment, the diameter of the second element connection via 63$qa$ is equal to the diameter of the ground via conductor 62 and is, for example, greater than or equal to 100 μm and less than or equal to 200 μm. The shape of the second element connection via 63$qa$ as viewed in the z-direction is not limited to a circle and may be changed in any manner. For example, the shape of the second element connection via 63$qa$ as viewed in the z-direction may be a polygon such as a quadrangle, or an ellipse. In the present embodiment, the dimension of the second element connection via 63$qa$ in the z-direction is smaller than the dimension of the second switching element 30B in the z-direction. The dimension of the second element connection via 63$qa$ in the z-direction is less than 1 mm. The dimension of the second element connection via 63$qa$ in the z-direction is approximately a few hundred μm. As described above, in the present embodiment, the second element connection vias 63$qa$ are the same in the number, shape, and size as the first element connection vias 63$pa$.

As shown in FIG. 5, the second via connection wire 63$qc$ is disposed on the element encapsulation layer 50A. In other words, the second via connection wire 63$qc$ is disposed in the interface 57 between the element encapsulation layer 50A and the surface-side resin layer 50B. As shown in FIG. 3, the shape of the second via connection wire 63$qc$ as viewed in the z-direction is rectangular so that the short sides extend in the x-direction and the long sides extend in the y-direction. As viewed in the z-direction, the second via connection wire 63$qc$ extends over the first drive pad electrodes 31BA in the y-direction. As viewed in the z-direction, the second via connection wire 63$qc$ covers the second element connection vias 63$qa$. In other words, each of the second element connection vias 63$qa$ is disposed to overlap the second via connection wire 63$qc$ as viewed in the z-direction. More specifically, the second element connection vias 63$qa$ are disposed to overlap both the first drive pad electrodes 31BA and the second via connection wire 63$qc$ as viewed in the z-direction. In the present embodiment, the second via connection wire 63$qc$ is the same in shape and size as the first via connection wire 63$pc$. In addition, the second via connection wire 63$qc$ is shifted from the first via connection wire 63$pc$ in the y-direction. More specifically, as shown in FIG. 3, the center of the second via connection wire 63$qc$ in the y-direction is located closer to the resin side surface 54 (device side surface 14) than the center of the first via connection wire 63$pc$ in the y-direction. As viewed in the x-direction, the second via connection wire 63$qc$ overlaps the first via connection wire 63$pc$. Thus, one of the two ends of the second via connection wire 63$qc$ in the y-direction located closer to the resin side surface 54 (device side surface 14) is located closer to the resin side surface 54 (device side surface 14) than the first via connection wire 63$pc$. In other words, one of the two ends of the first via connection wire 63$pc$ in the y-direction located closer to the resin side surface 53 (device side surface 13) is located closer to the resin side surface 53 (device side surface 13) than the second via connection wire 63$qc$.

As shown in FIG. 3, the center of the second via connection wire 63$qc$ in the y-direction is shifted from the center of the second switching element 30B in the y-direction. More specifically, the center of the second via connection wire 63$qc$ in the y-direction is located closer to the resin side surface 54 than the center of the second switching element 30B in the y-direction. As viewed in the z-direction, the second via connection wire 63$qc$ is shifted from the second switching element 30B in the x-direction. More specifically, as viewed in the z-direction, the second via connection wire 63$qc$ includes an extension extending out of the second switching element 30B toward the support side surface 25 in the x-direction. As shown in FIG. 5, the extension of the second via connection wire 63$qc$ extends to a position at which the second via connection wire 63$qc$ overlaps the output electrode 73 as viewed in the z-direction. The second via connection wire 63$qc$ is spaced apart from the first via connection wire 63$pc$ in the x-direction.

In the present embodiment, the second element connection vias 63$qa$ are disposed to overlap one of the two ends of the second via connection wire 63$qc$ in the x-direction located closer to the resin side surface 55 (end located closer to the output electrode 73). As viewed in the z-direction, one of the two ends of the second via connection wire 63$qc$ located closer to the resin side surface 56 in the x-direction is a portion extending out of the output electrode 73 in the x-direction. Thus, as viewed in the z-direction, the second element connection vias 63$qa$ are disposed so as not to overlap the output electrode 73. As viewed in the z-direction, the end of the second via connection wire 63$qc$ in the x-direction located closer to the resin side surface 56 is disposed to overlap the second switching element 30B. Thus, the second element connection vias 63$qa$ are disposed closer to the resin side surface 56 than the output electrode 73 in the x-direction.

As shown in FIG. 3, in the present embodiment, a plurality of second electrode connection vias 63$qb$ is provided. The second electrode connection vias 63$qb$ are aligned with each other in the x-direction and spaced apart from each other in the y-direction. In the present embodiment, the second electrode connection vias 63$qb$ are aligned with the second element connection vias 63$qa$ in the y-direction. Therefore, the second electrode connection vias 63$qb$ and the second element connection vias 63$qa$ are shifted from the ground via conductors 62 in the y-direction. In addition, the second electrode connection vias 63$qb$ and the second element connection vias 63$qa$ are shifted from the first element connection vias 63$pa$ and the first electrode connection vias 63$pb$ in the y-direction. The arrangement position of the second electrode connection vias 63$qb$ in the y-direction may be changed in any manner. In an example, the second electrode connection vias 63$qb$ may be shifted from the second element connection vias 63$qa$ in the y-direction. At least one of the second electrode connection vias 63$qb$ may be aligned with the ground via conductors 62 in the y-direction.

As viewed in the z-direction, the second electrode connection vias 63$qb$ are disposed to overlap the output electrode 73. More specifically, as viewed in the z-direction, the second electrode connection vias 63$qb$ are disposed to overlap one of the two ends of the output electrode 73 in the x-direction located closer to the resin side surface 56. As viewed in the z-direction, the second electrode connection vias 63$qb$ are disposed to overlap the second via connection wire 63$qc$. In the present embodiment, the second electrode connection vias 63$qb$ are disposed to overlap one of the two ends of the second via connection wire 63$qc$ in the x-direction located closer to the resin side surface 55 (end located closer to the output electrode 73). As viewed in the z-direction, the end of the second via connection wire 63$qc$ located closer to the resin side surface 55 in the x-direction is a portion overlapping the output electrode 73. In other words, as viewed in the z-direction, the second electrode connection vias 63$qb$ are disposed to overlap the extension of the second via connection wire 63$qc$. As described above, as viewed in the z-direction, the second electrode connection vias 63$qb$ are disposed so as not to overlap the second switching element 30B. As viewed in the z-direction, the second electrode connection vias 63$qb$ are disposed between the first switching element 30A and the second switching element 30B in the x-direction.

As shown in FIG. 5, the second electrode connection via 63$qb$ is shifted from the second element connection via 63$qa$ in the z-direction. The second electrode connection via 63$qb$ extends through the surface-side resin layer 50B in the z-direction. More specifically, the resin layer 50 has a through hole 58$f$ extending through the surface-side resin layer 50B in the z-direction. The second via connection wire 63$qc$ is exposed through the through hole 58$f$ in the z-direction. The through hole 58$f$ exposes one of the two ends of the second via connection wire 63$qc$ in the x-direction located closer to the resin side surface 55 (end located closer to the output electrode 73) in the z-direction. The second electrode connection via 63$qb$ is disposed to fill the through hole 58$f$ Thus, the second electrode connection via 63$qb$ extends in the z-direction and is in contact with the second via connection wire 63$qc$. The second electrode connection via 63$qb$ is also exposed from the resin layer 50 in the z-direction. In other words, the second electrode connection via 63$qb$ is connected to one of the two ends of the second via connection wire 63$qc$ in the x-direction located closer to the output electrode 73 (end located closer to the resin side surface 55). Also, as viewed in the z-direction, the second electrode connection via 63$qb$ is exposed in the element encapsulation layer 50A from a position overlapping one of the two ends of the second via connection wire 63$qc$ in the x-direction located closer to the output electrode 73 (end located closer to the resin side surface 55). The portion of the second electrode connection via 63$qb$ exposed from the resin layer 50 is covered with the output electrode 73. Thus, the second electrode connection via 63$qb$ is in contact with the output electrode 73. In other words, the second electrode connection via 63$qb$ is connected to both the second via connection wire 63$qc$ and the output electrode 73.

As shown in FIG. 3, as viewed in the z-direction, each second electrode connection via 63$qb$ is circular. In the present embodiment, the diameter of the second electrode connection via 63$qb$ is equal to the diameter of the second element connection via 63$qa$ and is, for example, greater than or equal to 100 μm and less than or equal to 200 μm. The shape of the second electrode connection via 63$qb$ as viewed in the z-direction is not limited to a circle and may be changed in any manner. For example, the shape of the second electrode connection via 63$qb$ as viewed in the z-direction may be a polygon such as a quadrangle, or an ellipse.

In the present embodiment, the dimension of the second electrode connection via 63$qb$ in the z-direction is greater than the dimension of the second element connection via 63$qa$ in the z-direction. The dimension of the second electrode connection via 63$qb$ in the z-direction may be changed in any manner. In an example, the dimension of the second electrode connection via 63$qb$ in the z-direction may be equal to the dimension of the second element connection via 63$qa$ in the z-direction. In this case, the thickness of a portion of the element encapsulation layer 50A that covers the second element main surface 31B of the second switching element 30B is equal to the thickness of the surface-side resin layer 50B.

In the present embodiment, the second electrode connection vias 63$qb$ are the same in the number, shape, and size as the second electrode connection vias 63$qb$. As described above, the first output via conductor 63P and the second output via conductor 63Q are disposed so as to reduce variations between a first inductance in the conductive path extending from the second drive pad electrodes 31AB of the first switching element 30A to the output electrode 73 and a second inductance in the conductive path extending from the first drive pad electrodes 31BA to the output electrode 73. The first output via conductor 63P and the second output via conductor 63Q are designed so that the first inductance and the second inductance are equal to each other.

As shown in FIGS. 3 and 7, the element control via conductors 64 separately electrically connect the control pad electrodes 31AC and 31BC of the switching elements 30A and 30B to the driver 40. The element control via conductors 64 are embedded in the resin layer 50. In other words, the element control via conductors 64 are not exposed from the resin layer 50.

The element control via conductors 64 include a first control via conductor 64P connecting a driver pad electrode 43 of the driver 40 to the control pad electrode 31AC of the first switching element 30A and a second control via conductor 64Q connecting a further driver pad electrode 43 of the driver 40 to the control pad electrode 31BC of the second switching element 30B.

As shown in FIG. 7, the first control via conductor 64P includes a first element control via 64pa connected to the control pad electrode 31AC, a first driver control via 64pb connected to the driver pad electrode 43 of the driver 40, and a first control connection wire 64pc connecting the first element control via 64pa and the first driver control via 64pb.

As shown in FIG. 3, as viewed in the z-direction, the first element control via 64pa is disposed to overlap the control pad electrode 31AC. As shown in FIG. 7, the first element control via 64pa extends in the z-direction through a portion of the element encapsulation layer 50A located between the first element main surface 31A of the first switching element 30A and the interface 57 between the element encapsulation layer 50A and the surface-side resin layer 50B. In other words, the first element control via 64pa extends through a portion of the element encapsulation layer 50A that covers the first element main surface 31A. More specifically, the element encapsulation layer 50A has a through hole 58g extending in the z-direction through the portion of the element encapsulation layer 50A located between the first element main surface 31A of the first switching element 30A and the interface 57. The control pad electrode 31AC is exposed from the element encapsulation layer 50A through the through hole 58g in the z-direction. The first element control via 64pa is disposed to fill the through hole 58g. Thus, the first element control via 64pa extends in the z-direction and is in contact with the control pad electrode 31AC. In the present embodiment, the dimension of the first element control via 64pa in the z-direction is smaller than the dimension of the first switching element 30A in the z-direction. The dimension of the first element control via 64pa in the z-direction is less than approximately 1 mm. In an example, the dimension of the first element control via 64pa in the z-direction is approximately a few hundred μm. In the present embodiment, the dimension of the first element control via 64pa in the z-direction is equal to the dimension of the first element connection via 63pa in the z-direction.

As shown in FIG. 3, as viewed in the z-direction, the first element control via 64pa is circular. The diameter of first element control via 64pa is, for example, greater than or equal to 100 μm and less than or equal to 200 μm. In the present embodiment, the diameter of the first element control via 64pa is smaller than the diameter of the vias of the switching elements 30A and 30B through which a drive current flows such as the power supply via conductors 61 and the ground via conductors 62. The shape of the first element control via 64pa as viewed in the z-direction is not limited to a circle and may be changed in any manner. For example, the shape of first element control via 64pa as viewed in the z-direction may be a polygon such as a quadrangle, or an ellipse. The diameter of the first element control via 64pa may be changed in any manner. In an example, the diameter of the first element control via 64pa may be equal to the diameter of the vias of the switching elements 30A and 30B through which a drive current flows such as the power supply via conductors 61.

As shown in FIG. 3, as viewed in the z-direction, the first driver control via 64pb is disposed to overlap a predetermined driver pad electrode 43 of the driver 40. In the present embodiment, the predetermined driver pad electrode 43 is disposed on the driver main surface 41 of the driver 40 at a position opposed to the control pad electrode 31AC in the y-direction. More specifically, as viewed in the z-direction, the predetermined driver pad electrode 43 is disposed at one of the four corners of the driver main surface 41 located close to both the resin side surface 54 and the resin side surface 55. In the present embodiment, the first driver control via 64pb is aligned with the first element control via 64pa in the x-direction.

As shown in FIG. 7, the first driver control via 64pb extends in the z-direction through a portion of the element encapsulation layer 50A that covers the driver main surface 41. More specifically, the element encapsulation layer 50A has a through hole 58h extending in the z-direction through the portion of the element encapsulation layer 50A that covers the driver main surface 41. The predetermined driver pad electrode 43 is exposed from the element encapsulation layer 50A through the through hole 58h in the z-direction. The first driver control via 64pb is disposed to fill the through hole 58h. Thus, the first driver control via 64pb extends in the z-direction and is in contact with predetermined driver pad electrode 43. In the present embodiment, the dimension of the first driver control via 64pb in the z-direction is smaller than the dimension of the driver 40 in the z-direction. The dimension of the first driver control via 64pb in the z-direction is less than approximately 1 mm. In an example, the dimension of the first driver control via 64pb in the z-direction is approximately a few hundred μm.

As shown in FIG. 3, as viewed in the z-direction, the first driver control via 64pb is circular. The diameter of the first driver control via 64pb is equal to the diameter of the first element control via 64pa and is, for example, greater than or equal to 100 μm and less than or equal to 200 μm. The shape of the first driver control via 64pb as viewed in the z-direction is not limited to a circle and may be changed in any manner. For example, the shape of the first driver control via 64pb as viewed in the z-direction may be a polygon such as a quadrangle, or an ellipse.

As shown in FIG. 7, the first control connection wire 64pc is disposed on the element encapsulation layer 50A. In other words, the first control connection wire 64pc is disposed in the interface 57 between the element encapsulation layer 50A and the surface-side resin layer 50B. As shown in FIG. 3, the first control connection wire 64pc is strip-shaped and extends in the y-direction.

As shown in FIGS. 3 and 7, one of the two ends of the first control connection wire 64pc in the y-direction located at the first switching element 30A covers a portion of the first element control via 64pa exposed from the element encapsulation layer 50A in the z-direction. Thus, the first control connection wire 64*pc* is in contact with the first element control via 64*pa*. As described above, as viewed in the z-direction, the first element control via 64*pa* is disposed to overlap both the control pad electrode 31AC and the first control connection wire 64*pc*. One of the two ends of the first control connection wire 64*pc* in the y-direction located at the driver 40 covers a portion of the first driver control via 64*pb* exposed from the element encapsulation layer 50A in the z-direction. Thus, the first control connection wire 64*pc* is in contact with the first driver control via 64*pb*. As described above, as viewed in the z-direction, the first driver control via 64*pb* is disposed to overlap both predetermined driver pad electrode 43 and the first control connection wire 64*pc*.

As shown in FIG. 3, the second control via conductor 64Q includes a second element control via 64*qa* connected to the control pad electrode 31BC of the second switching element 30B, a second driver control via 64*qb* connected to the further driver pad electrode 43 of the driver 40, and a second control connection wire 64*qc* connecting the second element control via 64*qa* and the second driver control via 64*qb*.

As shown in FIG. 3, as viewed in the z-direction, the second element control via 64*qa* is disposed to overlap the control pad electrode 31BC. The second element control via 64*qa* extends in the z-direction through a portion of the element encapsulation layer 50A that covers the second element main surface 31B. More specifically, the element encapsulation layer 50A has a through hole 58*i* extending in the z-direction through the portion of the element encapsulation layer 50A that covers the second element main surface 31B. The control pad electrode 31BC is exposed from the element encapsulation layer 50A through the through hole 58*i* in the z-direction. The second element control via 64*qa* is disposed to fill the through hole 58*i*. Thus, the second element control via 64*qa* extends in the z-direction and is in contact with the control pad electrode 31BC. In the present embodiment, the dimension of the second element control via 64*qa* in the z-direction is smaller than the dimension of the second switching element 30B in the z-direction. The dimension of the second element control via 64*qa* in the z-direction is equal to the dimension of the first element control via 64*pa* in the z-direction and is less than approximately 1 mm. In an example, the dimension of the second element control via 64*qa* in the z-direction is approximately a few hundred μm. When the difference in the dimension in the z-direction between the second element control via 64*qa* and the first element control via 64*pa* is, for example, less than or equal to 10% of the dimension of the second element control via 64*qa* in the z-direction, it is considered that the dimension of the second element control via 64*qa* in the z-direction is equal to the dimension of the first element control via 64*pa* in the z-direction.

As shown in FIG. 3, as viewed in the z-direction, the second element control via 64*qa* is circular. The diameter of the second element control via 64*qa* is equal to the diameter of the first element control via 64*pa*, and is, for example, greater than or equal to 100 μm and less than or equal to 200 μm. The shape of the second element control via 64*qa* as viewed in the z-direction is not limited to a circle and may be changed in any manner. For example, the shape of the second element control via 64*qa* as viewed in the z-direction may be a polygon such as a quadrangle, or an ellipse.

As shown in FIG. 3, as viewed in the z-direction, the second driver control via 64*qb* is disposed to overlap the further driver pad electrode 43 of the driver 40. In the present embodiment, the further driver pad electrode 43 is disposed on the driver main surface 41 of the driver 40 near the control pad electrode 31BC. More specifically, as viewed in the z-direction, the further driver pad electrode 43 is disposed at one of the four corners of the driver main surface 41 located close to both the resin side surface 54 and the resin side surface 56. In the present embodiment, the second driver control via 64*qb* is shifted from the second element control via 64*qa* in the x-direction. The second driver control via 64*qb* is disposed closer to the support side surface 26 than the second element control via 64*qa* in the x-direction.

The second driver control via 64*qb* extends in the z-direction through a portion of the element encapsulation layer 50A that covers the driver main surface 41. More specifically, the element encapsulation layer 50A has a through hole 58*j* extending in the z-direction through the portion of the element encapsulation layer 50A that covers the driver main surface 41. The further driver pad electrode 43 is exposed in the z-direction from the element encapsulation layer 50A via the through hole 58*j*. The second driver control via 64*qb* is disposed to fill the through hole 58*j*. Thus, the second driver control via 64*qb* extends in the z-direction and is in contact with the further driver pad electrode 43. In the present embodiment, the dimension of the second driver control via 64*qb* in the z-direction is smaller than the dimension of the driver 40 in the z-direction. The dimension of the second driver control via 64*qb* in the z-direction is equal to the dimension of the first driver control via 64*pb* in the z-direction and is less than approximately 1 mm. In an example, the dimension of the second driver control via 64*qb* in the z-direction is approximately a few hundred μm. When the difference in the dimension in the z-direction between the second driver control via 64*qb* and the first driver control via 64*pb* is, for example, less than or equal to 10% of the dimension of the second driver control via 64*qb* in the z-direction, it is considered that the dimension of the second driver control via 64*qb* in the z-direction is equal to the dimension of the first driver control via 64*pb* in the z-direction.

As shown in FIG. 3, as viewed in the z-direction, the first driver control via 64*pb* is circular. The diameter of the first driver control via 64*pb* is equal to the diameter of the first element control via 64*pa* and is, for example, greater than or equal to 100 μm and less than or equal to 200 μm. The shape of the first driver control via 64*pb* as viewed in the z-direction is not limited to a circle and may be changed in any manner. For example, the shape of the first driver control via 64*pb* as viewed in the z-direction may be a polygon such as a quadrangle, or an ellipse.

The first control connection wire 64*pc* is disposed on the element encapsulation layer 50A. In other words, the first control connection wire 64*pc* is disposed in the interface 57 between the element encapsulation layer 50A and the surface-side resin layer 50B. As shown in FIG. 3, the first control connection wire 64*pc* is strip-shaped and includes a portion obliquely extending from the driver 40 toward the resin side surface 56 in the y-direction as the second switching element 30B becomes closer.

As shown in FIG. 3, one of the two ends of the second control connection wire 64*qc* in the y-direction located at the second switching element 30B covers a portion of the second element control via 64*qa* exposed from the element encapsulation layer 50A in the z-direction. Thus, the second control connection wire 64*qc* is in contact with the second element control via 64*qa*. As described above, as viewed in the z-direction, the second element control via 64*qa* is disposed to overlap both the control pad electrode 31BC and the second control connection wire 64*qc*. One of the two ends of the second control connection wire 64*qc* in the y-direction located at the driver 40 covers a portion of the second driver control via 64*qb* exposed from the element encapsulation layer 50A in the z-direction. Thus, the second control connection wire 64*qc* is in contact with the second driver control via 64*qb*. As described above, as viewed in the z-direction, the second driver control via 64*qb* is disposed to overlap both the further driver pad electrode 43 and the second control connection wire 64*qc*.

Figure 8:
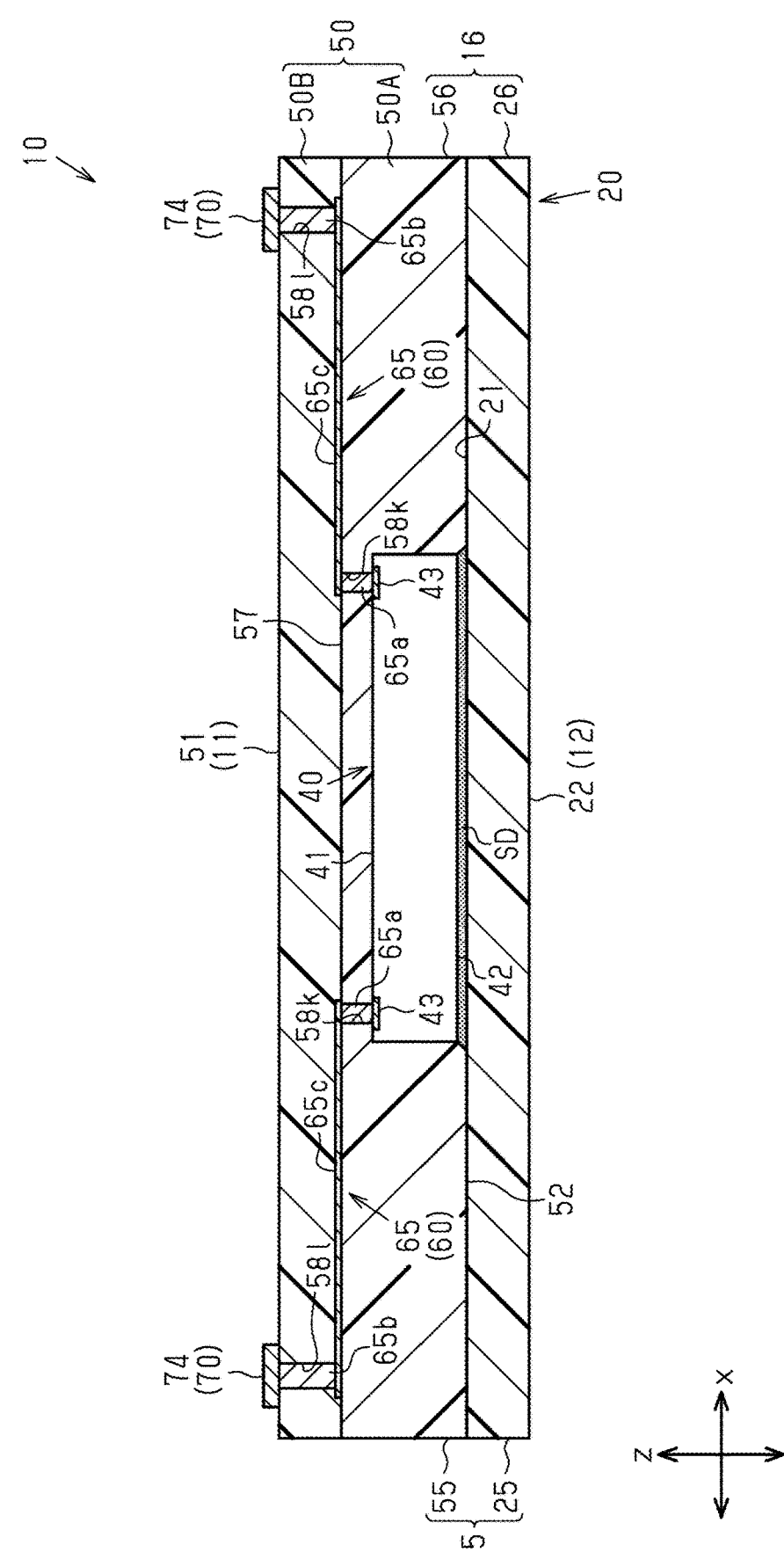
FIG. 8 is a cross-sectional view of the semiconductor device taken along line 8-8 in FIG. 4.

As shown in FIGS. 3 and 8, a plurality of driver via conductors 65 is provided. The driver via conductors 65 separately electrically connect the driver pad electrodes 43 of the driver 40 to the driver connection electrodes 74.

As shown in FIG. 8, the driver via conductors 65 extend through the resin layer 50 in the z-direction. In other words, the driver via conductors 65 extend through the element encapsulation layer 50A and the surface-side resin layer 50B in the z-direction. As shown in FIG. 8, each driver via conductor 65 is crank-shaped. The driver via conductor 65 includes a driver connection via 65*a* electrically connected to the driver 40, a driver electrode connection via 65*b* electrically connected to a driver connection electrode 74, and a via connection wire 65*c* connecting the driver connection via 65*a* and the driver electrode connection via 65*b*.

As shown in FIG. 3, in the present embodiment, as viewed in the z-direction, the driver connection vias 65*a* are disposed to overlap the driver pad electrodes 43 of the driver 40.

As shown in FIG. 8, each driver connection via 65*a* extends in the z-direction through a portion of the element encapsulation layer 50A that covers the driver main surface 41. More specifically, the element encapsulation layer 50A has a through hole 58*k* extending in the z-direction through a portion of the element encapsulation layer 50A that covers the driver main surface 41. The driver pad electrode 43 is exposed through the through hole 58*k* in the z-direction. The driver connection via 65*a* is disposed to fill the through hole 58*k*. Thus, the driver connection via 65*a* extends in the z-direction and is in contact with the driver pad electrode 43. In the present embodiment, the dimension of the driver connection via 65*a* in the z-direction is smaller than the dimension of the driver 40 in the z-direction. The dimension of the driver connection via 65*a* in the z-direction is equal to the dimension of the first driver control via 64*pb* in the z-direction and is less than approximately 1 mm. In an example, the dimension of the driver connection via 65*a* in the z-direction is approximately a few hundred μm. When the difference in the dimension in the z-direction between the driver connection via 65*a* and the first driver control via 64*pb* is, for example, less than or equal to 10% of the dimension of the driver connection via 65*a* in the z-direction, it is considered that the dimension of the driver connection via 65*a* in the z-direction is equal to the dimension of the first driver control via 64*pb* in the z-direction.

As shown in FIG. 3, as viewed in the z-direction, each driver connection via 65*a* is circular. The driver connection via 65*a* has a diameter that is, for example, greater than or equal to 100 μm and less than or equal to 200 μm. The shape of the driver connection via 65*a* as viewed in the z-direction is not limited to a circle and may be changed in any manner. For example, the shape of the driver connection via 65*a* as viewed in the z-direction may be a polygon such as a quadrangle or an ellipse.

As shown in FIG. 8, each via connection wire 65*c* is disposed on the element encapsulation layer 50A. In other words, the via connection wire 65*c* is disposed in the interface 57 between the element encapsulation layer 50A and the surface-side resin layer 50B. As shown in FIG. 3, as viewed in the z-direction, the via connection wire 65*c* is strip-shaped. As viewed in the z-direction, the via connection wire 65*c* covers the driver connection via 65*a*. In other words, the driver connection via 65*a* is disposed to overlap the via connection wire 65*c* as viewed in the z-direction. More specifically, the driver connection via 65*a* is disposed to overlap both the driver pad electrode 43 and the via connection wire 65*c* as viewed in the z-direction.

As shown in FIG. 3, as viewed in the z-direction, each driver electrode connection via 65*b* is disposed to overlap the driver connection electrode 74. In other words, as viewed in the z-direction, the driver electrode connection via 65*b* is disposed to overlap the via connection wire 65*c*.

As shown in FIG. 8, each driver electrode connection via 65*b* extends through the surface-side resin layer 50B in the z-direction. More specifically, the resin layer 50 has a through hole 58*l* extending through the surface-side resin layer 50B in the z-direction. The via connection wire 65*c* is exposed through the through hole 58*l* in the z-direction. The driver electrode connection via 65*b* is disposed to fill the through hole 58*l*. Thus, the driver electrode connection via 65*b* extends in the z-direction and is in contact with the via connection wire 65*c*. The driver electrode connection via 65*b* is exposed from the resin layer 50 in the z-direction. The portion of the driver electrode connection via 65*b* exposed from the resin layer 50 is covered with the driver connection electrode 74. Thus, the driver electrode connection via 65*b* is in contact with the driver connection electrode 74.

In the present embodiment, the dimension of the driver electrode connection via 65*b* in the z-direction is greater than the dimension of the driver connection via 65*a* in the z-direction. The dimension of the driver electrode connection via 65*b* in the z-direction is equal to the dimension of each of the electrode connection vias 63*pb* and 63*qb* in the z-direction. When the difference in the dimension in the z-direction between the driver electrode connection via 65*b* and each of the electrode connection vias 63*pb* and 63*qb* is, for example, less than or equal to 10% of the dimension of the driver electrode connection via 65*b* in the z-direction, it is considered that the dimension of the driver electrode connection via 65*b* in the z-direction is equal to the dimension of each of the electrode connection vias 63*pb* and 63*qb* in the z-direction. The dimension of the driver electrode connection via 65*b* in the z-direction may be changed in any manner. In an example, the dimension of the driver electrode connection via 65*b* in the z-direction may be equal to the dimension of the driver connection via 65*a* in the z-direction.

As shown in FIG. 3, as viewed in the z-direction, each driver electrode connection via 65*b* is circular. The diameter of the driver electrode connection via 65*b* is equal to the diameter of the driver connection via 65*a*, and is, for example, greater than or equal to 100 μm and less than or equal to 200 μm. The shape of the driver electrode connection via 65*b* as viewed in the z-direction is not limited to a circle and may be changed in any manner. For example, the shape of the driver electrode connection via 65*b* as viewed in the z-direction may be a polygon such as a quadrangle, or an ellipse.

Figure 9:
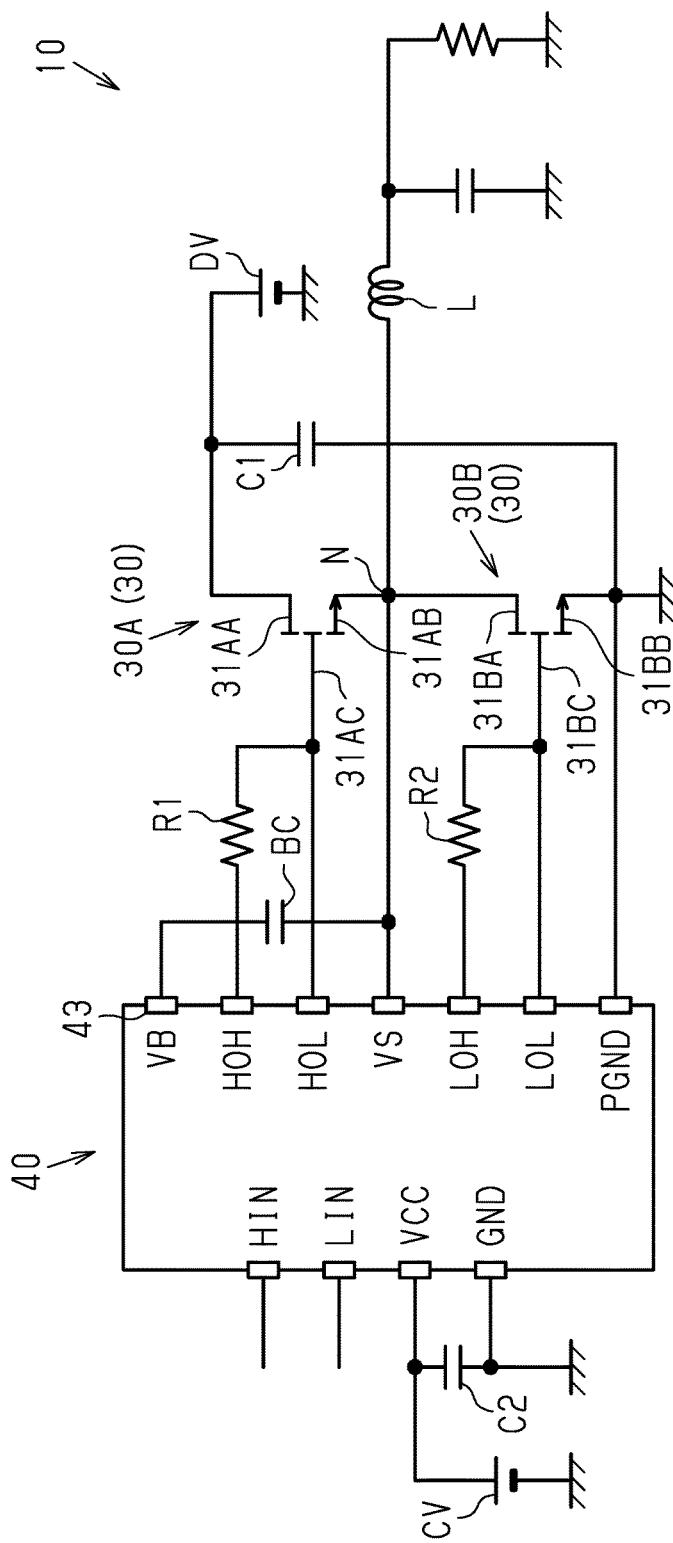
FIG. 9 is a circuit diagram showing an example of a circuit configuration of the semiconductor device shown in FIG. 1.

An example of a circuit configuration of the semiconductor device 10 will now be described with reference to FIG. 9.

The first drive pad electrode 31AA (drain electrode) of the first switching element 30A is electrically connected to a positive terminal of a driving power supply DV, which is a direct current power supply. The second drive pad electrode 31AB (source electrode) of the first switching element 30A is electrically connected to the first drive pad electrode 31BA (drain electrode) of the second switching element 30B. The second drive pad electrode 31BB (source electrode) of the second switching element 30B is connected to ground. Thus, the first switching element 30A and the second switching element 30B are connected in series.

A capacitor C1 is connected to the first switching element 30A and the second switching element 30B that are connected in series. The capacitor C1 serves to remove noise from voltage that is supplied from the driving power supply DV to the first drive pad electrode 31AA of the first switching element 30A.

A node N is disposed between the second drive pad electrode 31AB of the first switching element 30A and the first drive pad electrode 31BA of the second switching element 30B and is electrically connected to a load L to which the semiconductor device 10 supplies electric power. The load L is arranged outside the semiconductor device 10. An example of the load L is a motor.

The driver 40 is electrically connected to the control pad electrode 31AC (gate electrode) of the first switching element 30A and the control pad electrode 31BC (gate electrode) of the second switching element 30B. The driver 40 generates a gate voltage that controls activation and deactivation of the switching elements 30A and 30B based on a signal from a signal generation circuit (not shown) arranged outside the semiconductor device 10. The driver 40 supplies the gate voltage to the control pad electrode 31AC and 31BC.

The driver pad electrodes 43 of the driver 40 include a first signal input terminal HIN, a second signal input terminal LIN, a control-side power supply electrode VCC, a control-side ground electrode GND, a bootstrap terminal VB, a first signal output electrode HOH, a second signal output electrode HOL, an output-side power supply electrode VS, a third signal output electrode LOH, a fourth signal output electrode LOL, and an output-side ground electrode PGND. The driver pad electrodes 43 may include other terminals in addition to the terminals described above.

The first signal input terminal HIN receives a high-potential signal from the signal generation circuit. The second signal input terminal LIN receives a low-potential signal from the signal generation circuit. The driver 40 generates a gate voltage based on the high-potential signal and the low-potential signal received from the signal generation circuit through the signal input terminals HIN and LIN and outputs the gate voltage to the control pad electrode 31AC and 31BC of the switching elements 30A and 30B.

The control-side power supply electrode VCC is a terminal configured to be electrically connected to a positive terminal of a control power supply CV, which is a direct-current power supply provided outside the semiconductor device 10. A negative terminal of the control power supply CV is connected to ground. A capacitor C2 is disposed between the control-side power supply electrode VCC and the control power supply CV. The capacitor C2 and the control power supply CV are connected in parallel. The capacitor C2 serves to remove noise from voltage supplied from the control power supply CV to the control-side power supply electrode VCC. The capacitor C2 has a first terminal connected to the positive terminal of the control-side power supply electrode VCC. The capacitor C2 has a second terminal connected to ground. The control-side ground electrode GND is connected to ground. More specifically, the control-side ground electrode GND is electrically connected to the second terminal of the capacitor C2. The driver 40 is driven by voltage (for example, 5 V) supplied from the control power supply CV.

The output-side power supply electrode VS is a terminal serving as a power supply of the load L. The output-side power supply electrode VS is connected to the node N disposed between the second drive pad electrode 31AB of the first switching element 30A and the first drive pad electrode 31BA of the second switching element 30B.

Each of the first signal output electrode HOH and the second signal output electrode HOL is a terminal that supplies a gate voltage generated in the driver 40 to the control pad electrode 31AC of the first switching element 30A. The signal output electrodes HOH and HOL are electrically connected to the control pad electrode 31AC. A current limiting resistor R1 is disposed between the first signal output electrode HOH and the control pad electrode 31AC.

Each of the third signal output electrode LOH and the fourth signal output electrode LOL is a terminal that supplies a gate voltage generated in the driver 40 to the control pad electrode 31BC of the second switching element 30B. The signal output electrodes LOH and LOL are electrically connected to the control pad electrode 31BC. A current limiting resistor R2 is disposed between the third signal output electrode LOH and the control pad electrode 31BC.

The bootstrapping terminal VB is connected to a bootstrap capacitor BC. The bootstrap capacitor BC forms a bootstrapping circuit (not shown) that generates a gate voltage that has a high potential and is output from the first signal output electrode HOH and the second signal output electrode HOL. The driver 40 includes a bootstrap diode forming the bootstrapping circuit. The bootstrap capacitor BC has a first terminal connected to the bootstrapping terminal VB. The bootstrap capacitor BC has a second terminal connected to the node N disposed between the second drive pad electrode 31AB of the first switching element 30A and the first drive pad electrode 31BA of the second switching element 30B.

The output-side ground electrode PGND is electrically connected to the second drive pad electrode 31BB (source electrode) of the second switching element 30B. That is, the output-side ground electrode PGND is connected to ground.

With this configuration, when a high-potential signal and a low-potential signal from the signal generation circuit are input into the driver 40, the driver 40 generates a gate voltage based on the signals and supplies the gate voltage to the control pad electrodes 31AC and 31BC of the switching elements 30A and 30B. The switching elements 30A and 30B are activated and deactivated based on the gate voltage in a complementary manner.

Semiconductor Device Manufacturing Method

An example of a method for manufacturing the semiconductor device 10 of the present embodiment will be described with reference to FIGS. 10 to 24.

The method for manufacturing the semiconductor device 10 mainly includes a wiring layer forming step, a mounting step, an element encapsulation layer forming step, a first via conductor forming step, a surface-side resin layer forming step, a second via conductor forming step, an external electrode forming step, and a cutting step.

Figure 10:
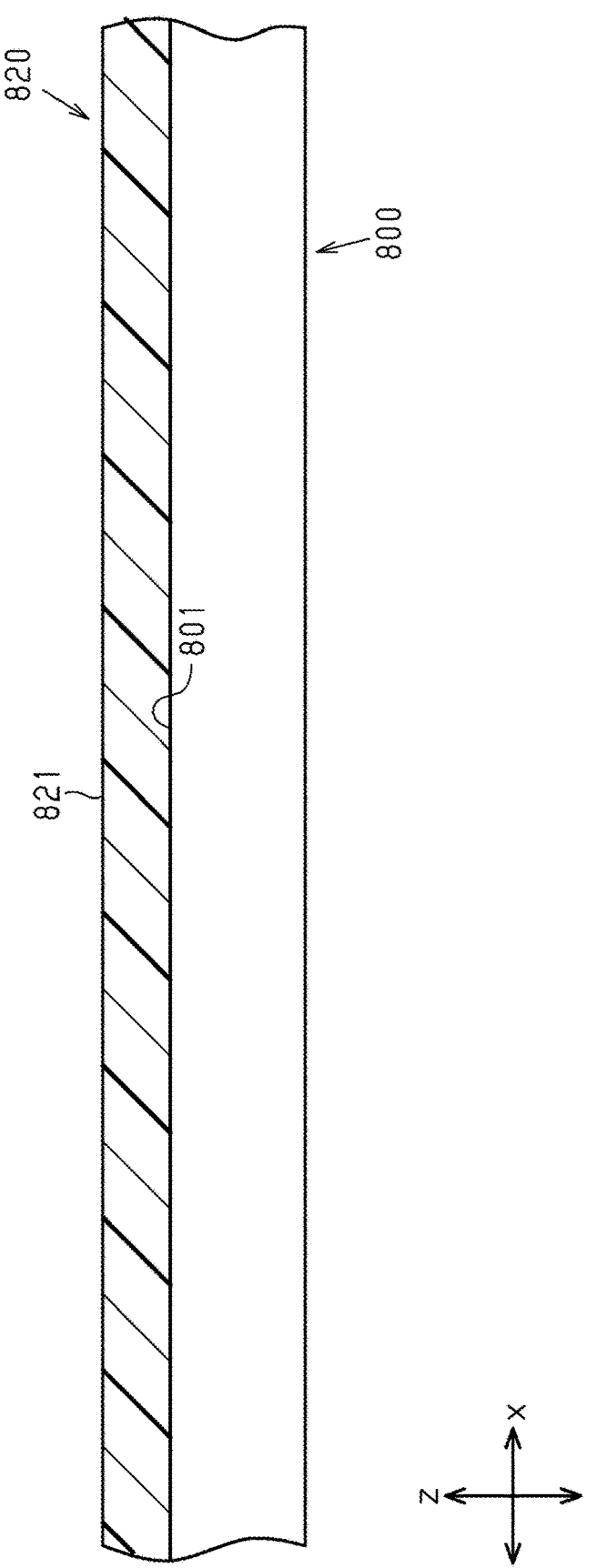
FIG. 10 is a diagram showing an example of a manufacturing step in a method for manufacturing the semiconductor device in an embodiment.

In the wiring layer forming step, as shown in FIG. 10, a support substrate 800 that is formed of, for example, silicon (Si) is prepared. The support substrate 800 includes a substrate main surface 801 facing in one direction in the z-direction. Then, a base member 820 is formed on the substrate main surface 801. The base member 820 forms the support layer 20 of the semiconductor device 10 and is formed from, for example, an epoxy resin. The base member 820 is formed through, for example, transfer molding or compression molding. The base member 820 includes a base member main surface 821 facing in the same direction as the substrate main surface 801 in the z-direction.

Figure 11:
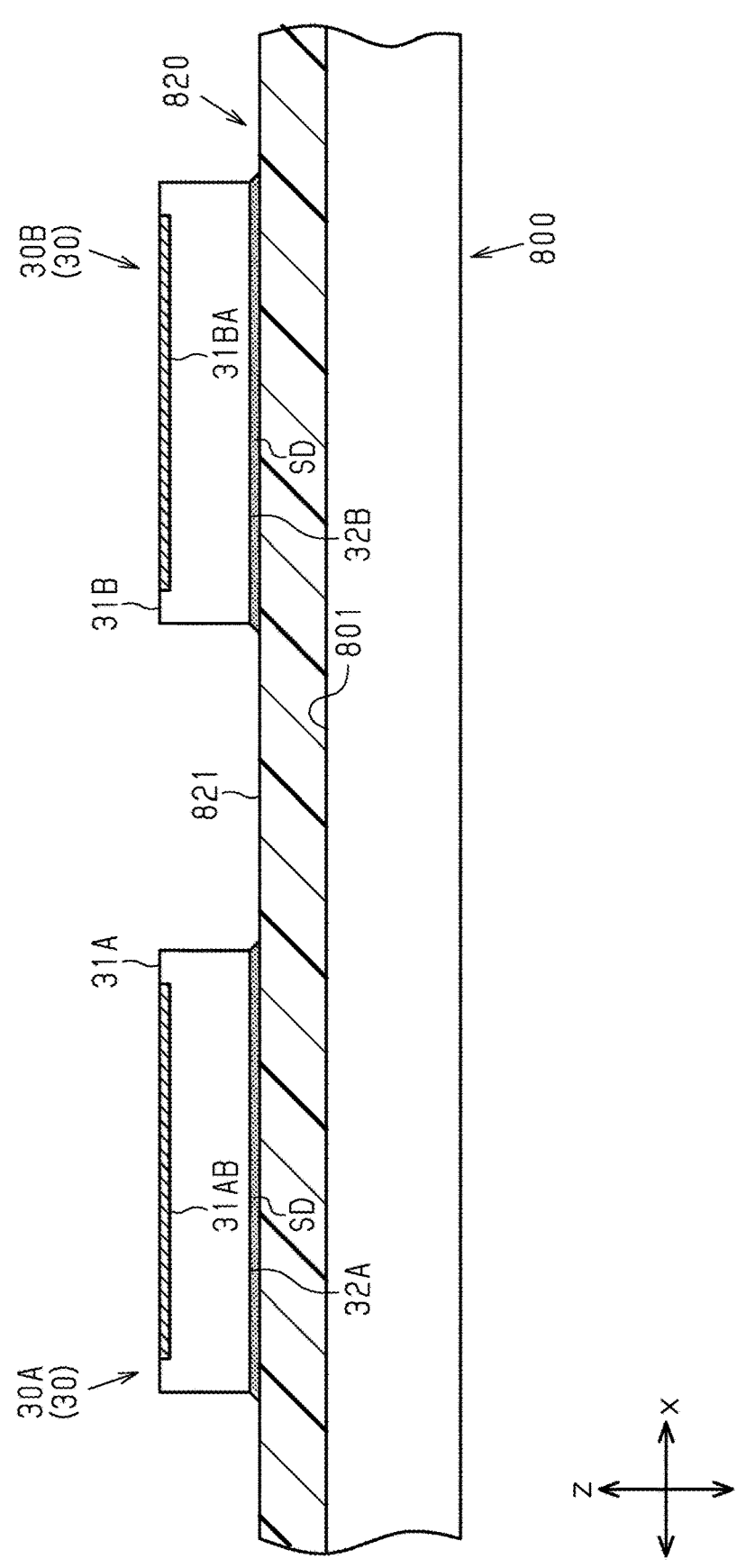
FIG. 11 is a diagram showing an example of a manufacturing step in the method for manufacturing the semiconductor device.
Figure 12:
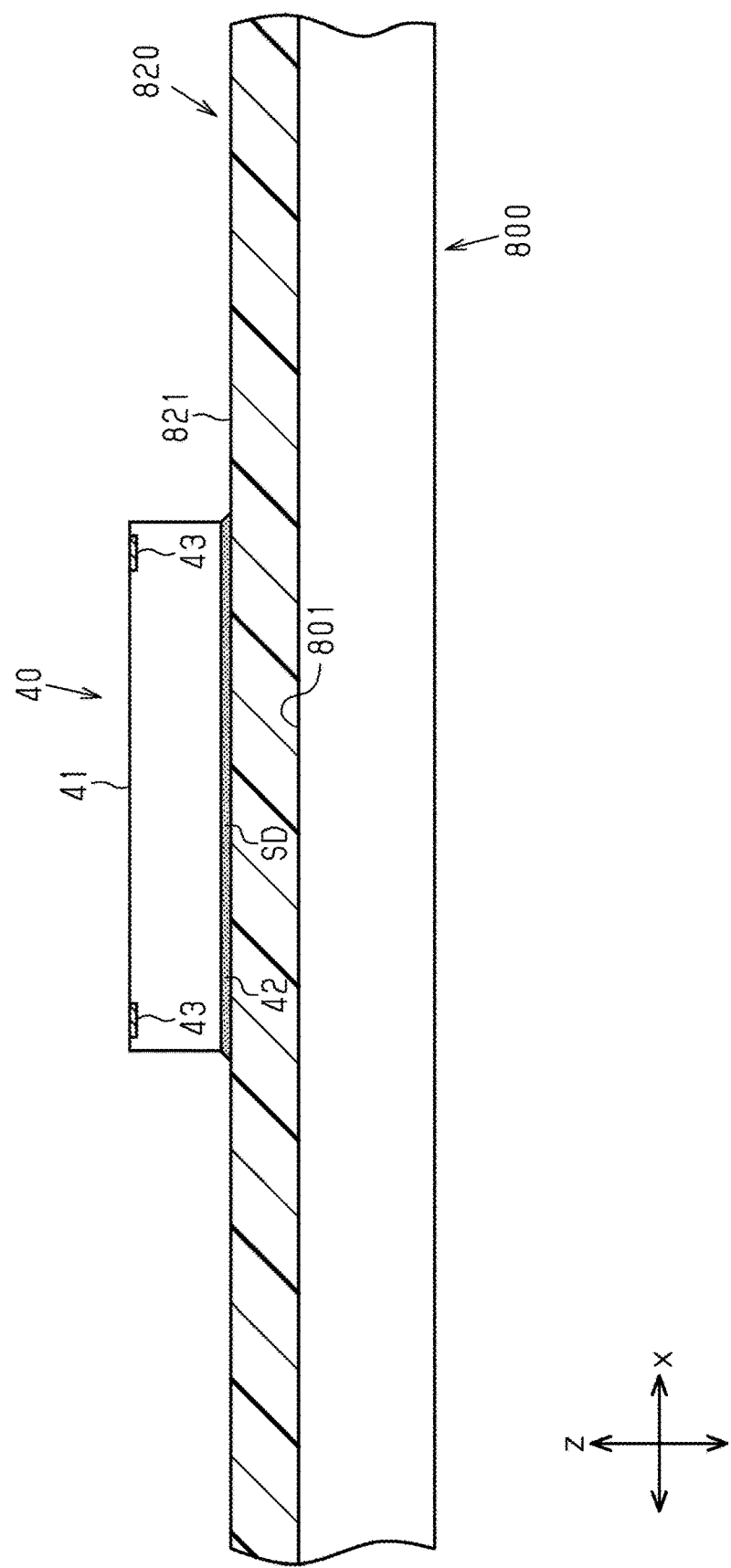
FIG. 12 is a diagram showing an example of a manufacturing step in the method for manufacturing the semiconductor device.

In the mounting step, the switching elements 30A and 30B shown in FIG. 11 and the driver 40 shown in FIG. 12 are mounted on the base member 820.

As shown in FIG. 11, the switching elements 30A and 30B are mounted on the base member main surface 821 of the base member 820. More specifically, a liquid bonding material SD is applied to portions of the base member main surface 821 on which the switching elements 30A and 30B will be mounted. Then, the switching elements 30A and 30B are mounted on the bonding material SD through, for example, die-bonding. Subsequently, the bonding material SD is cured so that the bonding material SD is bonded to each of the switching elements 30A and 30B. When solder or Ag paste is used as the bonding material SD, the switching elements 30A and 30B may be bonded to the base member main surface 821 through a reflow process and a cooling process.

As shown in FIG. 12, the driver 40 is mounted on the base member main surface 821. The method of mounting the driver 40 on the base member main surface 821 is the same as the method of mounting the switching elements 30A and 30B on the base member main surface 821.

Figure 13:
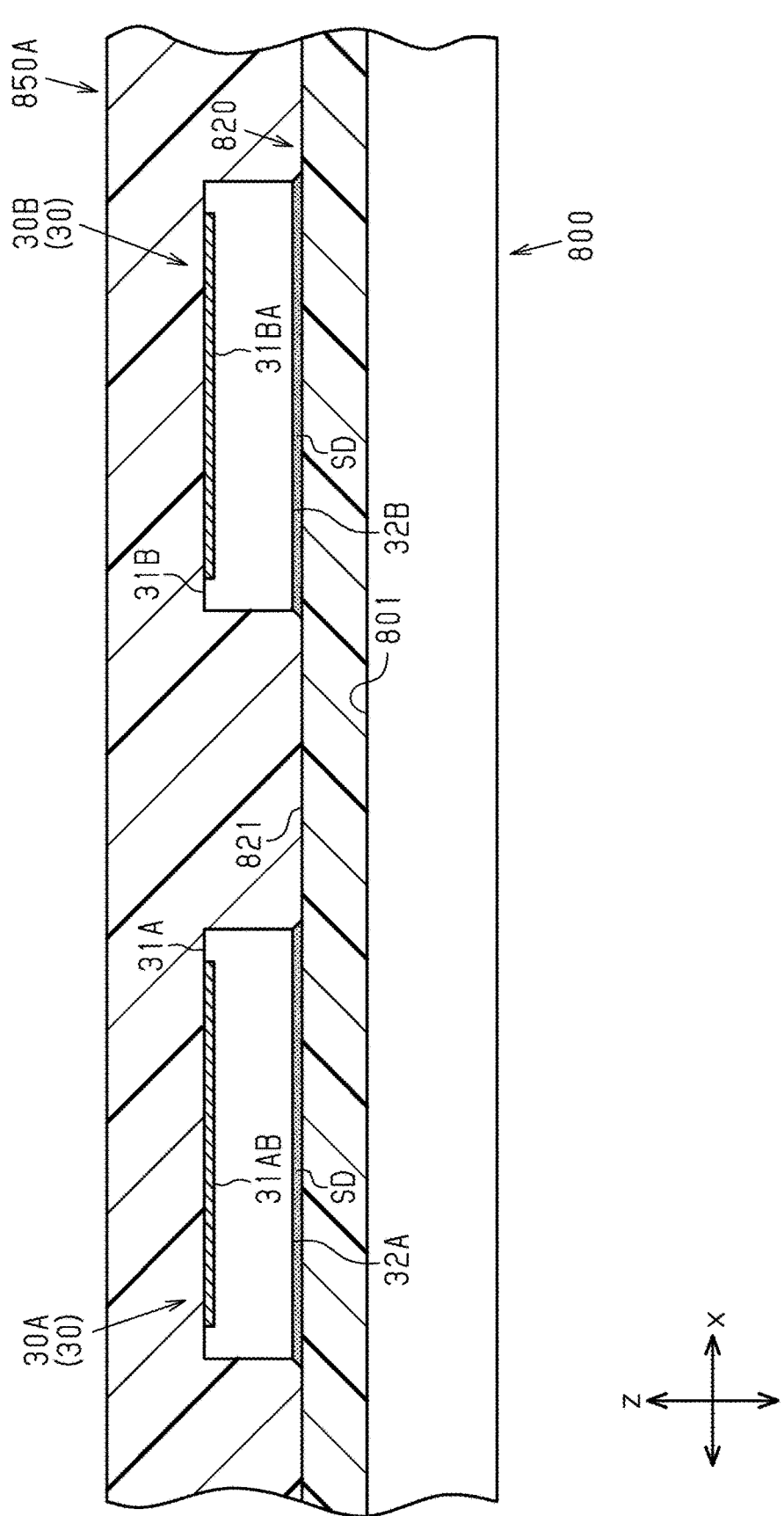
FIG. 13 is a diagram showing an example of a manufacturing step in the method for manufacturing the semiconductor device.
Figure 14:
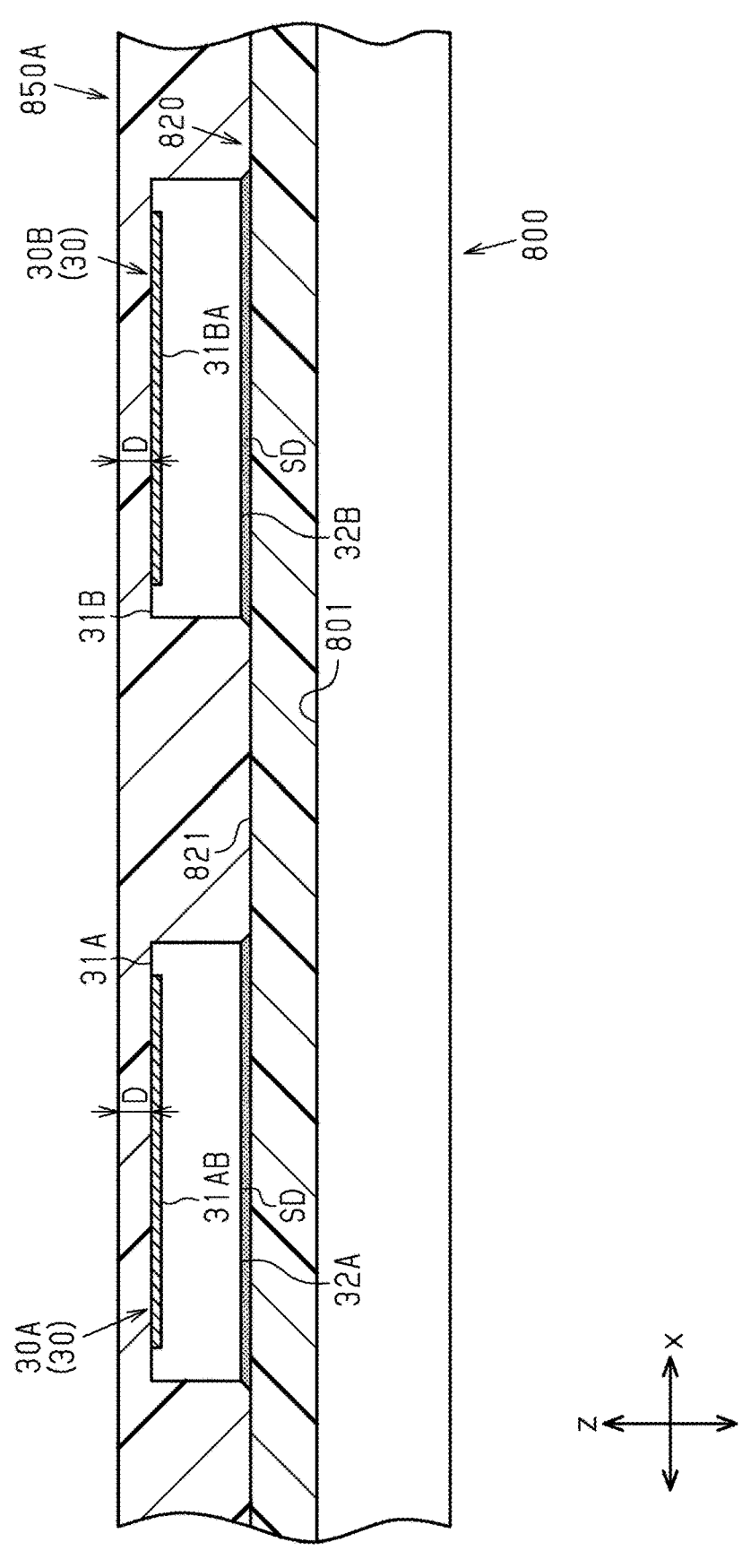
FIG. 14 is a diagram showing an example of a manufacturing step in the method for manufacturing the semiconductor device.

The element encapsulation layer forming step includes a resin layer forming step shown in FIG. 13 and a grinding step shown in FIG. 14.

As shown in FIG. 13, in the resin layer forming step, an element encapsulation layer 850A is formed to encapsulate the switching elements 30A and 30B and the driver 40. The element encapsulation layer 850A is a layer that forms the element encapsulation layer 50A of the semiconductor device 10 and is formed from, for example, a black epoxy resin. The thickness of the element encapsulation layer 850A is less than the thickness of the element encapsulation layer 50A. The element encapsulation layer 850A is formed through, for example, transfer molding or compression molding.

As shown in FIG. 14, in the grinding step, the element encapsulation layer 850A is removed in the z-direction. As a result, the element encapsulation layer 850A is reduced in thickness. More specifically, a grinding machine is used to remove a portion of the element encapsulation layer 850A located at the opposite side from the base member 820 in the z-direction. This shortens the distance D from the element encapsulation layer 850A to the element main surfaces 31A and 31B of the switching elements 30A and 30B and the driver main surface 41 of the driver 40 in the z-direction. The element encapsulation layer 850A is removed until the distance D becomes, for example, approximately a few hundred μm. As a result, the thickness of the element encapsulation layer 850A becomes equal to the thickness of the element encapsulation layer 50A. Thus, the portion of the element encapsulation layer 850A that covers the element main surfaces 31A and 31B of the switching elements 30A and 30B and the driver main surface 41 of the driver 40 is reduced in thickness.

Figure 15:
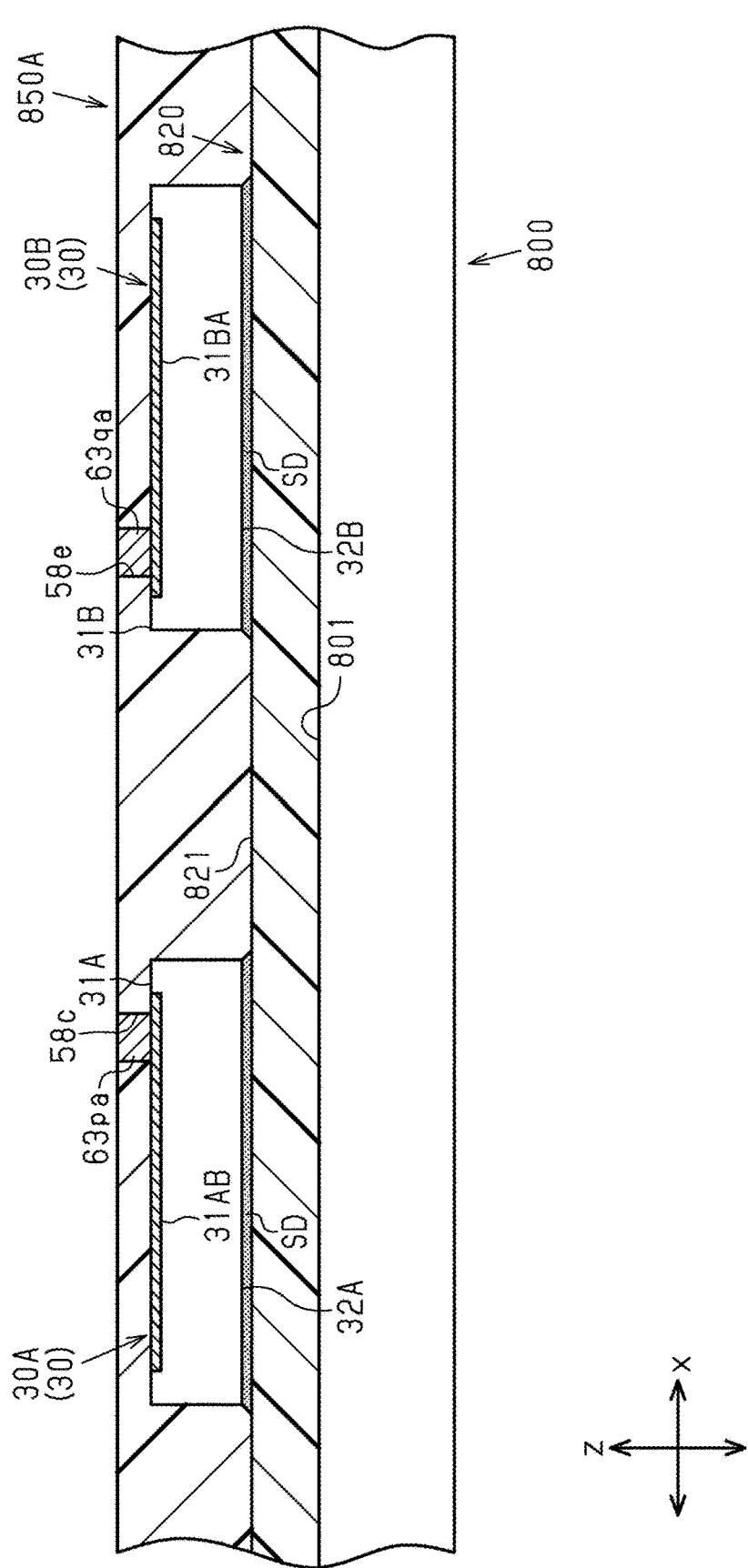
FIG. 15 is a diagram showing an example of a manufacturing step in the method for manufacturing the semiconductor device.
Figure 16:
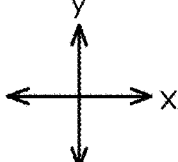
FIG. 16 is a diagram showing an example of a manufacturing step in the method for manufacturing the semiconductor device.
Figure 17:
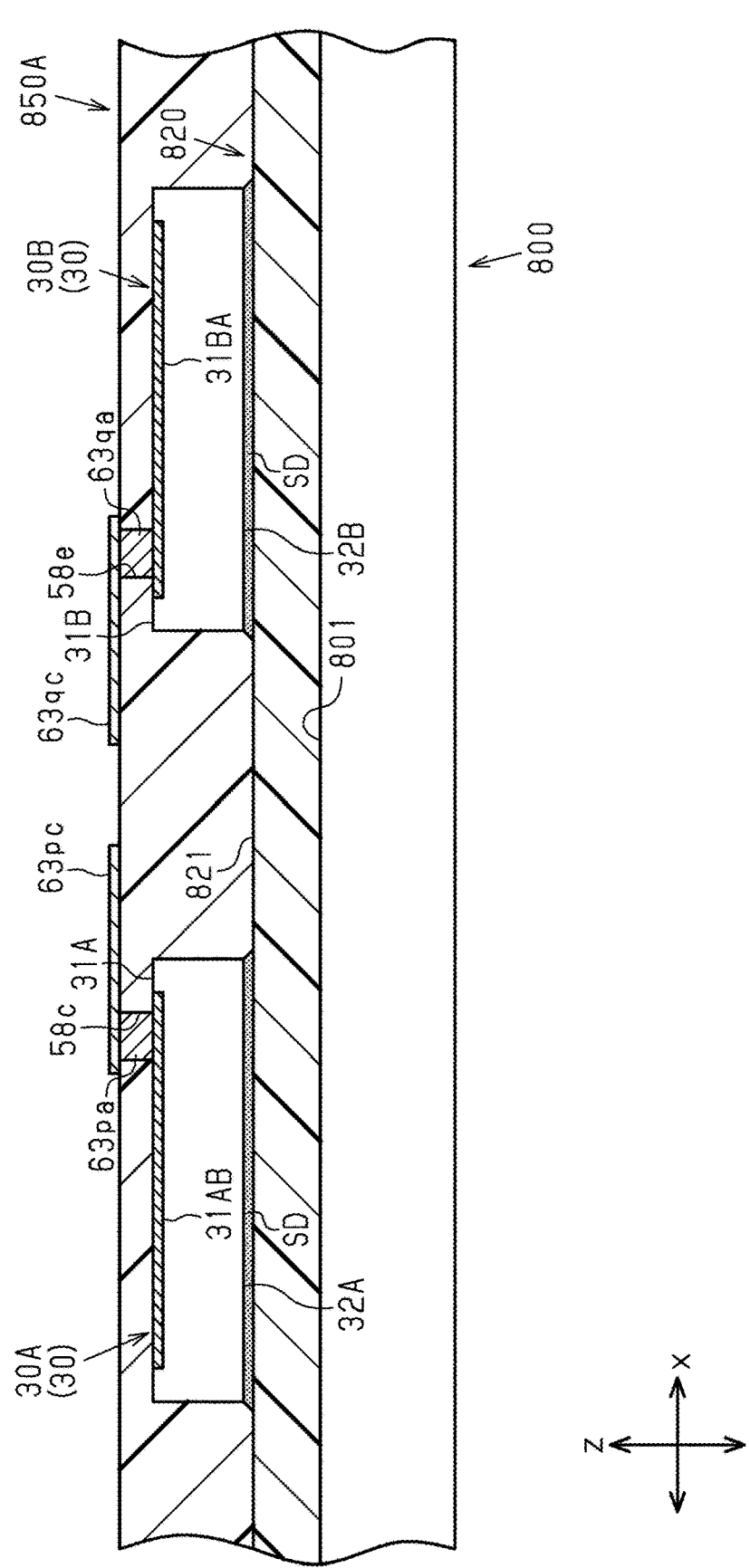
FIG. 17 is a diagram showing an example of a manufacturing step in the method for manufacturing the semiconductor device.
Figure 18:
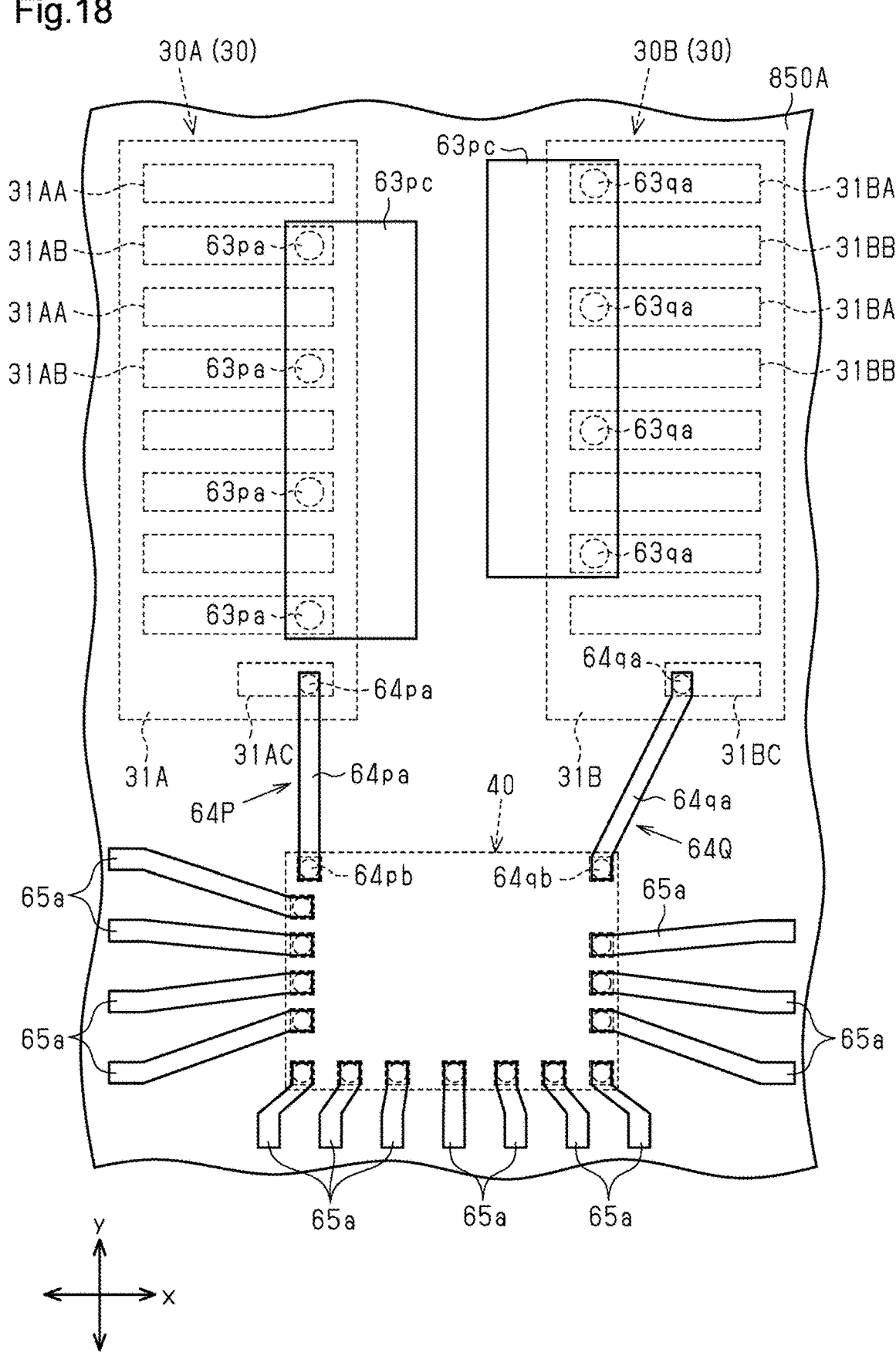
FIG. 18 is a diagram showing an example of a manufacturing step in the method for manufacturing the semiconductor device.

The first via conductor forming step includes a through hole forming step and a first via forming step shown in FIGS. 15 and 16 and a wire forming step shown in FIGS. 17 and 18.

As shown in FIGS. 15 and 16, in the through hole forming step, the through holes 58c, 58e, and 58g to 58k are formed in the element encapsulation layer 850A by, for example, boring such as laser cutting. In FIG. 15, the through hole 58c and the through hole 58e are formed in the element encapsulation layer 850A to expose the second drive pad electrode 31AB of the first switching element 30A and the first drive pad electrode 31BA of the second switching element 30B, respectively, in the z-direction. The through holes 58c and 58e extend in the z-direction through the respective portions of the element encapsulation layer 850A that cover the element main surfaces 31A and 31B of the switching elements 30A and 30B. Thus, the second drive pad electrode 31AB of the first switching element 30A and the first drive pad electrode 31BA of the second switching element 30B are exposed in the z-direction.

As shown in FIG. 16, the through holes 58g to 58k are also formed in the element encapsulation layer 850A. In the same manner as the through holes 58c and 58e, the through holes 58g and 58i extend through the respective portions of the element encapsulation layer 850A that cover the element main surfaces 31A and 31B of the switching elements 30A and 30B in the z-direction. Thus, the control pad electrodes 31AC and 31BC of the switching elements 30A and 30B are exposed in the z-direction. The through holes 58h and 58j and the through holes 58k extend through a portion of the element encapsulation layer 850A that covers the driver main surface 41 of the driver 40 in the z-direction. As a result, the driver pad electrodes 43 of the driver 40 are exposed in the z-direction.

As shown in FIGS. 15 and 16, in the via forming step, metal vias are embedded in the through holes 58c, 58e, and 58g to 58k. More specifically, as shown in FIG. 15, the first element connection via 63pa is embedded in the through hole 58c, and the second element connection via 63qa is embedded in the through hole 58e. More specifically, a seed layer is formed on the element encapsulation layer 850A. The seed layer is formed on the element encapsulation layer 850A through electroless plating. In this case, the seed layer is also formed on wall surfaces defining the through holes 58c and 58e. The seed layer is formed from, for example, Ti. Then, a plated layer is formed on the seed layer. The plated layer is obtained by performing lithography patterning on the seed layer and then performing electrolytic plating that uses the seed layer as a conductive path. The plated layer is formed from Cu. The plated layer is formed to fill the through holes 58c and 58e. Then, the portion of the seed layer that is not covered with the plated layer is removed. In the present embodiment, the seed layer is removed from locations other than the wall surfaces of the through holes 58c and 58e.

As shown in FIG. 16, in the same manner as the element connection vias 63pa and 63qa, a via is embedded in the through hole 58g to form the first element control via 64pa, a via is embedded in the through hole 58i to form the second element control via 64qa, and a via is embedded in the through hole 58h to form the first driver control via 64pb, a via is embedded in the through hole 58j to form the second driver control via 64qb, and vias are embedded in the through holes 58k to form the driver connection vias 65a. In the present embodiment, the element connection vias 63pa and 63qa, the element control vias 64pa and 64qa, the driver control vias 64pb and 64qb, and the driver connection vias 65a are formed at the same time.

As shown in FIGS. 17 and 18, in the wire forming step, the first via connection wire 63pc, the second via connection wire 63qc, the first control connection wire 64pc, the second control connection wire 64qc, and the via connection wires 65c are formed. The wires 63pc, 63qc, 64pc, 64qc, and 65c are formed in the same manner as the element connection vias 63*pa* and 63*qa* in the via forming step. As described above, since the first via connection wire 63*pc*, the second via connection wire 63*qc*, the first control connection wire 64*pc*, the second control connection wire 64*qc*, and the via connection wires 65*c* are formed on the element encapsulation layer 850A, the wires are simultaneously formed in the wire forming step. The wire forming step forms the first control via conductor 64P and the second control via conductor 64Q.

In the present embodiment, the via forming step and the wire forming step are separate steps. Instead, for example, the via forming step and the wire forming step may be performed in the same step. More specifically, the element connection vias 63*pa* and 63*qa*, the element control vias 64*pa* and 64*qa*, the driver control vias 64*pb* and 64*qb*, and the driver connection vias 65*a* may be formed at the same time as the first via connection wire 63*pc*, the second via connection wire 63*qc*, the first control connection wire 64*pc*, the second control connection wire 64*qc*, and the via connection wires 65*c*.

Figure 19:
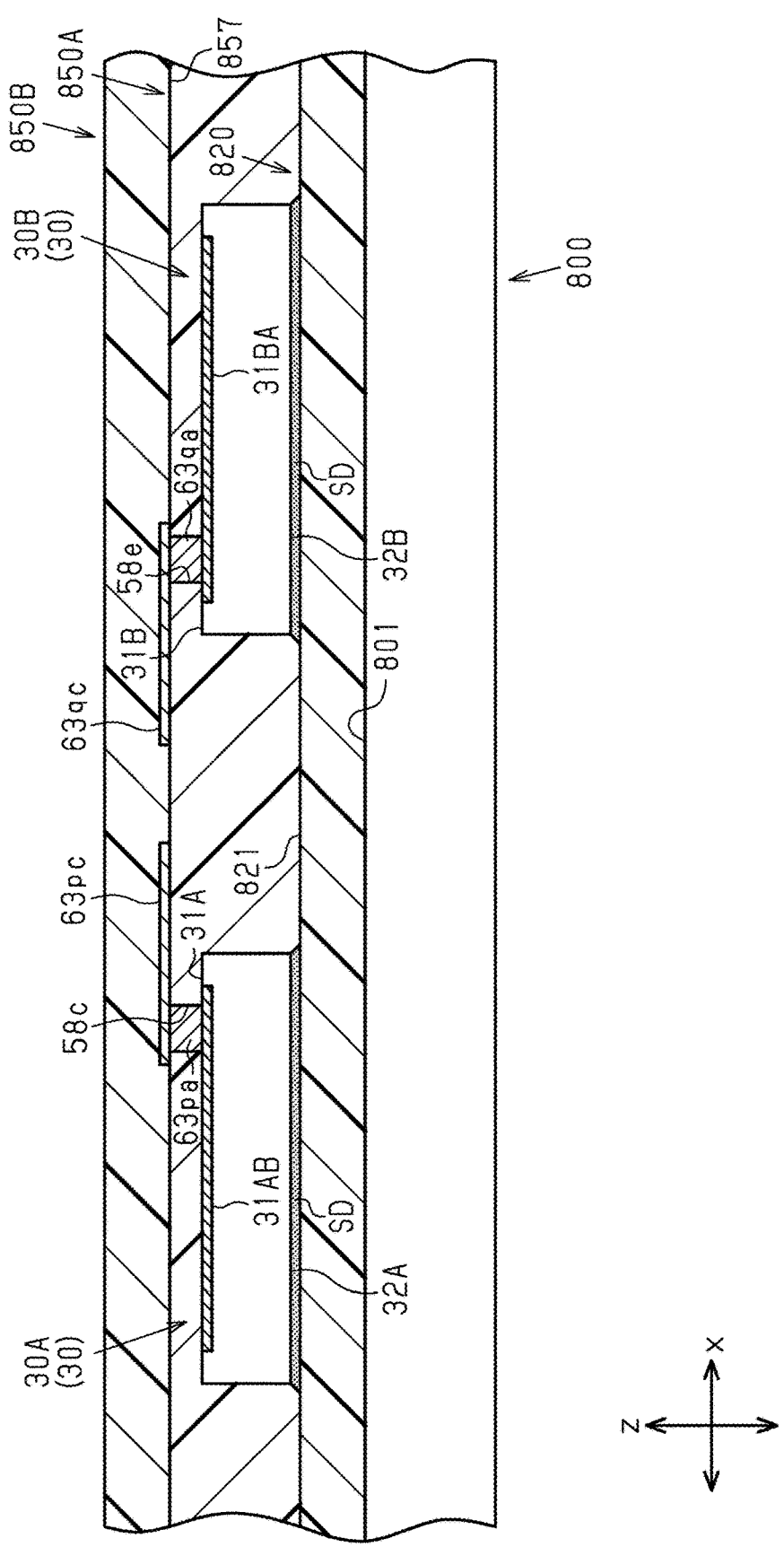
FIG. 19 is a diagram showing an example of a manufacturing step in the method for manufacturing the semiconductor device.

As shown in FIG. 19, in the surface-side resin layer forming step, a surface-side resin layer 850B is formed on the element encapsulation layer 850A. The surface-side resin layer 850B is a layer forming the surface-side resin layer 50B of the semiconductor device 10 and is formed from, for example, a black epoxy resin. In the present embodiment, the surface-side resin layer 850B and the element encapsulation layer 850A are formed from the same material. As viewed in the z-direction, the surface-side resin layer 850B is formed on the entire element encapsulation layer 850A. The surface-side resin layer 850B is formed to encapsulate the first via connection wire 63*pc*, the second via connection wire 63*qc*, the first control connection wire 64*pc*, and the second control connection wire 64*qc*. The surface-side resin layer 850B is formed through, for example, transfer molding or compression molding. As a result, an interface 857 is formed between the element encapsulation layer 850A and the surface-side resin layer 850B in the z-direction. The thickness of the surface-side resin layer 850B is less than the thickness of a portion of the element encapsulation layer 850A that covers the switching elements 30A and 30B and the driver 40. In the present embodiment, the thickness of the surface-side resin layer 850B is greater than the thickness of a portion of the element encapsulation layer 850A that covers the element main surfaces 31A and 31B of the switching elements 30A and 30B.

The surface-side resin layer forming step may include a grinding step. When the surface-side resin layer forming step includes a grinding step, the surface-side resin layer 850B is removed in the z-direction through, for example, mechanical grinding. As a result, the surface-side resin layer 850B is reduced in thickness.

Figure 20:
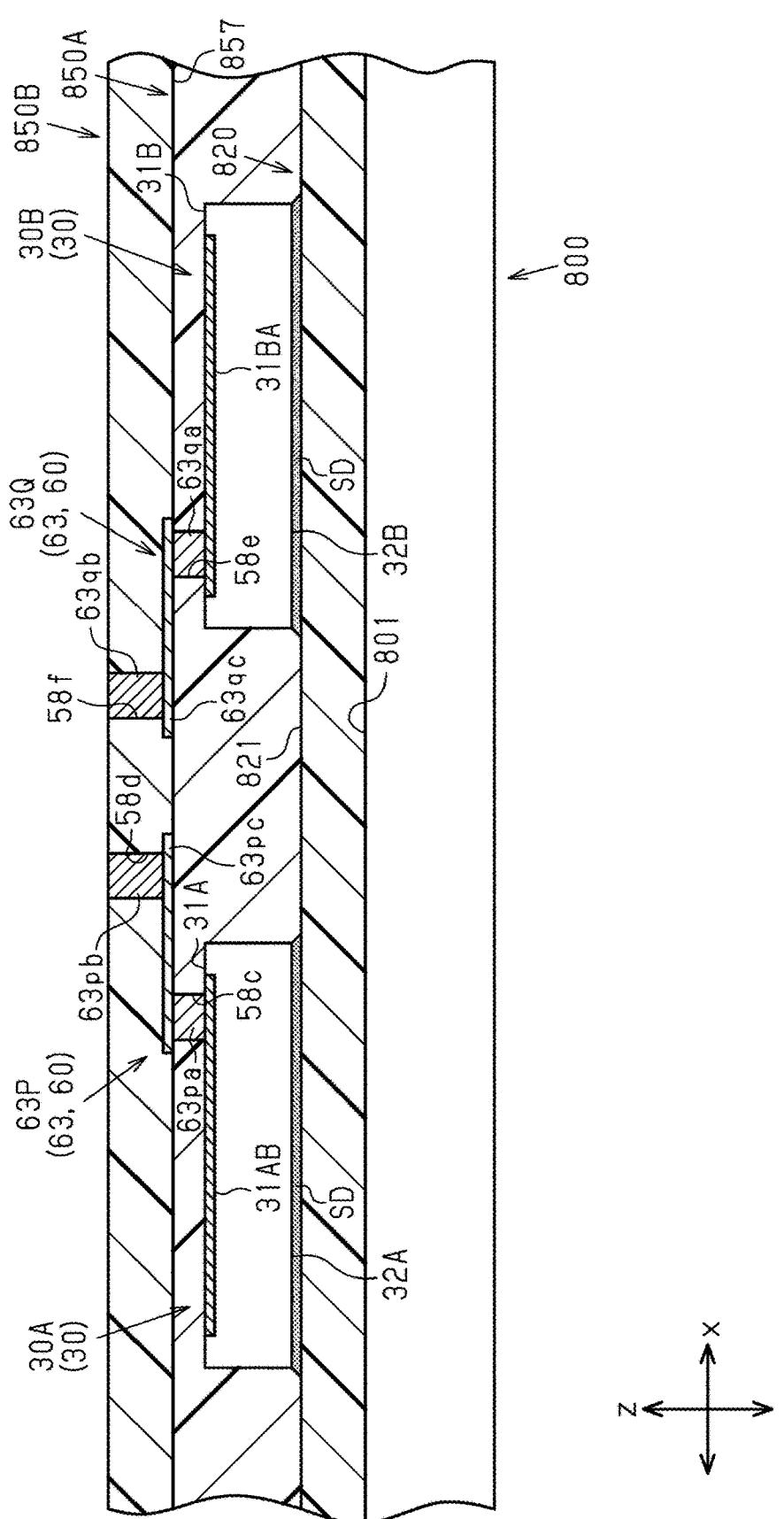
FIG. 20 is a diagram showing an example of a manufacturing step in the method for manufacturing the semiconductor device.
Figure 21:
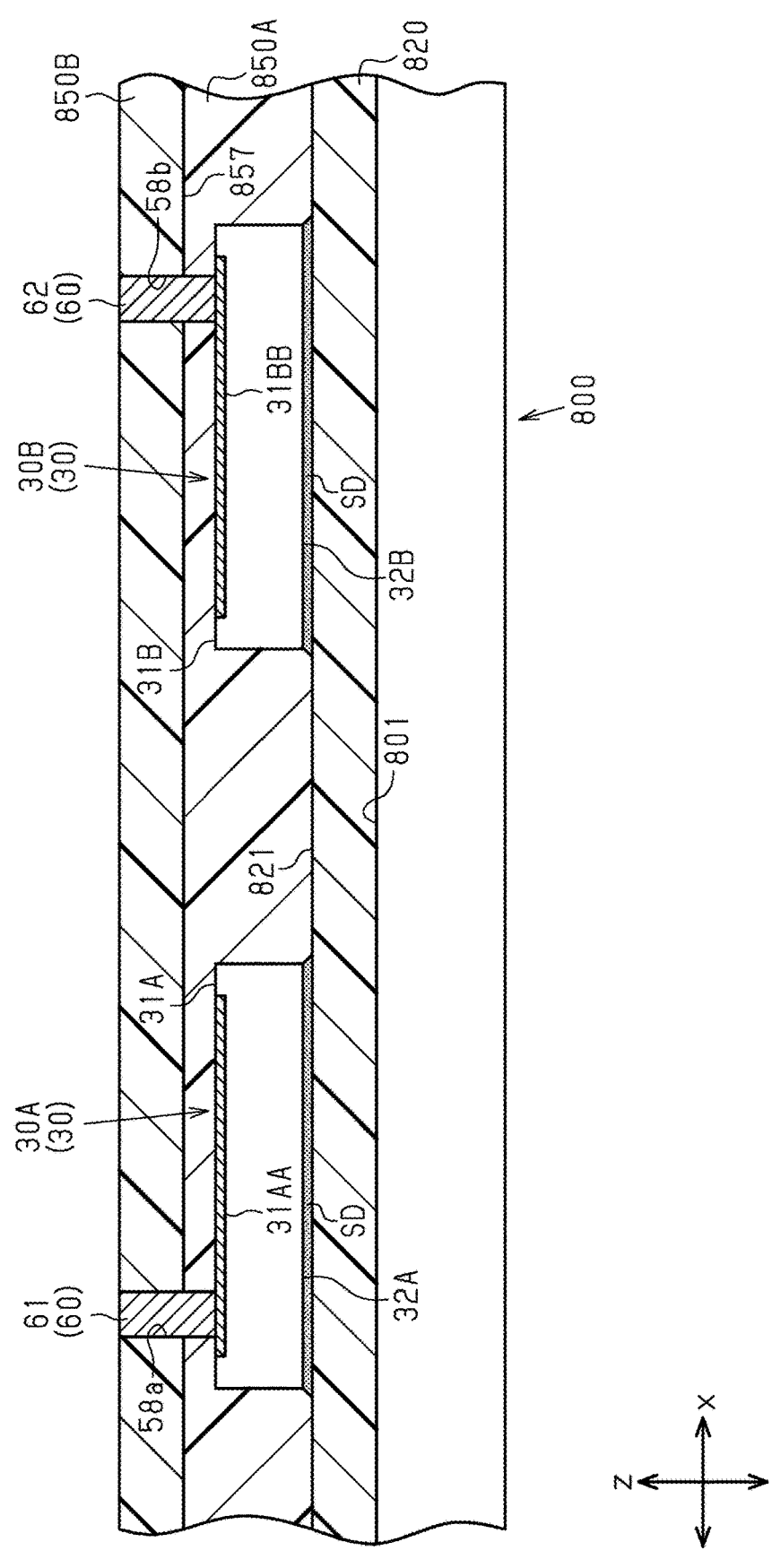
FIG. 21 is a diagram showing an example of a manufacturing step in the method for manufacturing the semiconductor device.
Figure 22:
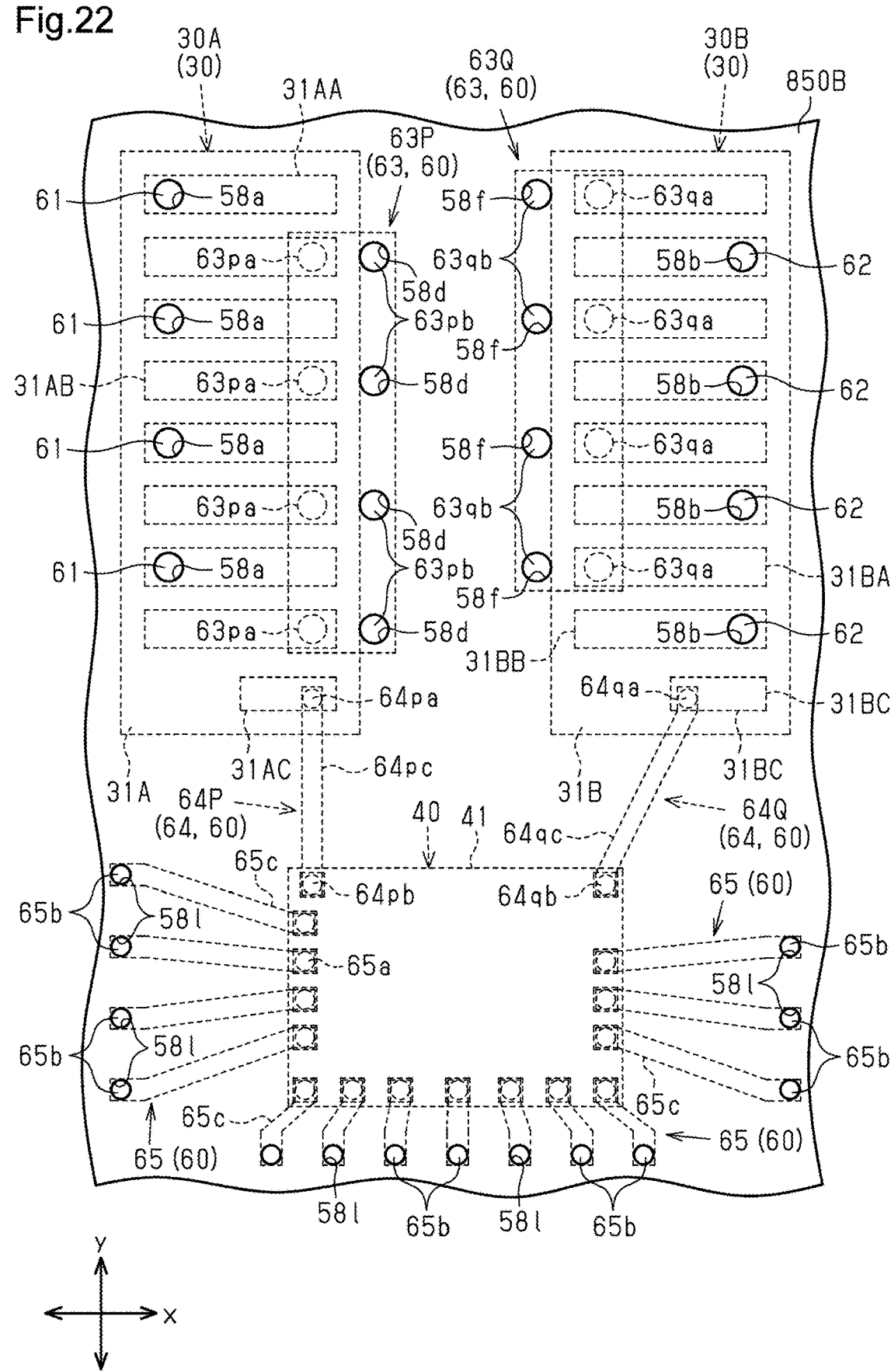
FIG. 22 is a diagram showing an example of a manufacturing step in the method for manufacturing the semiconductor device.

As shown in FIGS. 20 to 22, the second via conductor forming step includes a through hole forming step and a via forming step.

The through hole forming step includes a step of forming the through holes 58*d* and 58*f* shown in FIG. 20, a step of forming the through holes 58*a* and 58*b* shown in FIG. 21, and a step of forming the through hole 58*l* shown in FIG. 22.

As shown in FIGS. 20 and 22, the through holes 58*d*, 58*f*, 58*l* are formed in the surface-side resin layer 850B by, for example, boring such as laser cutting. The through holes 58*d*, 58*f*, and 58*l* extend through only the surface-side resin layer 850B in the z-direction. Thus, as shown in FIG. 20, the first via connection wire 63*pc* is exposed through the through hole 58*d* in the z-direction, and the second via connection wire 63*qc* is exposed through the through hole 58*f* in the z-direction. As shown in FIG. 22, the via connection wires 65*c* are exposed through the through holes 58*l* in the z-direction.

As shown in FIG. 21, the through holes 58*a* and 58*b* are formed in the surface-side resin layer 850B and the element encapsulation layer 850A by, for example, boring such as laser cutting. The through holes 58*a* and 58*b* extend through both the surface-side resin layer 850B and the element encapsulation layer 850A in the z-direction. The through holes 58*a* and 58*b* extend through portions of the element encapsulation layer 850A that cover the switching elements 30A and 30B in the z-direction. As a result, the first drive pad electrodes 31AA of the first switching element 30A are exposed through the through holes 58*a* in the z-direction, and the second drive pad electrodes 31BB of the second switching element 30B are exposed through the through holes 58*b* in the z-direction.

The via forming step includes a step of forming the first electrode connection vias 63*pb* and the second electrode connection via 63*qb* shown in FIG. 20, a step of forming the power supply via conductors 61 and the ground via conductors 62 shown in FIG. 21, and a step of forming the driver electrode connection vias 65*b* shown in FIG. 22.

As shown in FIG. 20, the first electrode connection via 63*pb* is embedded in the through hole 58*d*, and the second electrode connection via 63*qb* is embedded in the through hole 58*f*. As shown in FIG. 21, the power supply via conductor 61 is embedded in the through hole 58*a*, and the ground via conductor 62 is embedded in the through hole 58*b*. As shown in FIG. 22, the driver electrode connection vias 65*b* are embedded in the through holes 58*l*. The process for forming the electrode connection vias 63*pb* and 63*qb*, the power supply via conductors 61, the ground via conductors 62, and the driver electrode connection vias 65*b* is the same as the via forming step of the first via conductor forming step. The second via conductor forming step forms the output via conductors 63 and the driver via conductors 65.

Figure 23:
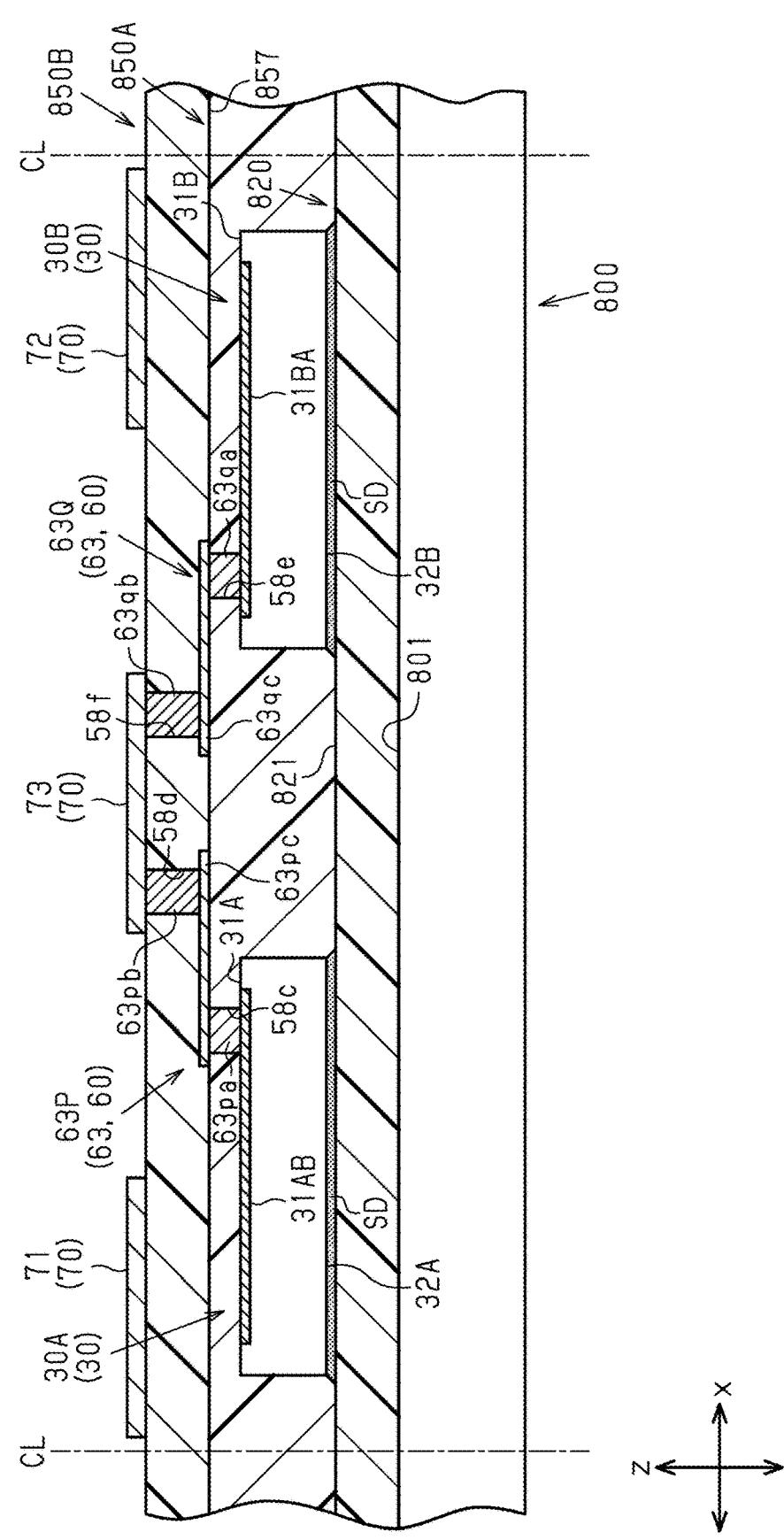
FIG. 23 is a diagram showing an example of a manufacturing step in the method for manufacturing the semiconductor device.
Figure 24:
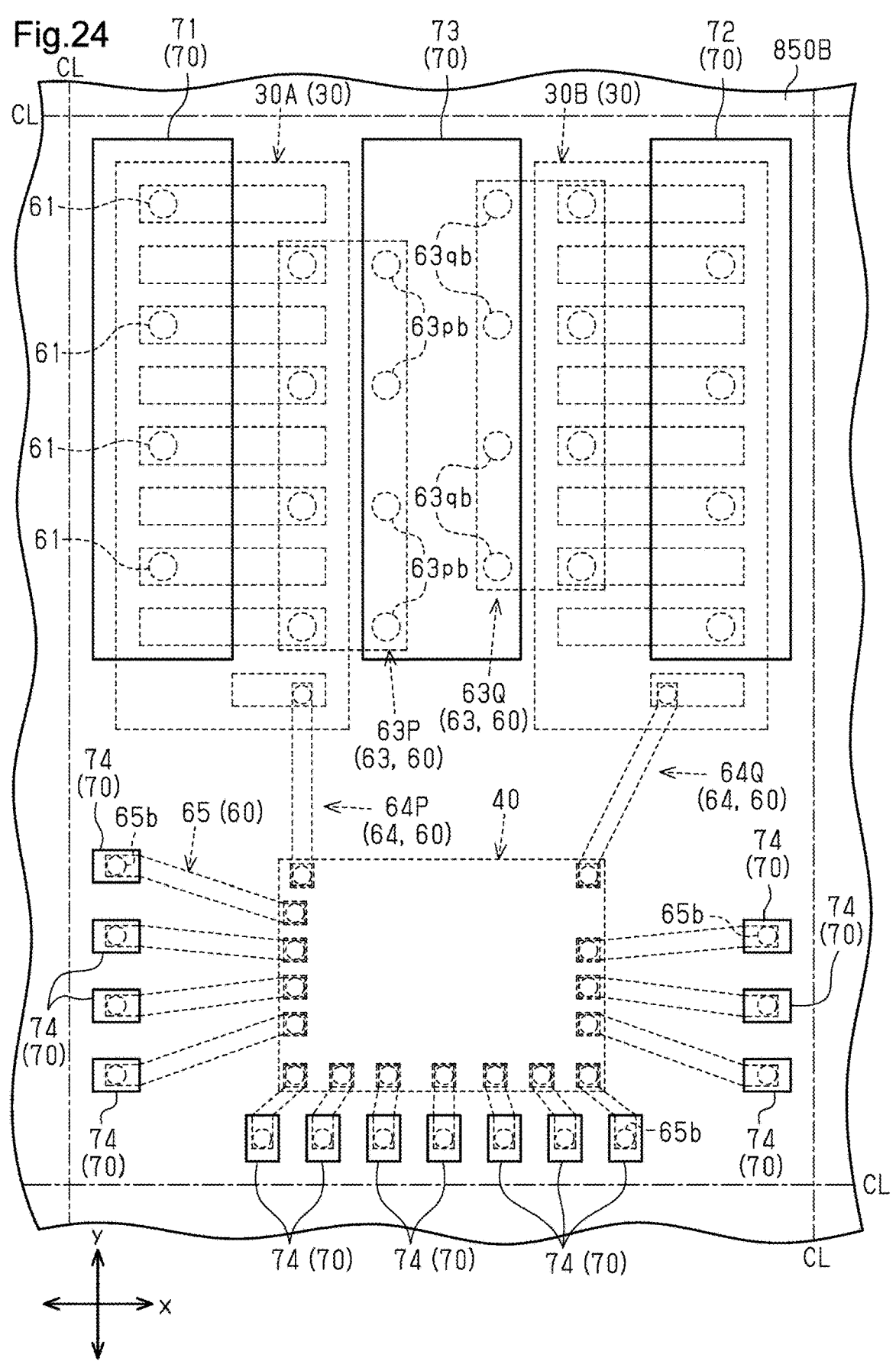
FIG. 24 is a diagram showing an example of a manufacturing step in the method for manufacturing the semiconductor device.

As shown in FIGS. 23 and 24, in the external electrode forming step, a plated layer is formed on the surface of the surface-side resin layer 850B located at the opposite side from the element encapsulation layer 850A in the z-direction. The plated layer includes a Cu layer and a plated layer covering the Cu layer. When forming the Cu layer, a seed layer is formed on the surface of the surface-side resin layer 850B located at the opposite side from the element encapsulation layer 850A in the z-direction through electroless plating. The seed layer is formed from, for example, Cu or Ti. Subsequently, a plated layer is formed through electrolytic plating that uses the seed layer as a conductive path. The plated layer is formed from Cu. The plated layer that covers the Cu layer is formed by, for example, depositing Ni, Pd, and Au in this order through electroless plating. As shown in FIG. 24, the plated layer includes a power supply plated layer covering the power supply via conductors 61, a ground plated layer covering the ground via conductors 62, an output plated layer covering the first electrode connection vias 63*pb* and the second electrode connection vias 63*qb*, and driver electrode connection plated layers separately covering the driver electrode connection vias 65*b*. The power supply plated layer forms the power supply electrode 71 as an external electrode 70. The ground plated layer forms the ground electrode 72 as an external electrode 70. The output plated layer forms the output electrode 73 as an external electrode 70. The driver electrode connection plated layers form the driver connection electrodes 74.

As shown in FIGS. 23 and 24, in the cutting step, first, the support substrate 800 is separated from the base member 820. In an example, the support substrate 800 is separated from the base member 820 by mechanical grinding or debonding. Then, a dicing tape (not shown) is applied to support the base member 820. Subsequently, the surface-side resin layer 850B, the element encapsulation layer 850A, and the base member 820 are cut in this order, for example, using a dicing blade along the cut lines CL indicated by the single-dashed lines shown in FIGS. 23 and 24. As a result, the element encapsulation layer 850A is formed from the element encapsulation layer 50A, and the surface-side resin layer 850B is formed from the surface-side resin layer 50B. That is, the resin layer 50 is formed. The support layer 20 is formed from the base member 820. The steps described above manufacture the semiconductor device 10.

Operation

Figure 25:
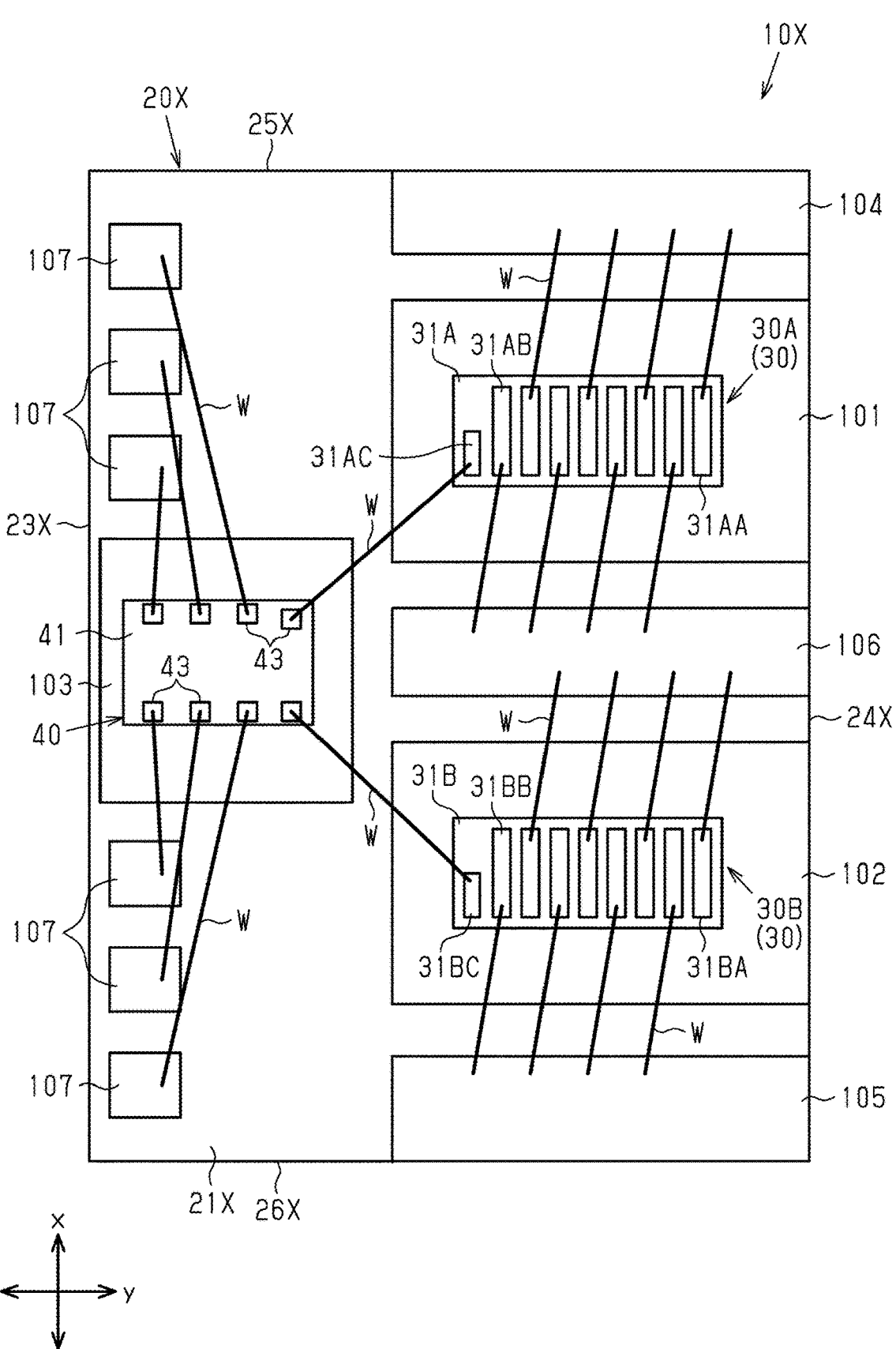
FIG. 25 is a plan view showing a substrate of a comparative example of a semiconductor device on which switching elements and a driver are mounted.
Figure 26:
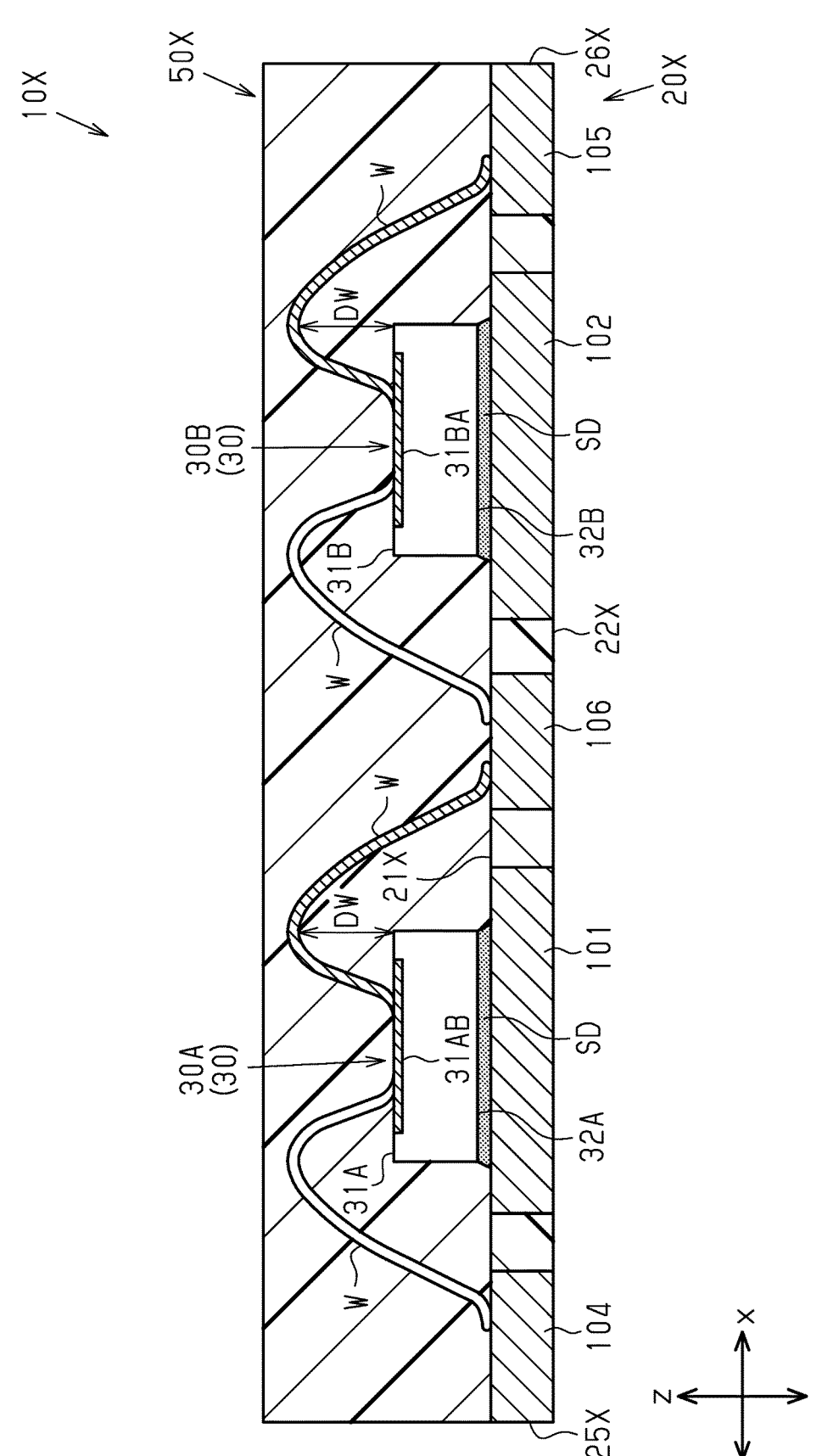
FIG. 26 is a schematic cross-sectional view showing the semiconductor device of the comparative example.

The operation of the semiconductor device 10 according to the present embodiment will now be described with reference to FIGS. 5, 25, and 26. FIG. 25 is a schematic plan view showing the internal structure of a comparative example of a semiconductor device 10X. FIG. 26 is a schematic cross-sectional view showing a cross-sectional structure of the semiconductor device 10X of the comparative example.

As shown in FIG. 25, in the same manner as the semiconductor device 10 of the present embodiment, the semiconductor device 10X of the comparative example includes a support layer 20X, a first switching element 30A, a second switching element 30B, a driver 40, and a resin layer 50X. The switching elements 30A and 30B and the driver 40 are mounted on metal support plates 101 to 103 disposed on the support layer 20X. Each of the support plates 101 to 103 is exposed from both a support main surface 21X and a support back surface 22X (refer to FIG. 26) of the support layer 20X.

Further, a power supply wire 104, a ground wire 105, an output wire 106, and driver connection wires 107 are disposed on the support layer 20X. In the same manner as the support plates 101 to 103, the wires 104 to 107 are exposed from the support back surface 22X (refer to FIG. 26) of the support layer 20X.

The support plate 101 supporting the first switching element 30A, the support plate 102 supporting the second switching element 30B, the power supply wire 104, the ground wire 105, and the output wire 106 are aligned with each other in the y-direction and spaced apart from each other in the x-direction. The output wire 106 is disposed between the support plate 101 and the support plate 102 in the x-direction. The output wire 106 is disposed in the center of the support layer 20X in the x-direction. The power supply wire 104 is disposed closer to a support side surface 25X than the support plate 101. The ground wire 105 is disposed closer to a support side surface 26X than the support plate 102. As described above, the support plates 101 and 102 are coplanar with the wires 104 to 107.

The support plate 103 supporting the driver 40 is disposed in the center of the support layer 20X in the x-direction. The support plate 103 is disposed closer to a support side surface 23X than the support plates 101 and 102 in the y-direction. In other words, the support plates 101 and 102 are disposed closer to a support side surface 24X than the support plate 103 in the y-direction. A plurality of driver connection wires 107 is disposed on the support layer 20X at a position located closer to the support side surface 25X than the driver 40 in the x-direction. A plurality of driver connection wires 107 is disposed on the support layer 20X at a position located closer to the support side surface 26X than the driver

40 in the x-direction. The driver connection wires 107 are disposed on one of the two ends of the support layer 20X located closer to the support side surface 23X in the y-direction.

As shown in FIG. 25, the first switching element 30A, the power supply wire 104, the output wire 106, and the driver 40 are electrically connected by wires W. More specifically, the first drive pad electrodes 31AA of the first switching element 30A are connected to the power supply wire 104 by wires W. The second drive pad electrodes 31AB of the first switching element 30A are connected to the output wire 106 by wires W. The control pad electrode 31AC of the first switching element 30A is connected to a driver pad electrode 43 of the driver 40 by a wire W.

The second switching element 30B, the ground wire 105, the output wire 106, and the driver 40 are electrically connected by wires W. More specifically, the first drive pad electrodes 31BA of the second switching element 30B are connected to the output wire 106 by wires W. The second drive pad electrodes 31BB of the second switching element 30B are connected to the ground wire 105 by wires W. The control pad electrode 31BC of the second switching element 30B is connected to a driver pad electrode 43 of the drivers 40 by a wire W.

In addition, the driver pad electrodes 43 of the driver 40 are separately connected to the driver connection wires 107 by wires W.

The wires W are formed by wire bonding using a wire bonding machine. In an example, the wire bonding machine bonds a wire base material to the second drive pad electrodes 31AB of the first switching element 30A. Then, the wire bonding machine moves the wire base material so that the wire base material extends away from the second drive pad electrode 31AB in the z-direction and toward the output wire 106. Then, the wire bonding machine bonds the wire base material to the output wire 106 and then cuts the wire base material. This forms a wire W. Thus, as shown in FIG. 26, the wire W connecting the second drive pad electrode 31AB and the output wire 106 is curved and bulged from the first element main surface 31A toward the opposite side from the support layer 20X in the z-direction. The other wires W are shaped in the same manner.

As described above, the curved and bulged shape of the wire W increases the maximum value DW of the distance from the element main surfaces 31A and 31B of the switching elements 30A and 30B to the wire W in the z-direction. The maximum value DW is greater than the dimension of the switching elements 30A and 30B in the z-direction (the thicknesses of the switching elements 30A and 30B) and is, for example, 1 mm or greater. This increases the length of the wires W connected to the switching elements 30A and 30B.

The via conductors 60 and the external electrodes 70 are formed in the same process and the same device as those in a step performed prior to the semiconductor manufacturing process (step of forming semiconductor element). The wire W is formed in a step performed subsequent to the semiconductor manufacturing process (step of packaging semiconductor element). Therefore, the wire W has a relatively large measurement error as compared to when the via conductors 60 and the external electrodes 70 are formed. More specifically, for example, the positional accuracy is low when the wire W is connected to the second drive pad electrode 31AB of the first switching element 30A and when the wire W connected to the second drive pad electrode 31AB is connected to the output wire 106. This results in increases in the variations in the length of the wire W. Also, for example, the positional accuracy is low when the wire W is connected to the first drive pad electrode 31BA of the second switching element 30B and when the wire W connected to the first drive pad electrode 31BA is connected to the output wire 106. This results in increases in variations in the length of the wire W. Therefore, variations in the length of the wire W need to be taken into consideration, and the length of the wire W needs to be increased. Due to such restrictions, the wire W has a length of a few mm (for example, 3 mm or greater and 5 mm or less).

Parasitic inductance of the wires W connecting the control pad electrodes 31AC and 31BC to the driver pad electrodes 43 contributes to surge contained in the gate voltage supplied to the control pad electrodes 31AC and 31BC of the switching elements 30A and 30B. The parasitic inductance will increase as the wire W becomes longer. In other words, as the wires W connecting the control pad electrodes 31AC and 31BC to the driver pad electrodes 43 become longer, the surge contained in the gate voltage may be increased.

The surge is proportional to a change rate of the gate voltage. Hence, the surge is increased as the switching elements 30A and 30B are activated and deactivated at a higher rate. Therefore, when each of the switching elements 30A and 30B is a switching element that is not activated and deactivated at a high frequency such as an insulated gate bipolar transistor (IGBT) or a bipolar transistor, the surge will not be excessively increased in the gate voltage. This reduces the effect of the surge in the gate voltage on the activation and deactivation of the switching elements 30A and 30B. In contrast, when each of the switching elements 30A and 30B is a switching element that is activated and deactivated at a high frequency such as a GaN HEMT or a SiC MOSFET, the surge may be excessively increased in the gate voltage. This increases the effect of the surge in the gate voltage on the activation and deactivation of the switching elements 30A and 30B. In an example, when a switching element is activated and deactivated at a high frequency such as a GaN HEMT, activation and deactivation of the switching elements 30A and 30B may be greatly affected by inductance of a few nH caused by the wire W.

From the viewpoint of reducing the surge contained in the gate voltage, the inductance caused by the conductive path between the control pad electrodes 31AC and 31BC and the driver pad electrodes 43 needs to be decreased. In particular, when a switching element is activated and deactivated at a high frequency such as GaN HEMT, it is preferred that inductance caused by each conductive path from the control pad electrodes 31AC and 31BC to the driver pad electrodes 43 of the driver 40 is less than 1 nH.

In this regard, in the present embodiment, the drive pad electrodes 31AA, 31AB, 31BA, and 31BB of the switching elements 30A and 30B are connected to the external electrodes 70 by the power supply via conductors 61, the ground via conductors 62, and the output via conductors 63. The control pad electrodes 31AC and 31BC of the switching elements 30A and 30B are connected to the driver pad electrodes 43 of the driver 40 by the element control via conductors 64. The driver pad electrodes 43 of the driver 40 are connected to the external electrodes 70 by the driver via conductors 65.

Since the via conductors 61 to 65 are formed in the same process as a process performed prior to the semiconductor manufacturing process, the via conductors 61 to 65 are formed with a high dimensional accuracy. Specifically, when the via conductors 61 to 65 are bonded to the pad electrodes 31AA to 31AC, 31BA to 31BC, and 43 and the external electrodes 70, the dimensional accuracy is one-tenth or less than the dimensional accuracy of when the wires W are bonded to the pad electrodes 31AA to 31AC, 31BA to 31BC, and 43 and the external electrodes 70. This allows for deceases in the length of the via conductors 61 to 65, thereby reducing inductances caused by the length of the via conductors 61 to 65.

In addition, each of the power supply via conductors 61, the ground via conductors 62, the element connection vias 63pa and 63qa and the electrode connection vias 63pb and 63qb of the output via conductors 63, the element control vias 64pa and 64qa and the driver control vias 64pb and 64qb of the element control via conductors 64, and the driver connection vias 65a and the driver electrode connection vias 65b of the driver via conductors 65 has a cross-sectional area that is taken along a plane (xy-plane) orthogonal to the z-direction that is larger than the cross-sectional area of the wires W taken along a plane orthogonal to the length-wise direction of the wire W. Therefore, each of the via conductors 61 and 62 and the vias 63pa, 63qa, 63pb, 63qb, 64pa, 64qa, 65a, and 65b has a smaller inductance than the wire W.

As viewed in the z-direction, the power supply electrode 71 is disposed to overlap the first switching element 30A. The power supply via conductors 61 are disposed to overlap the power supply electrode 71 and the first drive pad electrodes 31AA of the first switching element 30A and connect the power supply electrode 71 and the first drive pad electrodes 31AA. The ground electrode 72 is disposed to overlap the second switching element 30B. The ground via conductors 62 are disposed to overlap the ground electrode 72 and the second drive pad electrodes 31BB of the second switching element 30B and connect the ground electrode 72 and the second drive pad electrodes 31BB. Thus, the power supply via conductors 61 and the ground via conductors 62 extend in the z-direction and thus are further shortened. As a result, the inductance caused by the length of each of the via conductors 61 and 62 is reduced.

The maximum value DW of the wire W is greater than the dimension of the power supply via conductors 61 and the ground via conductors 62 in the z-direction. Thus, the dimension of the power supply via conductor 61 in the z-direction is sufficiently less than the length of the wire W connecting the first drive pad electrode 31AA and the power supply wire 104. The dimension of the ground via conductor 62 in the z-direction is sufficiently less than the length of the wire W connecting the second drive pad electrode 31BB and the ground wire 105. This further reduces the inductance caused by the length of the conductive path between the first drive pad electrode 31AA and the power supply electrode 71 and the inductance caused by the length of the conductive path between the second drive pad electrode 31BB and the ground electrode 72.

Advantages

The semiconductor device 10 of the present embodiment has the following advantages.

(1) The semiconductor device 10 includes the first switching element 30A, the second switching element 30B, the driver 40, the resin layer 50 that encapsulates the switching elements 30A and 30B and the driver 40, the power supply electrode 71 and the ground electrode 72 that are formed on the resin main surface 51 of the resin layer 50 as the external electrodes 70 and at least partially overlap the switching elements 30A and 30B, and the power supply via conductors 61 and the ground via conductors 62 that extend through the resin layer 50 in the z-direction as the via conductors 60 and electrically connect the switching elements 30A and 30B to the external electrodes 70.

In this structure, the power supply via conductors 61 and the ground via conductors 62 extend through the resin layer 50 in the z-direction to electrically connect the switching elements 30A and 30B to the power supply electrode 71 and the ground electrode 72, which serve as the external electrodes 70. This shortens the conductive path between the first switching element 30A and the power supply electrode 71 and the conductive path between the second switching element 30B and the ground electrode 72 as compared to a structure in which the switching elements 30A and 30B are connected to the power supply wire 104 and the ground wire 105, serving as the external electrodes, by the wires W formed by wire bonding. As a result, the inductance caused by the length of the conductive path is reduced.

As viewed in the z-direction, at least a portion of the power supply electrode 71 is disposed to overlap the first switching element 30A, and at least a portion of the ground electrode 72 is disposed to overlap the second switching element 30B. Thus, the size of the semiconductor device 10 is reduced in a direction orthogonal to the z-direction.

(2) For example, when the external electrodes 70 are formed on the support back surface 22 of the support layer 20, the via conductors extend in the z-direction from the element main surfaces 31A and 31B of the switching elements 30A and 30B and then to positions at which the via conductors do not overlap the switching elements 30A and 30B in the z-direction and extend to the support back surface 22 through the resin layer 50 and the support layer 20 in the z-direction. As described above, the via conductors are configured to extend from the element main surfaces 31A and 31B of the switching elements 30A and 30B in one direction in the z-direction and then extend in the other direction in the z-direction. This increases the length of the via conductors. As a result, the length of the conductive paths from the switching elements 30A and 30B to the external electrodes 70 is increased.

In this regard, in the present embodiment, the semiconductor device 10 includes the support layer 20 that supports the switching elements 30A and 30B and the driver 40. The resin layer 50 is formed on the support layer 20. The external electrode 70 is formed on the surface (resin main surface 51) of the resin layer 50 located at the opposite side from the support layer 20 in the z-direction. Thus, the via conductors 60 are configured to extend from the element main surfaces 31A and 31B of the switching elements 30A and 30B toward the resin main surface 51 in one direction in the z-direction. This decreases the length of the via conductors 60. As a result, the length of the conductive paths from the switching elements 30A and 30B to the external electrodes 70 is decreased.

(3) The power supply via conductors 61 extend in the z-direction and are disposed to overlap the power supply electrode 71 and the first switching element 30A as viewed in the z-direction. The ground via conductors 62 extend in the z-direction and are disposed to overlap the ground electrode 72 and the second switching element 30B as viewed in the z-direction.

In this structure, the power supply electrode 71 and the first drive pad electrodes 31AA of the first switching element 30A are connected by the power supply via conductors 61 extending in the z-direction. This shortens the conductive path between the power supply electrode 71 and the first drive pad electrode 31AA as compared to a structure in which the power supply via conductors 61 are, for example, crank-shaped. Also, the ground electrode 72 and the second drive pad electrodes 31BB of the second switching element 30B are connected by the ground via conductors 62 extending in the z-direction. This shortens the conductive path between the ground electrode 72 and the second drive pad electrode 31BB as compared to a structure in which the ground via conductors 62 are, for example, crank-shaped. As a result, the inductance caused by the length of the conductive path is reduced.

(4) The semiconductor device 10 includes the output electrode 73, which serves as the external electrode 70, and the output via conductors 63, which electrically connect the output electrode 73 to the switching elements 30A and 30B. As viewed in the z-direction, the output electrode 73 is disposed between the first switching element 30A and the second switching element 30B in the x-direction.

This structure shortens the conductive path between the first switching element 30A and the output electrode 73 and the conductive path between the second switching element 30B and the output electrode 73. As a result, the inductance caused by the conductive path is reduced.

(5) The first output via conductor 63P and the second output via conductor 63Q, which serve as the output via conductors 63, are crank-shaped. In this structure, the first switching element 30A is connected to the output electrode 73 in a simple manner, and the second switching element 30B is connected to the output electrode 73 in a simple manner.

(8) The first output via conductor 63P and the second output via conductor 63Q are spaced apart from each other in the x-direction. In this structure, the first output via conductor 63P and the second output via conductor 63Q are not directly electrically connected to each other and, instead, are indirectly electrically connected by the output electrode 73. This avoids a situation in which a current directly flows from the second drive pad electrodes 31AB of the first switching element 30A to the first drive pad electrodes 31BA of the second switching element 30B.

(7) The resin layer 50 includes the element encapsulation layer 50A, which encapsulates the switching elements 30A and 30B, and the surface-side resin layer 50B, which is formed on the element encapsulation layer 50A. The first output via conductor 63P includes the first element connection via 63pa electrically connected to the first switching element 30A, the first electrode connection via 63pb connected to the output electrode 73, and the via connection wire 63pc connecting the first element connection via 63pa and the first electrode connection via 63pb. The second output via conductor 63Q includes the second element connection via 63qa electrically connected to the second switching element 30B, the second electrode connection via 63qb connected to the output electrode 73, and the second via connection wire 63qc connecting the second element connection via 63qa and the second electrode connection via 63qb. The element connection vias 63pa and 63qa extend through the element encapsulation layer 50A in the z-direction. The electrode connection vias 63pb and 63qb extend through the surface-side resin layer 50B in the z-direction. The via connection wires 63pc and 63qc are disposed on the element encapsulation layer 50A. In this structure, the crank-shaped output via conductors 63P and 63Q are readily formed.

(8) The semiconductor device 10 includes the element control via conductors 64, which electrically connect the switching elements 30A and 30B to the driver 40. The element control via conductors 64 are embedded in the resin layer 50.

This structure shortens the conductive path between the first switching element 30A and the driver 40 and the conductive path between the second switching element 30B and the driver 40 as compared to a structure in which the switching elements 30A and 30B and the driver 40 are connected by the wires W. As a result, the inductance caused by the length of the conductive path is reduced.

(9) The first control via conductor 64P includes the first driver control via 64*pb* electrically connected to the driver 40, the first element control via 64*pa* connected to the control pad electrode 31AC of the first switching element 30A, and the first control connection wire 64*pc* connecting the first driver control via 64*pb* and the first element control via 64*pa*. The second control via conductor 64Q includes the second driver control via 64*qb* electrically connected to the driver 40, the second element control via 64*qa* connected to the control pad electrode 31BC of the second switching element 30B, and the second control connection wire 64*qc* connecting the second driver control via 64*qb* and the second element control via 64*qa*. The driver control vias 64*pb* and 64*qb* extend through a portion of the element encapsulation layer 50A that covers the driver main surface 41 of the driver 40 in the z-direction. The element control vias 64*pa* and 64*qa* respectively extend through portions of the element encapsulation layer 50A that cover the control pad electrode 31AC and 31BC of the switching elements 30A and 30B in the z-direction. The control connection wires 64*pc* and 64*qc* are disposed on the element encapsulation layer 50A. With this structure, the control via conductors 64P and 64Q are readily formed.

(10) The semiconductor device 10 includes the driver via conductors 65, which electrically connect the driver connection electrodes 74 and the driver 40. The driver via conductors 65 are disposed in the resin layer 50. This structure shortens the conductive path between the driver connection electrode 74 and the driver 40 as compared to a structure in which the driver connection electrode 74 and the driver 40 are connected by the wire W.

(11) The driver via conductor 65 is crank-shaped. In this structure, the driver pad electrode 43 of the driver 40 is connected to the driver connection electrode 74 in a simple manner.

(12) The first element connection vias 63*pa* of the first output via conductor 63P are disposed to join the second drive pad electrodes 31AB of the first switching element 30A to the interface 57 between the element encapsulation layer 50A and the surface-side resin layer 50B. The second element connection vias 63*qa* of the second output via conductor 63Q are disposed to join the first drive pad electrodes 31BA of the second switching element 30B to the interface 57.

With this structure, in the method for manufacturing the semiconductor device 10, the thickness of a portion of the element encapsulation layer 50A that covers the element main surfaces 31A and 31B of the switching elements 30A and 30B is decreased. The element connection vias 63*pa* and 63*qa* extend through the above-described portion of the element encapsulation layer 50A. This shortens the element connection vias 63*pa* and 63*qa*.

(13) The first element control via 64*pa* of the first control via conductor 64P is disposed to join the control pad electrode 31AC of the first switching element 30A to the interface 57 between the element encapsulation layer 50A and the surface-side resin layer 50B. The first driver control via 64*pb* is disposed to join the driver pad electrode 43 of the driver 40 to the interface 57. The second element control via 64*qa* of the second control via conductors 64Q is disposed to join the control pad electrode 31BC of the second switching element 30B to the interface 57. The second driver control via 64*qb* is disposed to join the driver pad electrode 43 of the driver 40 to the interface 57.

With this structure, in the method for manufacturing the semiconductor device 10, the thickness of portions of the element encapsulation layer 50A that cover the element main surfaces 31A and 31B of the switching elements 30A and 30B and the driver main surface 41 of the driver 40 is decreased. The element control vias 64*pa* and 64*qa* and the driver control vias 64*pb* and 64*qb* extend through the above-described portions of the element encapsulation layer 50A. This shortens the element control vias 64*pa* and 64*qa* and the driver control vias 64*pb* and 64*qb*.

(14) The driver connection vias 65*a* of the driver via conductors 65 are disposed to join the driver pad electrodes 43 of the driver 40 to the interface 57 between the element encapsulation layer 50A and the surface-side resin layer 50B. With this structure, in the method for manufacturing the semiconductor device 10, the thickness of a portion of the element encapsulation layer 50A that covers the driver main surface 41 of the driver 40 is decreased. The driver connection vias 65*a* extend through the above-described portion of the element encapsulation layer 50A. This shortens the driver connection vias 65*a*.

(15) A plurality of power supply via conductors 61 is provided. This structure reduces the inductance in the conductive paths from the first drive pad electrodes 31AA of the first switching element 30A to the power supply electrode 71.

(16) A plurality of ground via conductors 62 is provided. This structure reduces the inductance in the conductive path from the second drive pad electrodes 31BB of the second switching element 30B to the ground electrode 72.

(17) The output via conductors 63P and 63Q include a plurality of element connection vias 63*pa* and 63*qa*, respectively. This structure reduces inductance in the conductive path between the second drive pad electrodes 31AB of the first switching element 30A and the first via connection wire 63*pc* and the inductance in the conductive path between the first drive pad electrodes 31BA of the second switching element 30B and the second via connection wire 63*qc*.

(18) The output via conductors 63P and 63Q include a plurality of electrode connection vias 63*pb* and 63*qb*, respectively. This structure reduces the inductance in the conductive path between the first via connection wire 63*pc* and the output electrode 73 and the inductance in the conductive path between the second via connection wire 63*qc* and the output electrode 73.

(19) The via connection wires 63*pc* and 63*qc*, the control connection wires 64*pc* and 64*qc*, and the via connection wires 65*c* are disposed on the element encapsulation layer 50A. This structure allows the wires 63*pc*, 63qc, 64pc, 64qc, 65c to be formed in the same step. Thus, the manufacturing step of the semiconductor device 10 is simplified.

(20) The method for manufacturing the semiconductor device 10 includes a step of forming the element encapsulation layer 850A that encapsulates the switching elements 30A and 30B, a step of forming the surface-side resin layer 850B on the element encapsulation layer 850A, a step of forming the through holes 58a and 58b extending through the element encapsulation layer 850A and the surface-side resin layer 850B so as to expose the switching elements 30A and 30B, a step of embedding the power supply via conductors 61 in the through holes 58a and the ground via conductors 62 in the through holes 58b, and a step of forming the power supply electrode 71 and the ground electrode 72 on the surface-side resin layer 850B. This structure obtains the same advantage as the advantage (1) described above.

(21) The method for manufacturing the semiconductor device 10 includes the grinding step that removes the element encapsulation layer 850A in the z-direction. With this configuration, the thickness of the portions of the element encapsulation layer 850A that cover the element main surfaces 31A and 31B of the switching elements 30A and 30B in the z-direction is reduced as compared to the thickness of the portions of the element encapsulation layer 850A that cover the element main surfaces 31A and 31B in the z-direction with a configuration that does not perform the grinding step. In addition, the portion of the element encapsulation layer 850A that covers the driver main surface 41 of the driver 40 in the z-direction is reduced in thickness as compared to the portion of the element encapsulation layer 850A that covers the driver main surface 41 in the z-direction with a configuration that does not perform the grinding step. The element connection vias 63pa and 63qa and the element control vias 64pa and 64qa extend through a portion of the element encapsulation layer 850A that covers the element main surfaces 31A and 31B in the z-direction. The driver control vias 64pb and 64qb and the driver connection vias 65a extend through a portion of the element encapsulation layer 850A that covers the driver main surface 41 in the z-direction. This shortens the distance from each of the switching elements 30A and 30B to the via connection wires 63pc and 63qc and the control connection wires 64pc and 64qc in the z-direction and the distance from the driver 40 to the control connection wires 64pc and 64qc and the via connection wires 65c in the z-direction. As a result, the conductive path from the second drive pad electrodes 31AB of the first switching element 30A to the first via connection wire 63pc is shortened. The conductive path from the first drive pad electrodes 31BA of the second switching element 30B to the second via connection wire 63qc is shortened. The conductive path between the control pad electrode 31AC of the first switching element 30A and the first control connection wires 64pc is shortened. The conductive path between the control pad electrodes 31BC of the second switching element 30B and the second control connection wire 64qc is shortened. The conductive path between the driver pad electrode 43 of the driver 40 and the via connection wire 65c is shortened.

MODIFIED EXAMPLES

The embodiment exemplifies, without any intention to limit, an applicable form of a semiconductor device according to the present disclosure. The semiconductor device according to the present disclosure may be applicable to forms differing from the above embodiment. In an example of such a form, the structure of the above embodiment is partially replaced, changed, or omitted, or a further structure is added to the above embodiment. The modified examples described below may be combined with one another as long as there is no technical inconsistency. In the modified examples, the same reference characters are given to those components that are the same as the corresponding components of the above embodiment. Such components will not be described in detail.

In the above embodiment, the semiconductor device 10 includes two switching elements 30, namely, the first switching element 30A and the second switching element 30B. Alternatively, for example, as shown in FIGS. 27 to 30, the semiconductor device 10 may include one switching element 30. For the sake of convenience, FIG. 27 does not show the resin layer 50. For the sake of convenience, FIG. 28 does not show the surface-side resin layer 50B. In the semiconductor device 10 of the modified example shown in FIGS. 27 to 30, the driver 40 corresponds to a specified element.

Figure 27:
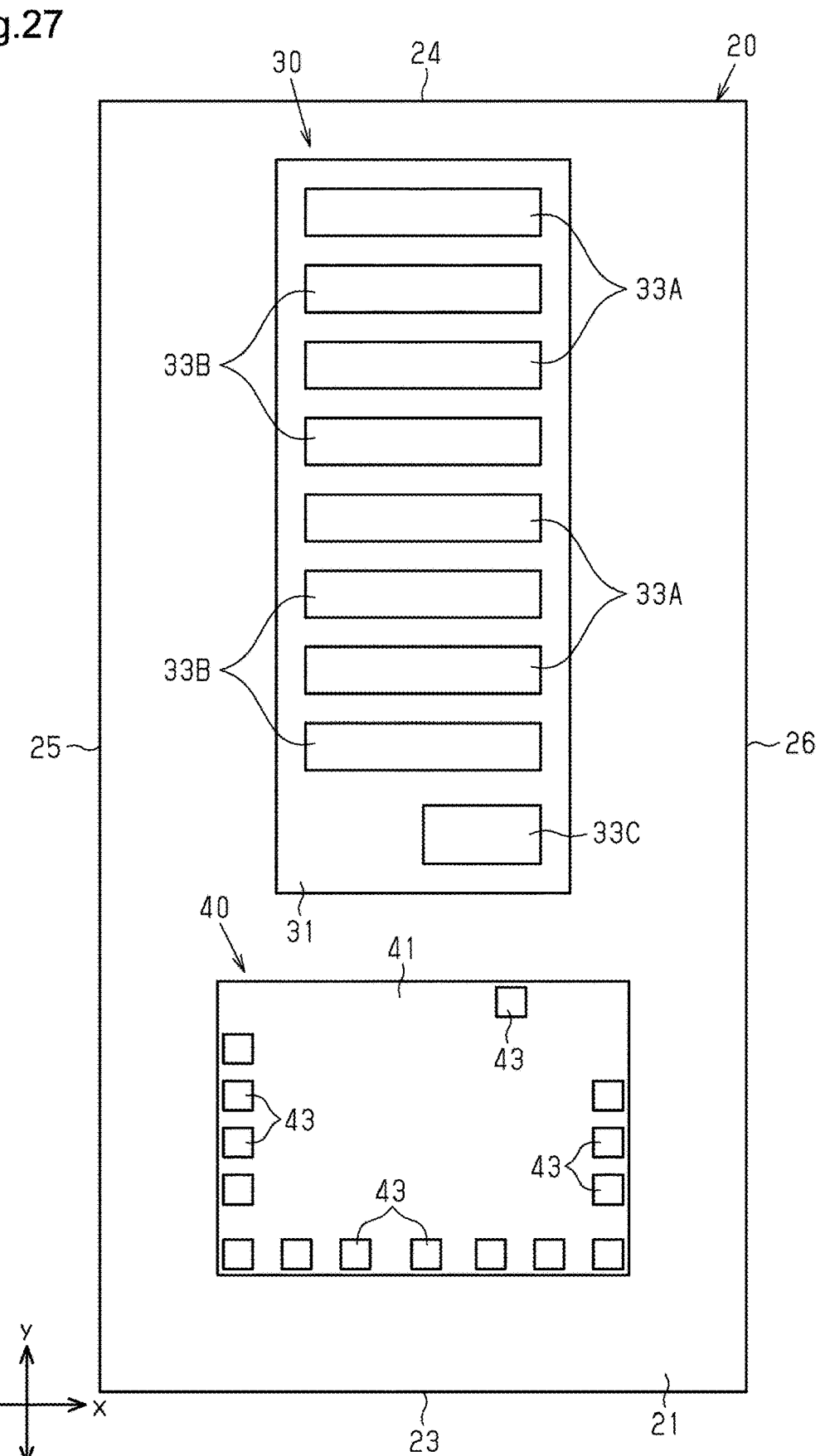
FIG. 27 is a plan view showing a substrate of a modified example of a semiconductor device on which a switching element and a driver are mounted.

FIG. 27 shows a modified example in which the number of switching elements is reduced. Accordingly, the modified example of the semiconductor device 10 shown in FIGS. 27 to 30 is reduced in size in the x-direction as compared to the semiconductor device 10 of the embodiment.

A switching element 30 is disposed on the support main surface 21 of the support layer 20 in the center in the x-direction at a position closer to the support side surface 24 than to the support side surface 23 in the y-direction. The switching element 30 includes, for example, a GaN HEMT in the same manner as the above embodiment. As viewed in the z-direction, the switching element 30 is rectangular and has a long-side direction and a short-side direction. In the illustrated example, the switching element 30 is disposed on the support main surface 21 so that the long sides extend in the y-direction and the short sides extend in the x-direction.

The switching element 30 includes an element main surface 31 on which a first drive pad electrode 33A, a second drive pad electrode 33B, and a control pad electrode 33C are formed. In the illustrated example, the first drive pad electrode 33A forms a drain electrode. The second drive pad electrode 33B forms a source electrode. The control pad electrode 33C forms a gate electrode. The electrodes 33A to 33C are arranged in the same manner as the first drive pad electrodes 31AA, the second drive pad electrodes 31AB, and the control pad electrode 31AC of the first switching element 30A in the embodiment.

The driver 40 is mounted on the support main surface 21. In other words, the driver 40 is coplanar with the switching element 30. The driver 40 is disposed on the support main surface 21 in the center in the x-direction at a position closer to the support side surface 23 than the switching element 30 in the y-direction.

Figure 29:
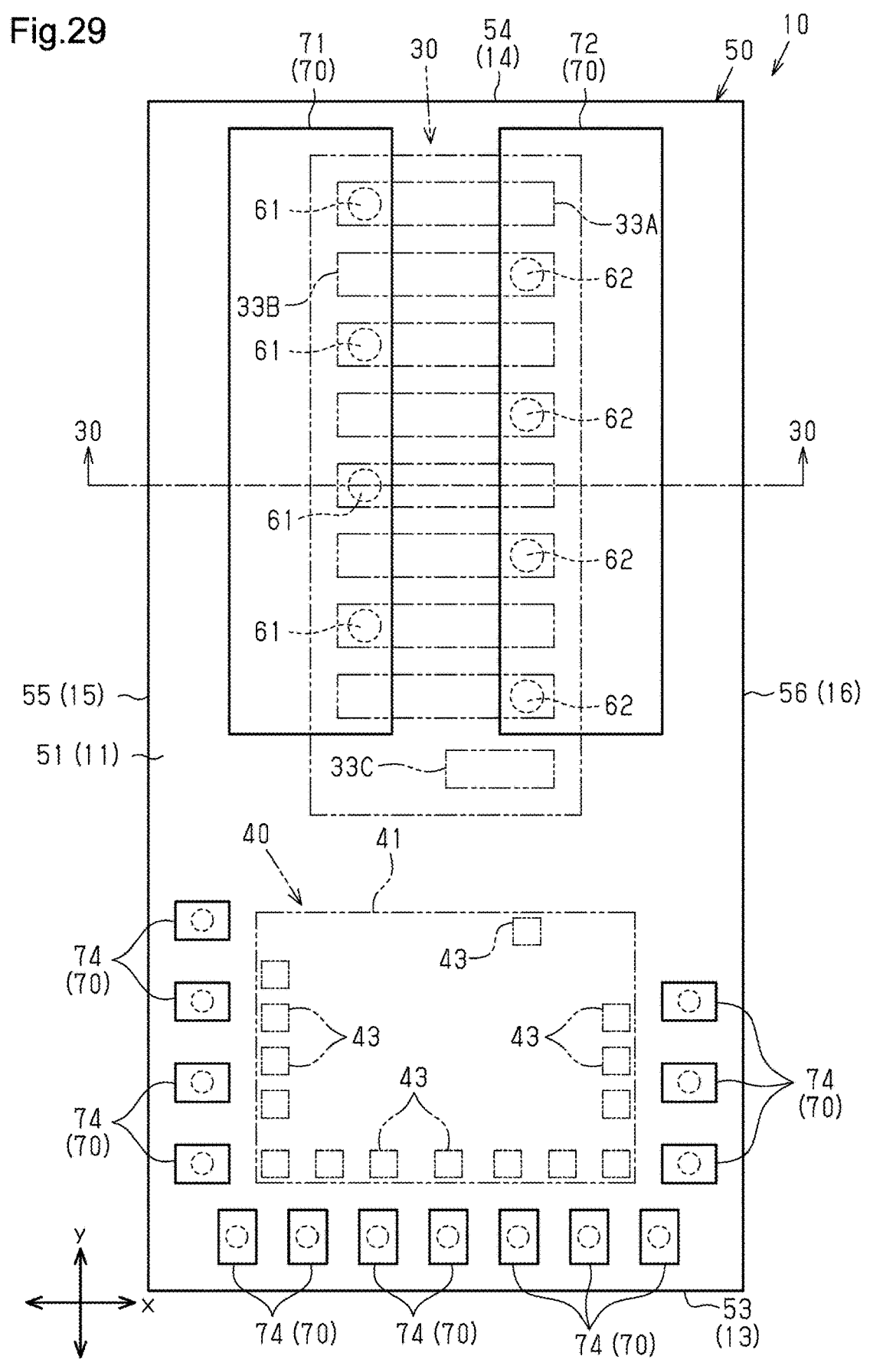

As shown in FIG. 29, a power supply electrode 71, a ground electrode 72, and driver connection electrodes 74 are formed as external electrodes 70 on the resin main surface 51 of the element encapsulation layer 50A. The plated layer of the external electrodes 70 in the illustrated example has the same structure as the plated layer of the external electrodes 70 in the embodiment. The external electrodes 70 in the illustrated example do not include the output electrode 73 of the embodiment.

As shown in FIG. 29, the power supply electrode 71 and the ground electrode 72 are aligned with each other in the y-direction and spaced apart from each other in the x-direction. As viewed in the z-direction, the power supply electrode 71 and the ground electrode 72 are disposed to overlap the switching element 30. As viewed in the z-direction, the power supply electrode 71 includes an extension extending out from the switching element 30 in the x-direction. As viewed in the z-direction, the extension of the power supply electrode 71 extends from the switching element 30 toward the device side surface 15. The ground electrode 72 includes an extension extending out of the switching element 30 in the x-direction. As viewed in the z-direction, the extension of the ground electrode 72 extends from the switching element 30 toward the device side surface 16.

In the same manner as the embodiment, as viewed in the z-direction, the power supply via conductors 61 are disposed to overlap the power supply electrode 71 and the first drive pad electrodes 33A of the switching element 30 and connect the power supply electrode 71 and the first drive pad electrodes 33A.

Figure 30:
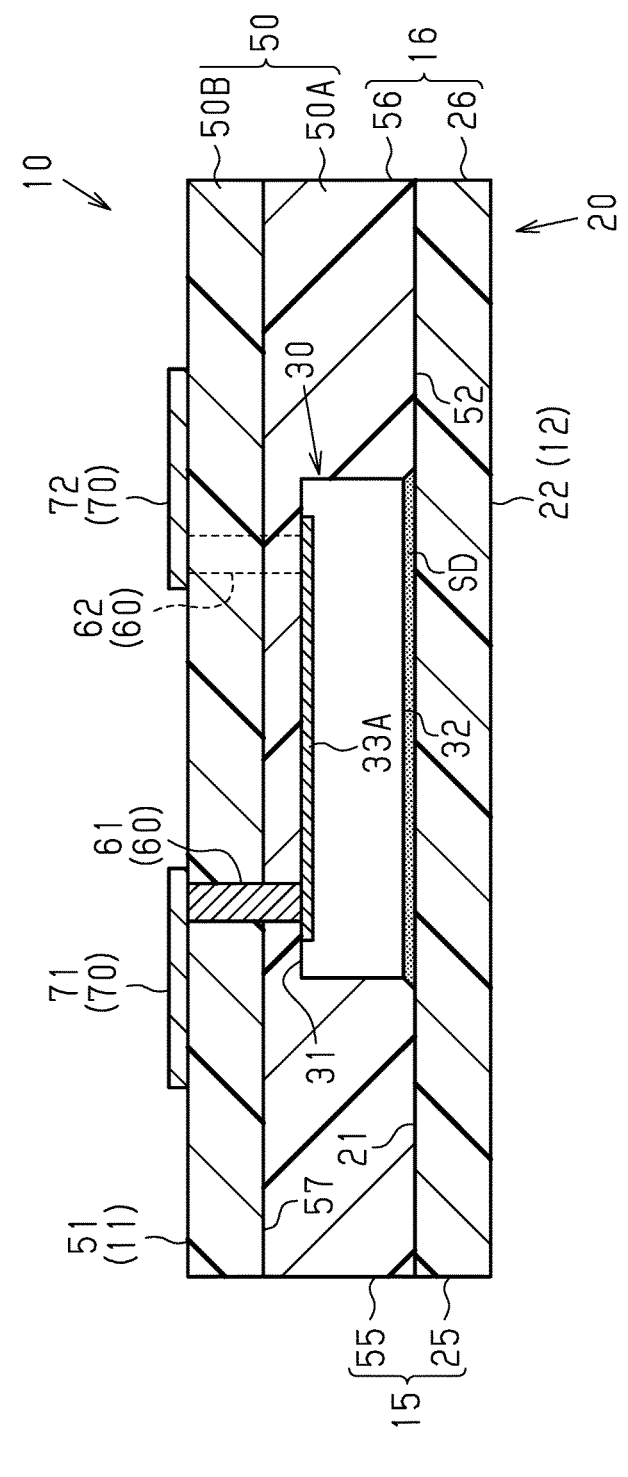
FIG. 30 is a cross-sectional view of the semiconductor device taken along line 30-30 in FIG. 29.
Figure 30:
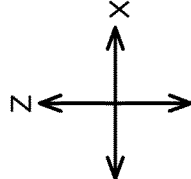

As shown in FIG. 30, the power supply via conductor 61 extends in the z-direction. More specifically, in the same manner as the embodiment, the power supply via conductor 61 extends through the surface-side resin layer 50B and a portion of the element encapsulation layer 50A that covers the element main surface 31 of the switching element 30 in the z-direction.

As shown in FIG. 29, in the same manner as the embodiment, as viewed in the z-direction, the ground via conductors 62 are disposed to overlap the ground electrode 72 and the second drive pad electrodes 33B of the switching element 30 and connect the ground electrode 72 and the second drive pad electrodes 33B.

As shown in FIG. 30, the ground via conductor 62 extends in the z-direction. More specifically, in the same manner as the embodiment, the ground via conductor 62 extends through the surface-side resin layer 50B and a portion of the element encapsulation layer 50A that covers the element main surface 31 of the switching element 30 in the z-direction.

Figure 28:
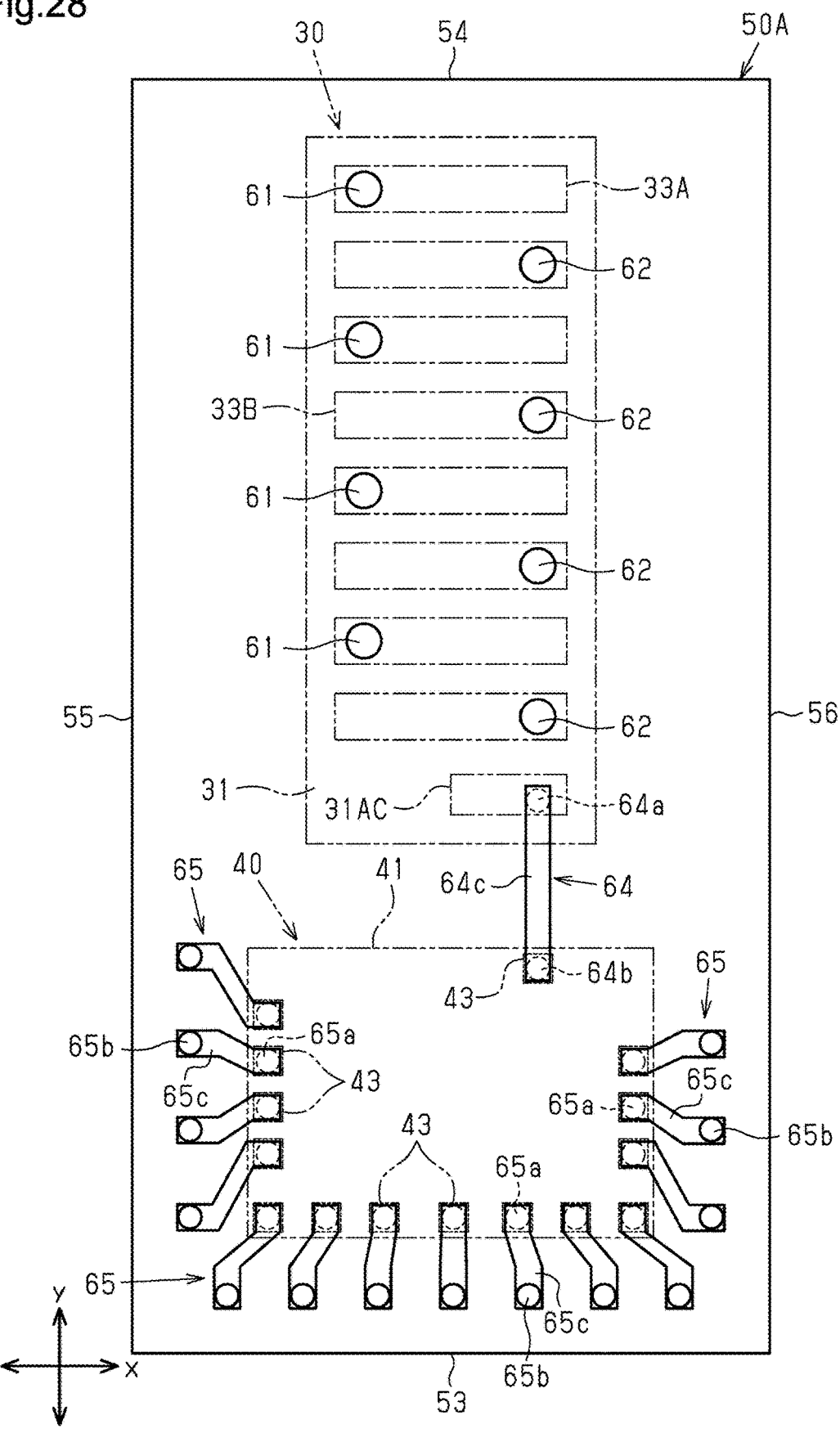
FIG. 28 is a plan view showing an element encapsulation layer of a resin layer in the semiconductor device of the modified example.

As shown in FIG. 28, the semiconductor device 10 includes an element control via conductor 64. The element control via conductor 64 connects the control pad electrode 33C of the switching element 30 to the driver pad electrode 43 of the driver 40. The element control via conductor 64 includes an element control via 64a, a driver control via 64b, and a control connection wire 64c.

As viewed in the z-direction, the element control via 64a is disposed to overlap the control pad electrode 33C and extends through a portion of the element encapsulation layer 50A that covers the element main surface 31 of the switching element 30 in the z-direction.

As viewed in the z-direction, the driver control via 64b is disposed to overlap the driver pad electrode 43 of the driver 40 and extends through a portion of the element encapsulation layer 50A that covers the driver main surface 41 of the driver 40 in the z-direction. The driver pad electrode 43 connected to the driver control via 64b is disposed on one of the two ends of the driver main surface 41 in the y-direction located closer to the switching element 30 at a position facing the control pad electrode 33C in the y-direction.

The control connection wire 64c is a wire connecting the element control via 64a and the driver control via 64b and is formed on the element encapsulation layer 50A. As viewed in the z-direction, the control connection wire 64c is strip-shaped and extends in the y-direction. As viewed in the z-direction, one of the two ends of the control connection wire 64c in the y-direction located closer to the switching element 30 is disposed to overlap the element control via

64a. As viewed in the z-direction, one of the two ends of the control connection wire 64c in the y-direction located closer to the driver 40 is disposed to overlap the driver control via 64b. In other words, as viewed in the z-direction, the element control via 64a is disposed to overlap the control pad electrode 33C and the control connection wire 64c. In other words, as viewed in the z-direction, the driver control via 64b is disposed to overlap the driver pad electrode 43 and the control connection wire 64c.

As shown in FIG. 28, the driver via conductors 65 connecting the driver pad electrodes 43 of the driver 40 to the driver connection electrodes 74 have the same structure as the driver via conductors 65 of the embodiment. However, in the illustrated example, the positional relationship between the driver pad electrodes 43 and the driver connection electrodes 74 is different from the positional relationship between the driver pad electrodes 43 and the driver connection electrodes 74 of the embodiment. Hence, the shape of the via connection wires 65c as viewed in the z-direction is different from the shape of the via connection wires 65c of the embodiment.

The method for manufacturing the semiconductor device 10 of the modified example shown in FIGS. 27 to 30 is generally the same as that of the above embodiment. Specifically, the method for manufacturing the semiconductor device 10 in the modified example mainly includes a support layer forming step, an element mounting step, an element encapsulation layer forming step, a first via conductor forming step, a surface-side resin layer forming step, a second via conductor forming step, an external electrode forming step, and a cutting step. The support layer forming step is the same as the support layer forming step of the embodiment.

The element mounting step differs in that the switching element 30 is mounted on the base member 820 instead of the switching elements 30A and 30B. The method of mounting the switching element 30 is the same as the element mounting step of the embodiment. The element encapsulation layer forming step is the same as the element encapsulation layer forming step of the embodiment.

In the first via conductor forming step, the element control via 64a, the driver control via 64b, the control connection wire 64c, the driver connection vias 65a, and the via connection wires 65c are formed. In other words, the element connection vias 63pa and 63qa, the via connection wires 63pc and 63qc, the element control vias 64pa and 64qa, the driver control vias 64pb and 64qb, and the control connection wires 64pc and 64qc are not formed in the first via conductor forming step. In an example, the element control via 64a is formed in the same process as the first element control via 64pa of the embodiment. In an example, the driver control via 64b is formed in the same process as the first driver control via 64pb of the embodiment. In an example, the control connection wire 64c is formed in the same process as the first control connection wire 64pc of the embodiment. The driver connection vias 65a are formed in the same process as the driver connection vias 65a of the embodiment. The via connection wires 65c are formed in the same process as the via connection wires 65c of the embodiment. In addition, the surface-side resin layer forming step is the same as the surface-side resin layer forming step of the embodiment.

In the second via conductor forming step, the power supply via conductors 61, the ground via conductors 62, and the driver electrode connection vias 65b are formed. In other words, the electrode connection vias 63pb and 63qb are not formed in the second via conductor forming step. The power supply via conductors 61, the ground via conductors 62, and the driver electrode connection vias 65b are formed in the same process as the power supply via conductors 61, the ground via conductors 62, and the driver electrode connection vias 65b of the embodiment.

The external electrode forming step differs from the external electrode forming step of the embodiment in that the output electrode 73 is not formed. The power supply electrode 71, the ground electrode 72, and the driver connection electrodes 74 are formed in the same process as those of the embodiment. The cutting step is the same as the cutting step of the embodiment.

In the embodiment, the driver 40 may be omitted. In an example, as shown in FIGS. 31 to 34, the semiconductor device 10 includes a first switching element 30A and a second switching element 30B. The first switching element 30A and the second switching element 30B have the same arrangement relationship as those in the embodiment. For the sake of convenience, FIG. 31 does not show the resin layer 50. For the sake of convenience, FIG. 32 does not show the surface-side resin layer 50B. In the semiconductor device 10 of the modified example shown in FIGS. 31 to 34, the second switching element 30B correspond to a specified element.

Figure 31:
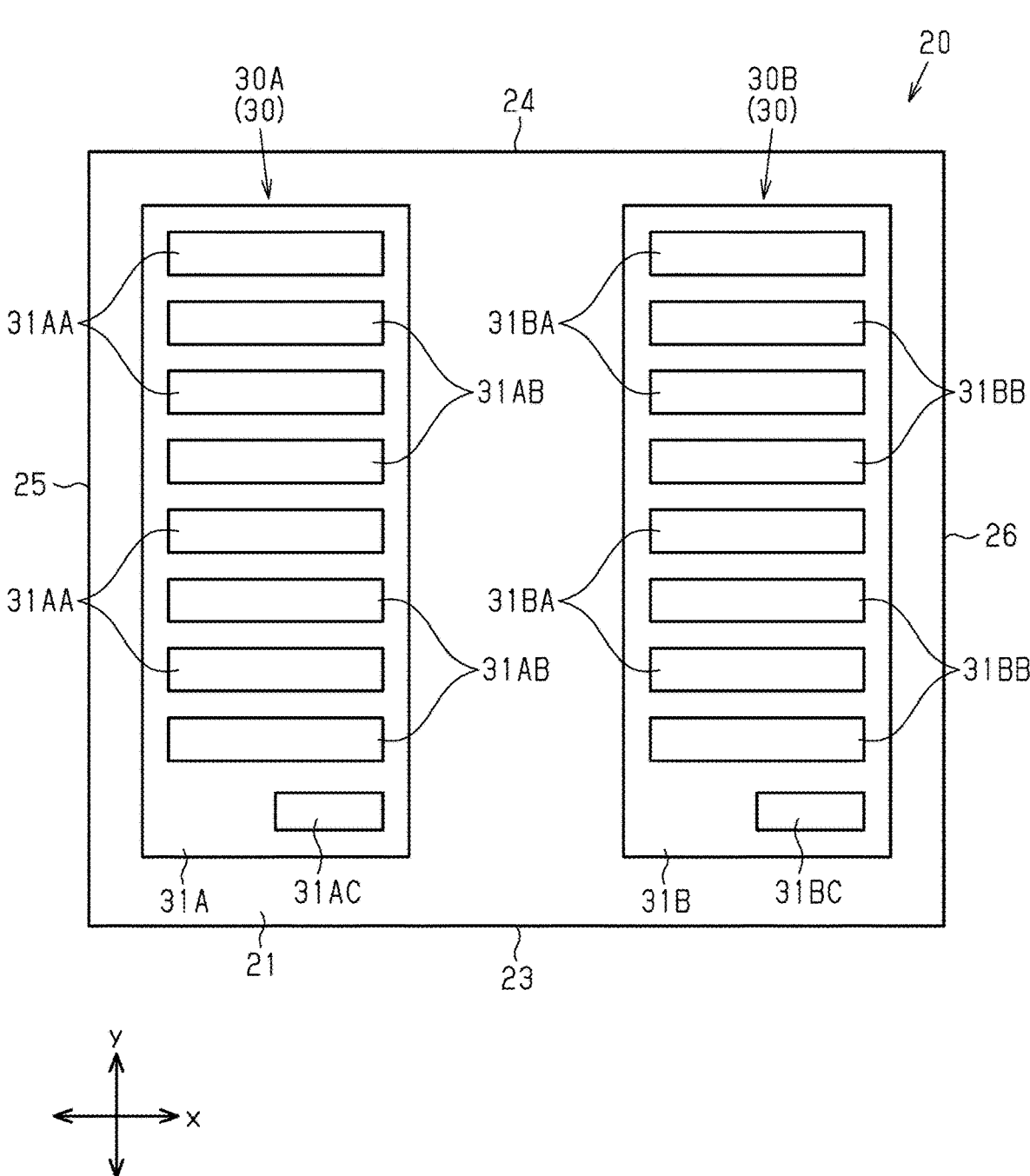
FIG. 31 is a plan view showing a substrate of a modified example of a semiconductor device on which switching elements are mounted.

As shown in FIG. 31, the control via conductors 64P and 64Q and the driver via conductors 65 are omitted in accordance with the omission of the driver 40. Since the driver 40, the control via conductors 64P and 64Q, and the driver via conductors 65 are omitted, the semiconductor device 10 of the modified example shown in FIGS. 31 to 34 is reduced in size in the y-direction as compared to the semiconductor device 10 of the embodiment.

Figure 32:
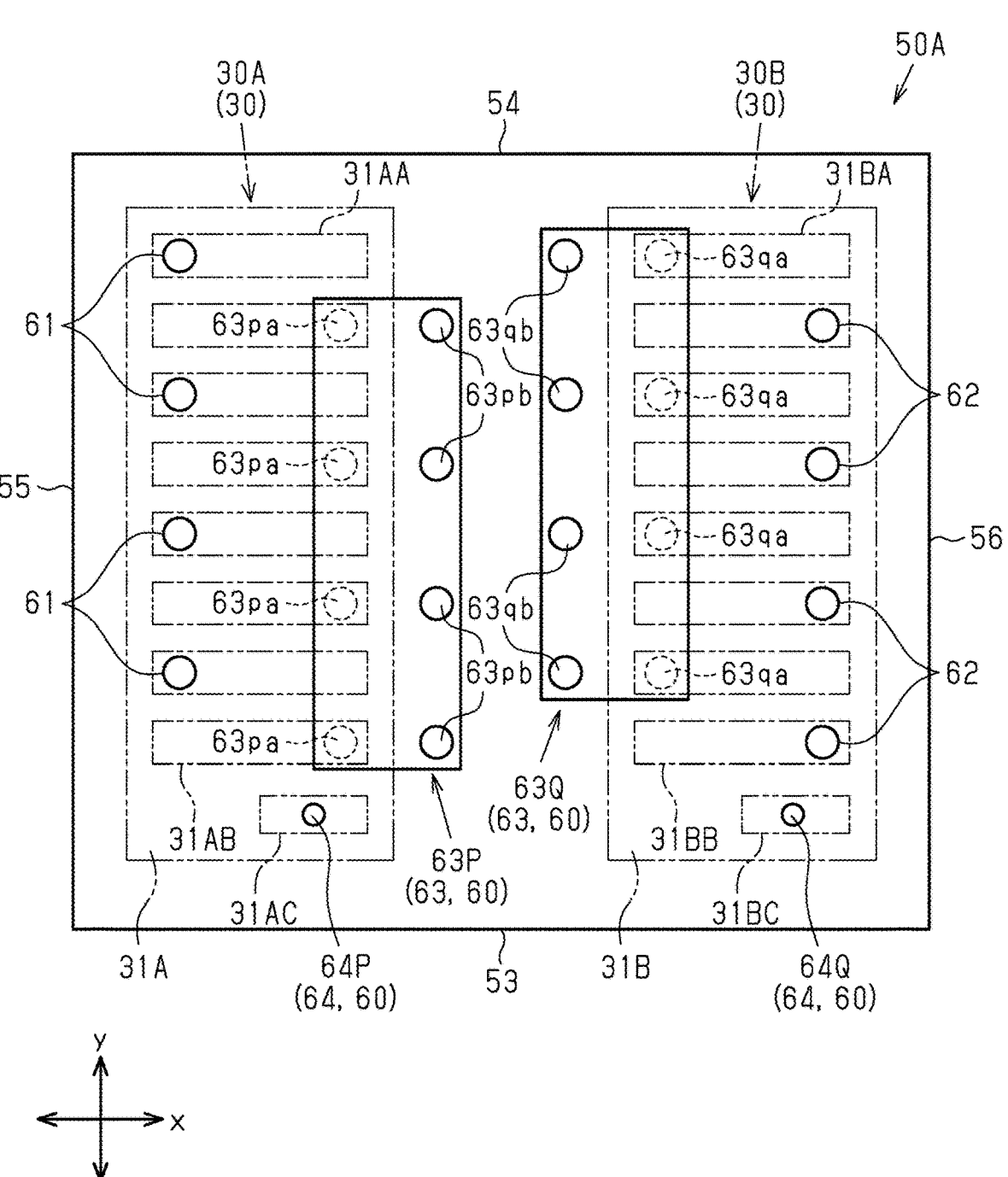
FIG. 32 is a plan view showing an element encapsulation layer of a resin layer in the semiconductor device of the modified example.
Figure 33:
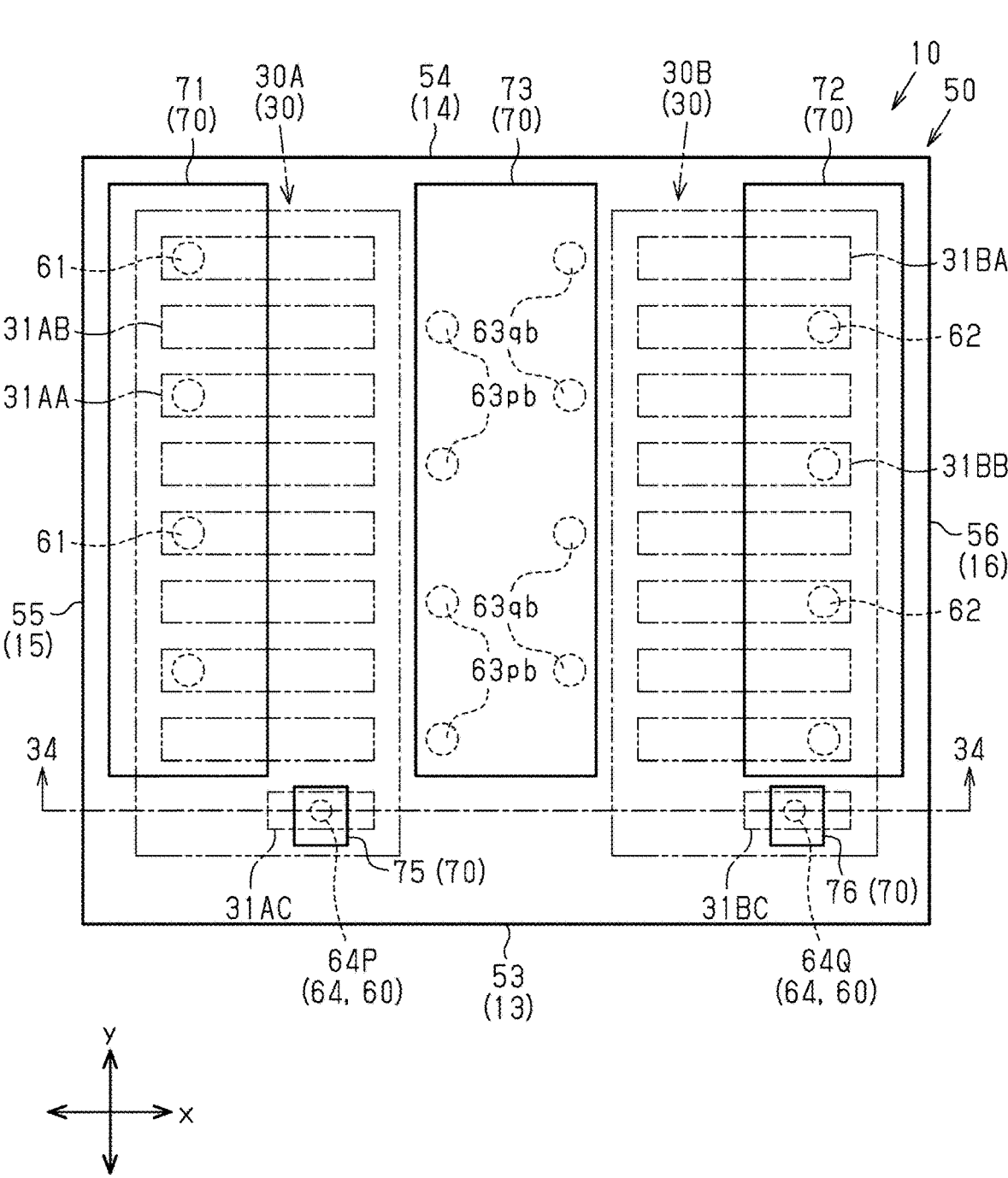
FIG. 33 is a plan view showing the semiconductor device of the modified example.

As shown in FIGS. 32 and 33, the power supply via conductors 61, the ground via conductors 62, and the output via conductors 63 are the same as those of the embodiment. The first control via conductor 64P and the second control via conductor 64Q differ in structure from those of the embodiment.

Figure 34:
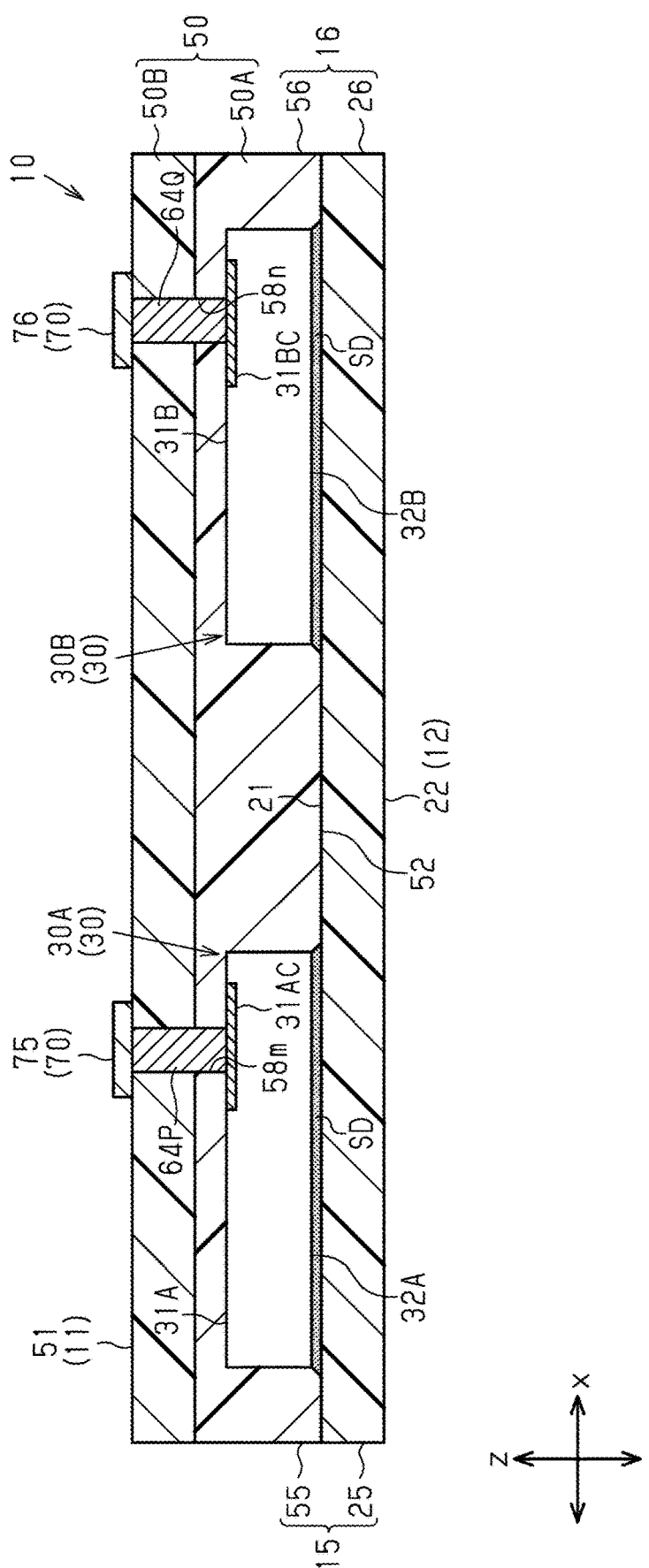
FIG. 34 is a cross-sectional view of the semiconductor device taken along line 34-34 in FIG. 33.

As shown in FIGS. 33 and 34, the external electrodes 70 are formed on the resin main surface 51 of the resin layer 50 and include the power supply electrode 71, the ground electrode 72, the output electrode 73, a first control electrode 75, and a second control electrode 76. The power supply electrode 71, the ground electrode 72, and the output electrode 73 are arranged on the resin main surface 51 in the same manner as these of the embodiment.

The first control electrode 75 is disposed to overlap the control pad electrode 31AC of the first switching element 30A as viewed in the z-direction. The second control electrode 76 is disposed to overlap the control pad electrode 31BC of the second switching element 30B as viewed in the z-direction. The control electrodes 75 and 76 are disposed on the resin main surface 51 at a position closer to the resin side surface 53 than the power supply electrode 71, the ground electrode 72, and the output electrode 73 in the y-direction. The control electrodes 75 and 76 are aligned with each other in the y-direction and spaced apart from each other in the x-direction. In the same manner as the power supply electrode 71 or the like, the control electrodes 75 and 76 each include a Cu layer and a plated layer covering the Cu layer. The Cu layer includes a seed layer formed on the resin main surface 51 and a plated layer formed on the seed layer. The seed layer is formed from, for example, Cu or Ti. The plated layer is formed from Cu. The plated layer covering the Cu layer is formed of a lamination of Ni, Pd, and Au. The control electrodes 75 and 76 are each a terminal for electrical connection to a driver disposed outside the semiconductor device 10. The driver is a circuit that controls the switching elements 30A and 30B in the same manner as the driver 40 of the embodiment.

As shown in FIGS. 33 and 34, the first control via conductor 64P connects the control pad electrode 31AC of the first switching element 30A to the first control electrode 75. As viewed in the z-direction, the first control via conductor 64P is disposed to overlap the control pad electrode 31AC and the first control electrode 75.

As shown in FIG. 34, the first control via conductor 64P extends through the surface-side resin layer 50B and a portion of the element encapsulation layer 50A that covers the first element main surface 31A of the first switching element 30A in the z-direction. The first control via conductor 64P extends in the z-direction. The dimension of the first control via conductor 64P in the z-direction is equal to the dimension of the power supply via conductor 61 in the z-direction. When the difference in the dimension in the z-direction between the first control via conductor 64P and the power supply via conductor 61 is, for example, less than or equal to 10% of the dimension of the first control via conductor 64P in the z-direction, it is considered that the dimension of the first control via conductor 64P in the z-direction is equal to the dimension of the power supply via conductor 61 in the z-direction.

As shown in FIGS. 33 and 34, the second control via conductor 64Q connects the control pad electrode 31BC of the second switching element 30B to the second control electrode 76. As viewed in the z-direction, the second control via conductor 64Q is disposed to overlap the control pad electrode 31BC and the second control electrode 76.

As shown in FIG. 34, the second control via conductor 64Q extends through the surface-side resin layer 50B and a portion of the element encapsulation layer 50A that covers the second element main surface 31B of the second switching element 30B in the z-direction. The second control via conductor 64Q extends in the z-direction. The dimension of the second control via conductor 64Q in the z-direction is equal to the dimension of the ground via conductor 62 in the z-direction. When the difference in the dimension in the z-direction between the second control via conductor 64Q and the ground via conductor 62 in the z-direction is, for example, less than or equal to 10% of the dimension of the second control via conductor 64Q in the z-direction, it is considered that the dimension of the second control via conductor 64Q in the z-direction is equal to the dimension of the ground via conductor 62 in the z-direction.

The method for manufacturing the semiconductor device 10 of the modified example shown in FIGS. 31 to 34 is generally the same as that of the embodiment. Specifically, the method for manufacturing the semiconductor device 10 in the modified example mainly includes a support layer forming step, an element mounting step, an element encapsulation layer forming step, a first via conductor forming step, a surface-side resin layer forming step, a second via conductor forming step, an external electrode forming step, and a cutting step. The support layer forming step is the same as the support layer forming step of the embodiment.

The element mounting step differs in that the switching elements 30A and 30B are mounted on the base member 820 and the driver 40 is not mounted. The process of the switching elements 30A and 30B is the same as the element mounting step of the embodiment. The element encapsulation layer forming step is the same as the element encapsulation layer forming step of the embodiment.

In the first via conductor forming step, the element control vias 64pa and 64qa and the control connection wires 64pc and 64*qc* are formed. In other words, in the first via conductor forming step, the control via conductors 64P and 64Q are not formed. The element control vias 64*pa* and 64*qa* are formed in the same process as the element control vias 64*pa* and 64*qa* of the embodiment. The control connection wires 64*pc* and 64*qc* are formed in the same process as the control connection wires 64*pc* and 64*qc* of the embodiment. In addition, the surface-side resin layer forming step is the same as the surface-side resin layer forming step of the embodiment.

In the second via conductor forming step, the power supply via conductors 61, the ground via conductors 62, the electrode connection vias 63*pb* and 63*qb*, the first control via conductor 64P, and the second control via conductor 64Q are formed. In other words, the driver electrode connection vias 65*b* are not formed in the second via conductor forming step. The power supply via conductors 61, the ground via conductors 62, and the electrode connection vias 63*pb* and 63*qb* are formed in the same process as the power supply via conductors 61, the ground via conductors 62, and the electrode connection vias 63*pb* and 63*qb* of the embodiment. The process of forming the first control via conductor 64P and the second control via conductor 64Q includes a through hole forming step and a via forming step.

In the through hole forming step, the through holes 58*m* and 58*n* are formed by, for example, boring such as laser cutting. The through hole 58*m* is provided to overlap the control pad electrode 31AC of the first switching element 30A as viewed in the z-direction. The through hole 58*m* extends through the surface-side resin layer 50B and a portion of the element encapsulation layer 50A that covers the first element main surface 31A of the first switching element 30A in the z-direction. Thus, the control pad electrode 31AC is exposed from the resin layer 50 through the through hole 58*m* in the z-direction. The through hole 58*n* is provided to overlap the control pad electrode 31BC of the second switching element 30B as viewed in the z-direction. The through hole 58*n* extends through the surface-side resin layer 50B and a portion of the element encapsulation layer 50A that covers the second element main surface 31B of the second switching element 30B in the z-direction. Thus, the control pad electrode 31BC is exposed from the resin layer 50 through the through hole 58*n* in the z-direction.

In the via forming step, metal vias are embedded in the through holes 58*m* and 58*n* to form the first control via conductor 64P and the second control via conductor 64Q. The via forming step of the control via conductors 64P and 64Q is, for example, the same as the via forming step of the power supply via conductors 61.

The external electrode forming step differs from the external electrode forming step of the embodiment in that the control electrodes 75 and 76 are formed and the driver connection electrodes 74 are not formed. The power supply electrode 71, the ground electrode 72, and the output electrode 73 are formed in the same process as those of the embodiment. The first control electrode 75 covers the first control via conductor 64P in the z-direction. The second control electrode 76 covers the second control via conductor 64Q in the z-direction. The control electrodes 75 and 76 are formed in the same process as the power supply electrode 71 and the like and are formed through electroless plating. The cutting step is the same as the cutting step of the embodiment.

Figure 35:
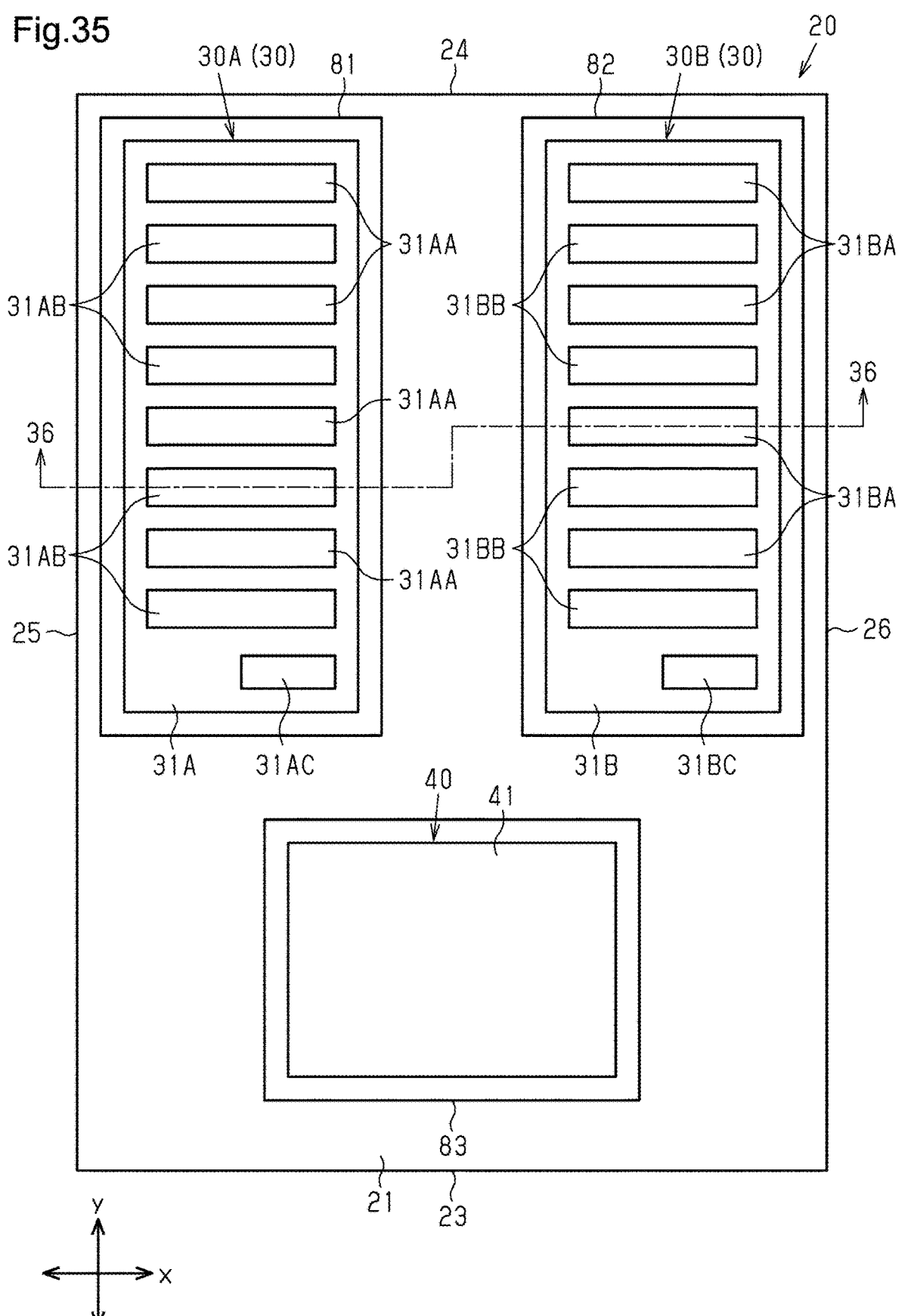
FIG. 35 is a plan view showing a substrate of a modified example of a semiconductor device on which switching elements and a driver are mounted.

In the above embodiment, metal layers 81 to 83 may be formed from metal and disposed on the support layer 20. In an example, as shown in FIG. 35, the metal layer 81 supports the first switching element 30A. In other words, the first switching element 30A is mounted on the metal layer 81. The first switching element 30A is bonded to the metal layer 81 by a bonding material SD. The metal layer 82 supports the second switching element 30B. In other words, the second switching element 30B is mounted on the metal layer 82. The second switching element 30B is bonded to the metal layer 82 by a bonding material SD. The metal layer 83 supports the driver 40. In other words, the driver 40 is mounted on the metal layer 83. The driver 40 is bonded to the metal layer 83 by a bonding material SD. The switching elements 30A and 30B and the driver 40 have the same arrangement relationship and the same size relationship as those in the embodiment. Thus, the metal layer 81 and the metal layer 82 are aligned with each other in the y-direction and spaced apart from each other in the x-direction. The metal layer 83 is disposed on the support layer 20 at a position closer to the support side surface 23 than the metal layers 81 and 82 in the y-direction. The metal layer 83 is disposed in the center of the support layer 20 in the x-direction. In the illustrated example, as viewed in the z-direction, the metal layer 81 is sized to be slightly larger than the first element main surface 31A of the first switching element 30A. The metal layer 82 is sized to be slightly larger than the second element main surface 31B of the second switching element 30B. The metal layer 83 is sized to be slightly larger than the driver main surface 41 of the driver 40. The metal layers 81 to 83 include, for example, a lamination of Ni, Pd, and Au.

Figure 36:
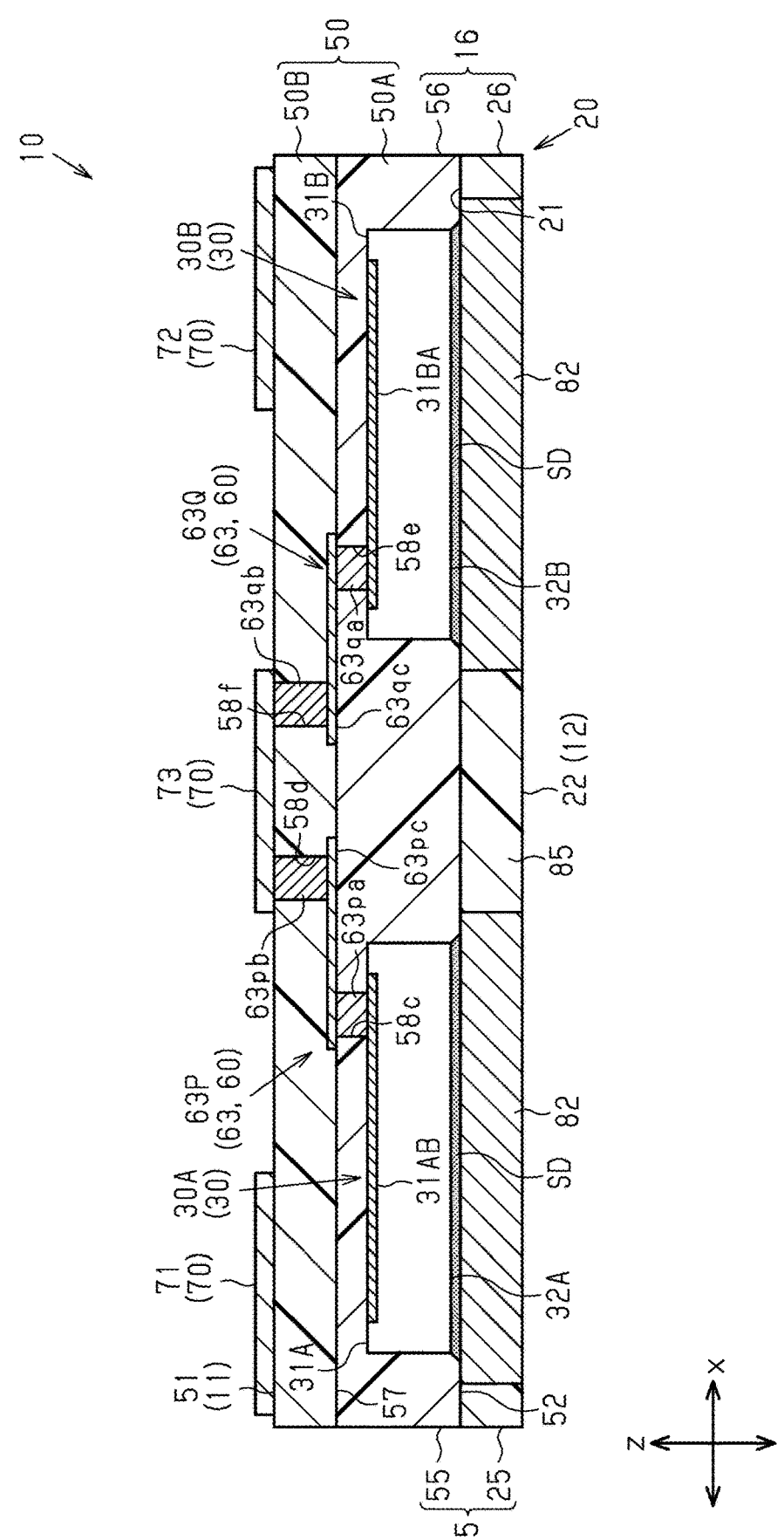
FIG. 36 is a cross-sectional view of the semiconductor device of the modified example taken along line 36-36 in FIG. 35.

As shown in FIG. 36, the metal layers 81 and 82 extend through the support layer 20 in the z-direction. Although not illustrated, the metal layer 83 extends through the support layer 20 in the z-direction in the same manner as the metal layers 81 and 82. The portion of the support layer 20 excluding the metal layers 81 to 82 is formed from the same material as the support layer 20 of the embodiment, that is, an electrically insulating material. Epoxy resin is used as the electrically insulating material. Thus, the support layer 20 includes an insulation layer 85 that electrically insulates the metal layers 81 to 83 from each other.

As described above, the support layer 20 includes the metal layer 81, the metal layer 82, and the insulation layer 85 that electrically insulates the metal layer 81 from the metal layer 82. The metal layer 81 corresponds to a first metal layer on which the first switching element 30A, which is an example of the switching element, is mounted. The metal layer 82 corresponds to a second metal layer on which the second switching element 30B, which is an example of the specified element, is mounted. The specified element is not limited to the second switching element 30B and may be the driver 40. In this case, the metal layer 83 corresponds to the second metal layer.

In the semiconductor device 10 of the modified example shown in FIGS. 35 and 36, heat of the switching elements 30A and 30B is dissipated from the metal layers 81 and 82 to the outside of the semiconductor device 10. This improves the heat dissipation efficiency of the switching elements 30A and 30B. In addition, heat of the driver 40 is dissipated from the metal layer 83 to the outside of the semiconductor device 10. This improves the heat dissipation efficiency of the driver 40.

The method for manufacturing the semiconductor device 10 of the modified example shown in FIGS. 35 and 36 is generally the same as that of the above embodiment. Specifically, the method for manufacturing the semiconductor device 10 in the modified example mainly includes a support layer forming step, an element mounting step, an element encapsulation layer forming step, a first via conductor forming step, a surface-side resin layer forming step, a second via conductor forming step, an external electrode forming step, and a cutting step. The method for manufacturing the semiconductor device 10 of the modified example differs in the external electrode forming step from the embodiment.

Specifically, the external electrode forming step in the method for manufacturing the semiconductor device 10 of the modified example includes a base member processing step and a plated layer forming step. In the base member processing step, through holes are formed so that the metal layers 81 to 83 are formed in portions of the base member 820 corresponding to the switching elements 30A and 30B and the driver 40. The through holes are formed by, for example, laser cutting. In the plated layer forming step, the external electrodes 70 and the metal layers 81 to 83 are formed. The external electrodes 70 and the metal layers 81 to 83 are formed through, for example, electroless plating.

The process of forming the metal layers 81 to 83 is not limited to electroless plating and may be changed in any manner. In an example, metal plates may be formed in advance and as the metal layers 81 to 83. An example of the metal plate is a copper plate or an aluminum plate. In this case, the metal layers 81 to 83 are formed in the support layer forming step instead of the external electrode forming step. Specifically, in the support layer forming step, the metal layers 81 to 83 are disposed on the substrate main surface 801 of the support substrate 800. Subsequently, the base member 820 is formed on the substrate main surface 801.

Figure 37:
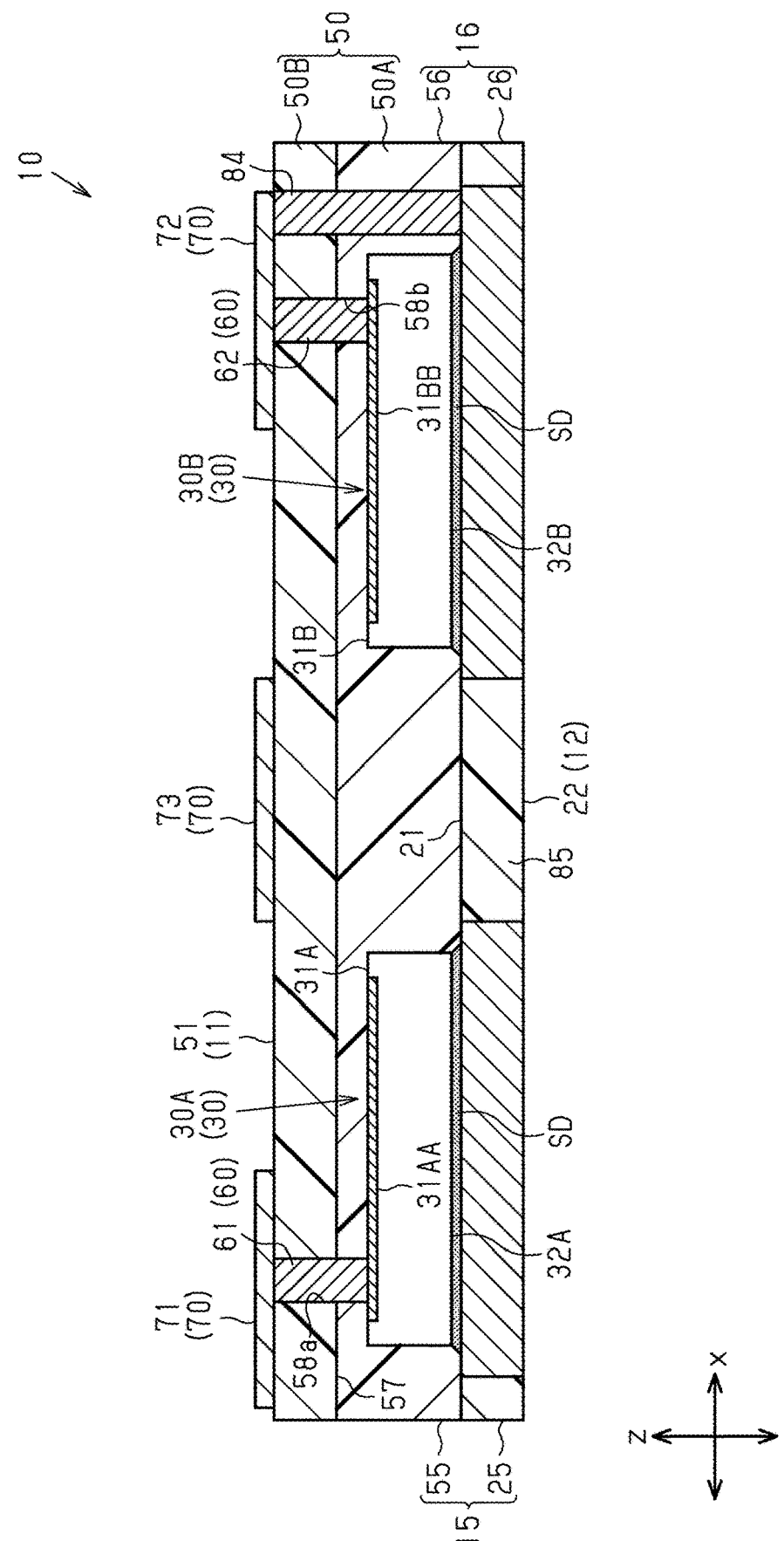
FIG. 37 is a cross-sectional view showing a modified example of a semiconductor device.

In the semiconductor device 10 of the modified example shown in FIGS. 35 and 36, the second drive pad electrodes 31BB of the second switching element 30B may be electrically connected to the metal layer 82. In an example, as shown in FIG. 37, the metal layer 82 includes an extension extending out of the second switching element 30B toward the support side surface 26 and an extension extending out of the second switching element 30B toward the support side surface 25 so that the extension toward the support side surface 26 is greater in the x-direction than the extension toward the support side surface 25. The semiconductor device 10 includes a connection via conductor 84 that connects the ground electrode 72 and the metal layer 82. The connection via conductor 84 is disposed to overlap the ground electrode 72 and the metal layer 82 without overlapping the second switching element 30B as viewed in the z-direction. More specifically, the connection via conductor 84 is disposed adjacent to the second switching element 30B at the side of the device side surface 16 in the x-direction. The connection via conductor 84 extends through the resin layer 50. Thus, the connection via conductor 84 is in contact with the ground electrode 72 and the metal layer 82.

In this structure, the metal layer 82 is electrically connected to the ground electrode 72 by the connection via conductor 84. Thus, the metal layer 82 is also grounded. This reduces the effect of noise on the switching elements 30A and 30B.

Figure 38:
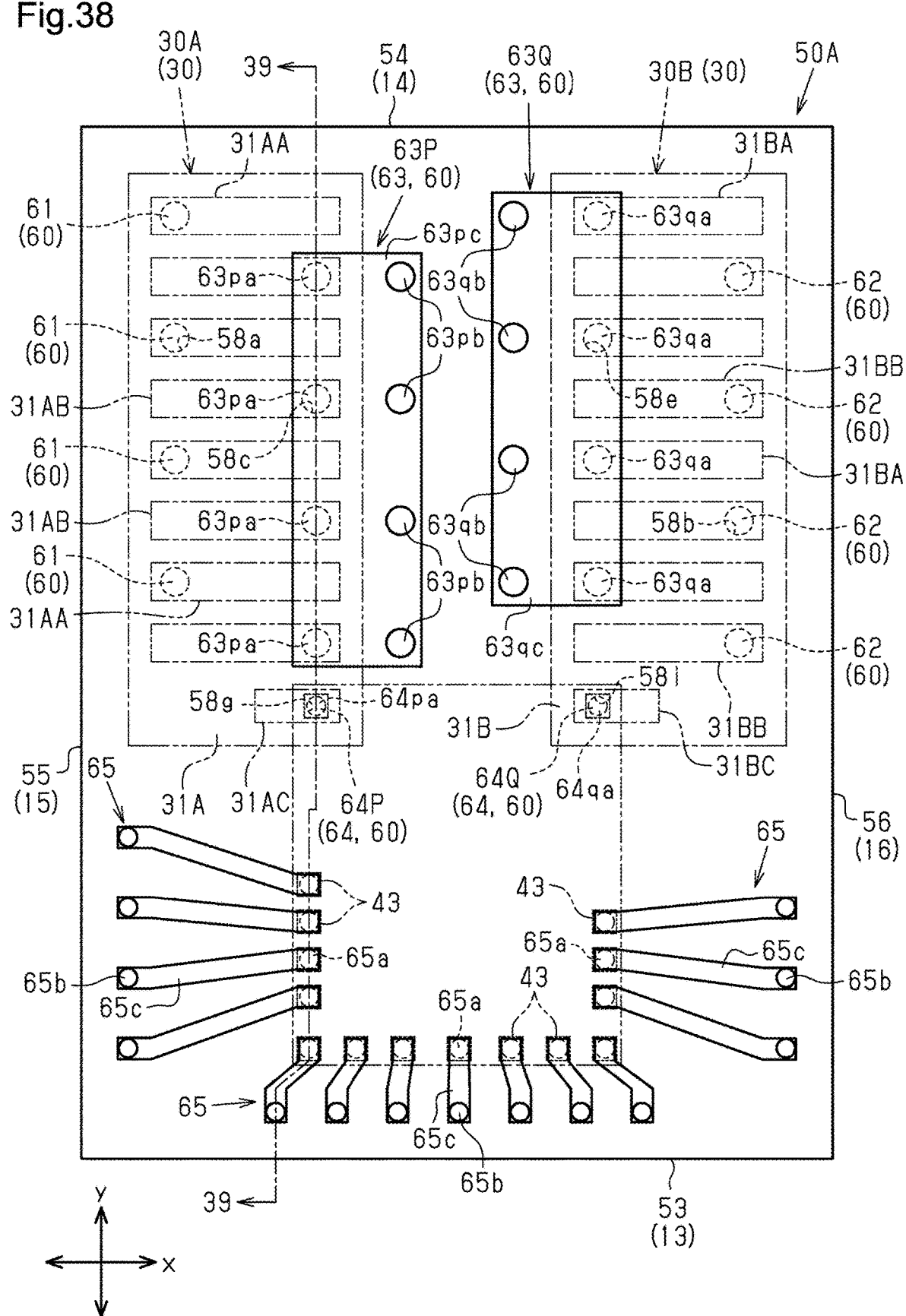
FIG. 38 is a plan view showing an element encapsulation layer of a resin layer in a modified example of a semiconductor device.
Figure 39:
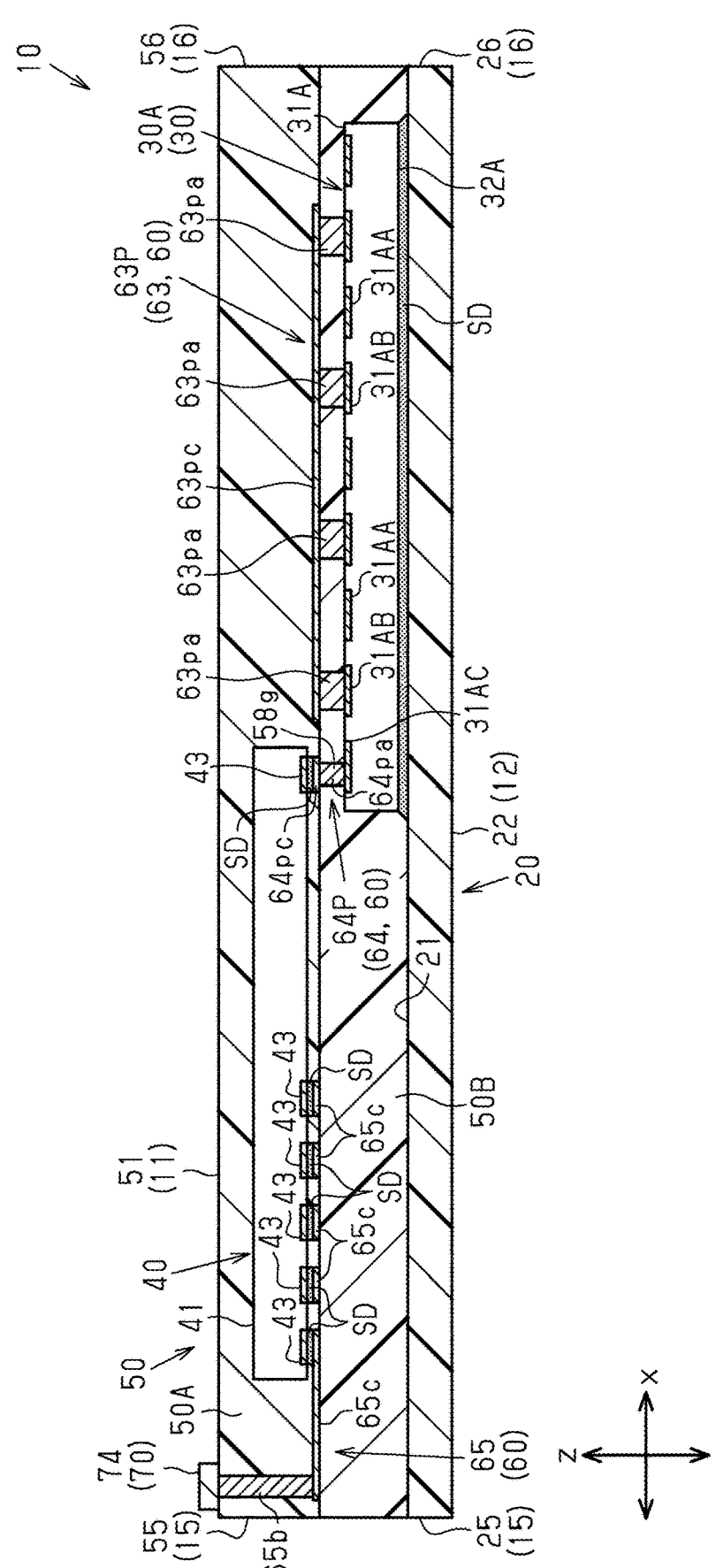
FIG. 39 is a cross-sectional view of the semiconductor device of the modified example taken along line 39-39 in FIG. 38.

In the above embodiment, the driver 40 does not necessarily have to be coplanar with the switching elements 30A and 30B. In an example, as shown in FIGS. 38 and 39, the driver 40 is disposed at a position differing from the switching elements 30A and 30B in the z-direction. More specifically, as shown in FIG. 39, the driver 40 is disposed on the element encapsulation layer 50A. As shown in FIG. 38, the driver 40 is disposed to overlap the switching elements 30A and 30B as viewed in the z-direction. More specifically, the driver 40 is disposed on the element encapsulation layer 50A so that a predetermined driver pad electrode 43 of the driver

40 is disposed to overlap the control pad electrode 31AC of the first switching element 30A and a further driver pad electrode 43 is disposed to overlap the control pad electrode 31BC of the second switching element 30B as viewed in the z-direction. In the illustrated example, the driver 40 is disposed so that the driver main surface 41 faces the device back surface 12 and the driver back surface 42 faces the device main surface 11.

The structure of the first control via conductor 64P and the second control via conductor 64Q differs from the structure of the control via conductors 64P and 64Q of the embodiment.

As viewed in the z-direction, the first control via conductor 64P is disposed to overlap the control pad electrode 31AC of the first switching element 30A and the predetermined driver pad electrode 43 of the driver 40. The first control via conductor 64P includes the first element control via 64*pa* and the first control connection wire 64*pc*. In other words, the first control via conductor 64P does not include the first driver control via 64*pb*. In the same manner as the embodiment, the first element control via 64*pa* extends through a portion of the element encapsulation layer 50A that covers the first element main surface 31A of the first switching element 30A in the z-direction. The first control connection wire 64*pc* covers a portion of the first element control via 64*pa* exposed from the element encapsulation layer 50A. The first control connection wire 64*pc* is rectangular and has substantially the same size as the predetermined driver pad electrode 43. Thus, the first control via conductor 64P extends in the z-direction. The predetermined driver pad electrode 43 is bonded to the first control connection wire 64*pc* by a conductive bonding material formed from solder or Ag paste.

As viewed in the z-direction, the second control via conductor 64Q is disposed to overlap the control pad electrode 31BC of the second switching element 30B and the further driver pad electrode 43 of the driver 40. Although not illustrated, the second control via conductor 64Q includes the second element control via 64*qa* and the second control connection wire 64*qc*. In the same manner as the embodiment, the second element control via 64*qa* extends through a portion of the element encapsulation layer 50A that covers the second element main surface 31B of the second switching element 30B in the z-direction. The second control connection wire 64*qc* covers a portion of the second element control via 64*qa* exposed from the element encapsulation layer 50A. The second control connection wire 64*qc* is rectangular and has substantially the same size as the further driver pad electrode 43. Thus, the second control via conductor 64Q extends in the z-direction. The further driver pad electrode 43 is bonded to the second control connection wire 64*qc* by a conductive bonding material formed from solder or Ag paste.

Although not illustrated, the driver via conductor 65 differs in structure from the driver via conductor 65 of the embodiment. Specifically, in the modified example, the driver connection vias 65*a* are omitted from the driver via conductor 65. In other words, the driver 40 is disposed closer to the device main surface 11 than the via connection wires 65*c* in the z-direction, and the driver pad electrodes 43 are bonded to the via connection wires 65*c* by a conductive bonding material formed from solder or Ag paste.

In the semiconductor device 10 of the modified example shown in FIGS. 38 and 39, the control via conductors 64P and 64Q are shortened. This shortens the conductive paths from the control pad electrodes 31AC and 31BC of the switching elements 30A and 30B to the driver 40. Accordingly, inductance caused by the length of the conductive path is reduced.

In the semiconductor device 10 of the modified example shown in FIGS. 38 and 39, the switching elements 30A and 30B are mounted on the support main surface 21 of the support layer 20, and the driver 40 is mounted on the element encapsulation layer 50A. For example, the switching elements 30A and 30B may be mounted on the element encapsulation layer 50A, and the driver 40 may be mounted on the support main surface 21. In this case, the driver 40 is disposed so that the driver main surface 41 faces the device main surface 11 and the driver back surface 42 faces the device back surface 12. The switching elements 30A and 30B are arranged such that the element main surfaces 31A and 31B face the device back surface 12 and the element back surfaces 32A and 32B face the device main surface 11.

Figure 40:
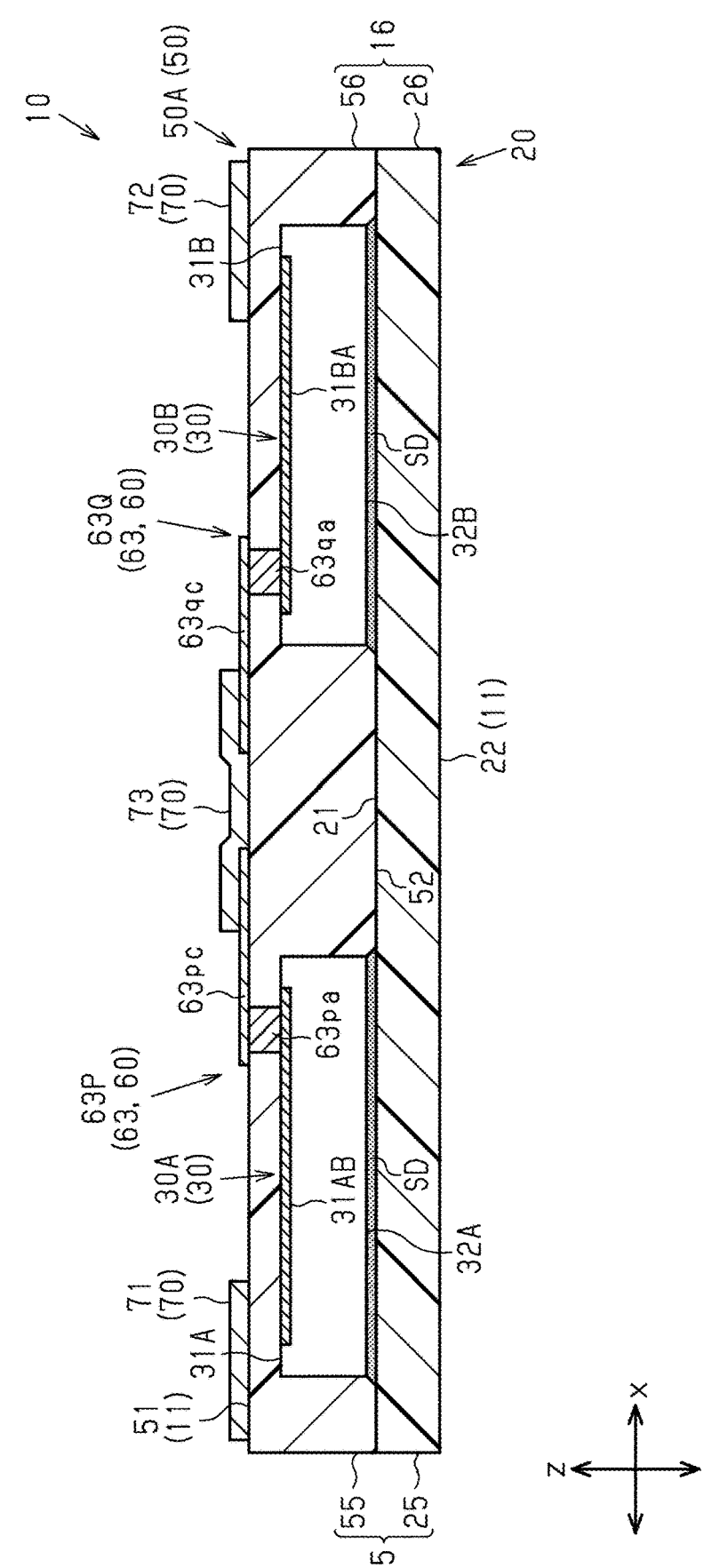
FIG. 40 is a cross-sectional view showing a modified example of a semiconductor device.

In the embodiment, the surface-side resin layer 50B may be omitted from the resin layer 50. In an example, as shown in FIG. 40, the electrode connection vias 63*pb* and 63*qb* are omitted from the output via conductors 63P and 63Q. In other words, the first output via conductor 63P includes the first element connection vias 63*pa* and the first via connection wire 63*pc*. The second output via conductor 63Q includes the second element connection vias 63*qa* and the second via connection wire 63*qc*. The via connection wires 63*pc* and 63*qc* are disposed outside the resin layer 50. The output electrode 73 are formed on the via connection wires 63*pc* and 63*qc*. More specifically, the first via connection wire 63*pc* connects the first element connection vias 63*pa* to the output electrode 73. The second via connection wire 63*qc* connects the second element connection vias 63*qa* to the output electrode 73. The output electrode 73 formed between the first via connection wire 63*pc* and the second via connection wire 63*qc* in the x-direction is formed on the element encapsulation layer 50A.

Although not illustrated, the power supply via conductors 61 extend through portions of the first switching element 30A that cover the first element main surface 31A in the z-direction. The ground via conductors 62 extend through portions of the second switching element 30B that cover the second element main surface 31B in the z-direction. Thus, the dimension of the power supply via conductors 61 and the ground via conductors 62 in the z-direction is smaller than the dimension of the power supply via conductors 61 and the ground via conductors 62 of the embodiment in the z-direction. The power supply electrode 71 and the ground electrode 72 are formed on the element encapsulation layer 50A. The power supply electrode 71 covers portions of the power supply via conductors 61 exposed from the element encapsulation layer 50A. The ground electrode 72 covers portions of the ground via conductors 62 exposed from the element encapsulation layer 50A.

This structure shortens the conductive path from the second drive pad electrodes 31AB of the first switching element 30A to the output electrode 73, the conductive path from the first drive pad electrodes 31BA of the second switching element 30B to the output electrode 73, the conductive path from the first drive pad electrodes 31AA of the first switching element 30A to the power supply electrode 71, and the conductive path from the second drive pad electrodes 31BB of the second switching element 30B to the ground electrode 72. In addition, the conductive path from the driver pad electrode 43 of the driver 40 to the driver connection electrode 74 is shortened. As a result, the inductance caused by the length of the conductive path is reduced.

In the above embodiment, the dimension of the power supply via conductors 61 and the ground via conductors 62 in the z-direction is greater than the dimension of the switching elements 30A and 30B in the z-direction (the thickness of the switching elements 30A and 30B). The dimension of the power supply via conductors 61 and the ground via conductors 62 in the z-direction may be changed in any manner. In an example, the dimension of the power supply via conductors 61 and the ground via conductors 62 in the z-direction may be equal to the dimension of the switching elements 30A and 30B in the z-direction (the thickness of the switching elements 30A and 30B). Alternatively, the dimension of the power supply via conductors 61 and the ground via conductors 62 in the z-direction may be smaller than the dimension of the switching elements 30A and 30B in the z-direction (the thickness of the switching elements 30A and 30B). This structure shortens the conductive path from the first drive pad electrodes 31AA of the first switching element 30A to the power supply electrode 71 and the conductive path from the second drive pad electrodes 31BB of the second switching element 30B to the ground electrode 72. As a result, the inductance caused by the length of the conductive path is reduced.

In the above embodiment, the support layer 20 may be omitted. In this case, the element back surfaces 32 of the switching elements 30A and 30B and the driver back surface 42 of the driver 40 are flush with the resin back surface 52 of the resin layer 50. In other words, the element back surfaces 32 of the switching elements 30A and 30B and the driver back surface 42 of the driver 40 are exposed in the z-direction from the resin layer 50.

In the above embodiment, the first switching element 30A and the second switching element 30B have the same structure. Instead, for example, the first switching element 30A and the second switching element 30B may differ from each other in structure.

In the embodiment, the arrangement of the power supply electrode 71, the ground electrode 72, and the output electrode 73 may be changed in any manner. In an example, the power supply electrode 71 may be disposed between the first switching element 30A and the second switching element 30B in the x-direction, and the output electrode 73 may be disposed to overlap the first switching element 30A as viewed in the z-direction. That is, the arrangement positions may be switched between the power supply electrode 71 and the output electrode 73.

In the above embodiment, in the method for manufacturing the semiconductor device 10, the step of grinding the element encapsulation layer 850A in the z-direction may be omitted from the element encapsulation layer forming step.

In the above embodiment, the thickness of the element encapsulation layer 50A may be changed in any manner. In an example, the thickness of portions of the element encapsulation layer 50A that cover the element main surfaces 31A and 31B of the switching elements 30A and 30B may be greater than or equal to the thickness of the surface-side resin layer 50B. The thickness of a portion of the element encapsulation layer 50A that covers the driver main surface 41 of the driver 40 may be greater than or equal to the thickness of the surface-side resin layer 50B.

Clauses

The technical aspects that are understood from the above embodiment and the modified examples will be described below.

A1. A semiconductor device, comprising:

a switching element;

a specified element;

a resin layer that encapsulates the switching element and the specified element, a thickness-wise direction of the resin layer conforming to a height-wise direction of the semiconductor device;

an external electrode formed on a surface of the resin layer, at least a portion of the external electrode overlapping the switching element as viewed in the height-wise direction; and an element drive via conductor extending through the resin layer in the height-wise direction to electrically connect the switching element and the external electrode.

A2. The semiconductor device according to clause A1, wherein the resin layer includes:

an element encapsulation layer that encapsulates the first switching element and the second switching element, and a surface-side resin layer formed on the element encapsulation layer, and the surface-side resin layer is less in thickness than the element encapsulation layer.

A3. The semiconductor device according to clause A2, wherein the element drive via conductor is smaller in dimension in the height-wise direction than the switching element.

A4. The semiconductor device according to clause A1, wherein the switching element includes a first switching element, and the specified element includes a second switching element connected in series to the first switching element and spaced apart from the first switching element in a direction orthogonal to the height-wise direction, an output electrode is formed on the surface of the resin layer, the semiconductor device further comprises:

an output via conductor that electrically connects the output electrode, the first switching element, and the second switching element, the external electrode includes a power supply electrode and a ground electrode disposed at opposite sides of the output electrode in an arrangement direction of the first switching element and the second switching element, the element drive via includes a power supply via conductor that electrically connects the first switching element and the power supply electrode and a ground via conductor that electrically connects the second switching element and the ground electrode, and the output via conductor is disposed between the power supply via conductor and the ground via conductor in the arrangement direction.

A5. The semiconductor device according to clause A4, wherein each of the first switching element and the second switching element includes a first drive electrode and a second drive electrode, the first drive electrode and the second drive electrode extend in the arrangement direction, the output via conductor is connected to one of two ends of the second drive electrode of the first switching element in the arrangement direction located closer to the output electrode, and the power supply via conductor is connected to one of two ends of the first drive electrode of the first switching element in the arrangement direction located farther from the output electrode.

A6. The semiconductor device according to clause A5, wherein the output via conductor is connected to one of two ends of the first drive electrode of the second switching element in the arrangement direction located closer to the output electrode, and the ground via conductor is connected to one of two ends of the second drive electrode of the second switching element in the arrangement direction located farther from the output electrode.

A7. The semiconductor device according to clause A1, wherein the specified element includes a driver configured to control the switching element, the driver and the switching element are spaced apart from each other in the height-wise direction, the semiconductor device further comprises:

an element control via conductor that electrically connects the switching element and the driver, and the element control via conductor is embedded in the resin layer.

A8. The semiconductor device according to clause A7, wherein the driver is disposed to overlap the switching element as viewed in the height-wise direction, as viewed in the height-wise direction, the element control via conductor is disposed to overlap the driver and the switching element, and the element control via conductor extends in the height-wise direction.

B1. A semiconductor device, comprising:

a first switching element;

a second switching element;

a resin layer that encapsulates the first switching element and the second switching element, a thickness-wise direction of the resin layer conforming to a height-wise direction of the semiconductor device;

an output electrode formed on a surface of the resin layer; and an output via conductor that electrically connects the first switching element, the second switching element, and the output electrode.

B2. The semiconductor device according to clause B1, wherein the output via conductor is disposed in the resin layer.

B3. The semiconductor device according to clause B2, wherein the output via conductor is disposed in the resin layer between the surface of the resin layer and each of the switching elements in the height-wise direction.

B4. The semiconductor device according to any one of clauses B1 to B3, wherein the output via conductor includes:

a first output via conductor that connects the first switching element and the output electrode; and a second output via conductor that connects the second switching element and the output electrode, and the first output via conductor and the second output via conductor are spaced apart from each other in a direction orthogonal to the height-wise direction.

B5. The semiconductor device according to clause B4, wherein each of the first output via conductor and the second output via conductor is crank-shaped.

B6. The semiconductor device according to clause B1, wherein the output via conductor includes:

an element connection via disposed in the resin layer and extending through the resin layer in the height-wise direction; and a via connection wire disposed on the resin layer to connect the element connection via and the output electrode.

C1. A semiconductor device, comprising:

a first switching element;

a second switching element;

a driver configured to drive the switching elements; and a resin layer that encapsulates the switching elements and the driver, wherein a thickness-wise direction of the resin layer conforms to a height-wise direction of the semiconductor device, when two directions that intersect each other and are orthogonal to the height-wise direction are defined as a first direction and a second direction, the first switching element and the second switching element are spaced apart from each other in the first direction, and the switching elements are spaced apart from the driver in the second direction, and the semiconductor device further comprises:

an output electrode formed on a surface of the resin layer;

an output via conductor that electrically connects the first switching element, the second switching element, and the output electrode; and an element control via conductor that is embedded in the resin layer and connects the switching elements and the driver.

C2. The semiconductor device according to clause C1, further comprising:

a power supply electrode and a ground electrode formed on the surface of the resin layer;

a power supply via conductor that extends through the resin layer in the height-wise direction and electrically connects the first switching element and the power supply electrode; and a ground via conductor that extends through the resin layer in the height-wise direction and electrically connects the second switching element and the ground electrode.

D1. A method for manufacturing a semiconductor device, the method comprising:

forming an element encapsulation layer that encapsulates a switching element and a specified element;

forming a first through hole in the element encapsulation layer to expose the switching element;

embedding an element connection via in the first through hole;

forming a via connection wire on the element encapsulation layer so as to be electrically connected to the element connection via;

forming a surface-side resin layer on the element encapsulation layer to encapsulate the via connection wire;

forming a second through hole in the surface-side resin layer to expose the via connection wire;

embedding an electrode connection via in the second through hole; and forming an external electrode on the surface-side resin layer so that the external electrode is connected to the electrode connection via.

D2. A method for manufacturing a semiconductor device, the method comprising:

forming an element encapsulation layer that encapsulates a switching element and a driver configured to drive the switching element;

forming a first through hole in the element encapsulation layer to expose the switching element;

forming a second through hole in the element encapsulation layer to expose the driver;

embedding an element control via in the first through hole;

embedding a driver control via in the second through hole;

forming a control connection wire on the element encapsulation layer to electrically connect the element control via and the driver control via;

forming a surface-side resin layer on the element encapsulation layer to encapsulate the control connection wire.

D3. A method for manufacturing a semiconductor device, the method comprising:

forming a resin layer that encapsulates a switching element and a specified element;

forming a through hole in the resin layer to expose the switching element;

embedding a via conductor in the through hole;

forming an external electrode on a surface of the resin layer so that the external electrode is connected to the via conductor.

D4. The method according to clause D3, wherein the resin layer includes an element encapsulation layer that encapsulates the switching element and the specified element, and a surface-side resin layer formed on the element encapsulation layer, and the through hole extends through the surface-side resin layer and a portion of the element encapsulation layer that covers the switching element.

REFERENCE SIGNS LIST 10) semiconductor device; 20) support layer; 30) switching element; 30A) first switching element; 30B) second switching element; 31) element main surface; 31A) first element main surface; 31B) second element main surface; 32A) first element back surface; 32B) second element back surface; 31AA, 31BA) first drive pad electrode (first drive electrode); 31AB, 31BB) second drive pad electrode (second drive electrode); 31AC, 31BC) control pad electrode (control electrode); 33A) first drive pad electrode (first drive electrode); 33B) second drive pad electrode (second drive electrode); 33C) control pad electrode (control electrode); 40) driver; 43) driver pad electrode; 50) resin layer; 50A) element encapsulation layer; 50B) surface-side resin layer; 51) resin main surface (surface of resin layer); 57 interface; 60) via conductor; 61) power supply via conductor (element drive via conductor); 62) ground via conductor (element drive via conductor); 63) output via conductor; 63P) first output via conductor; 63Q) second output via conductor; 63*pa*) first element connection via; 63*pb*) first electrode connection via; 63*pc*) first via connection wire; 63*qa*) second element connection via; 63*qb*) second electrode connection via; 63*qc*) second via connection wire; 64) element control via conductor; 64P) first control via conductor; 64Q) second control via conductor; 64*pa*) first element control via; 64*pb*) first driver control via; 64*pc*) first control connection wire; 64*qa*) second element control via; 64*qb*) second driver control via; 64*qc*) second control connection wire; 64*a*) element control via; 64*b*) driver control via; 64*c*) control connection wire; 65) driver via conductor; 65*a*) driver connection via; 65*b*) driver electrode connection via; 65*c*) via connection wire; 70) external electrode; 71) power supply electrode; 72) ground electrode; 73) output electrode; 74) driver connection electrode; 81) metal layer (first metal layer); 82) metal layer (second metal layer); 83) metal layer (second metal layer); 84) connection via conductor; 85) insulation layer; 850A) element encapsulation layer; 850B) surface-side resin layer

The invention claimed is:

1. A semiconductor device, comprising:
a switching element;
a specified element;
a resin layer that encapsulates the switching element and the specified element, a thickness-wise direction of the resin layer conforming to a height-wise direction of the semiconductor device;
an external electrode formed on a surface of the resin layer, at least a portion of the external electrode overlapping the switching element as viewed in the height-wise direction; and
an element drive via conductor extending through the resin layer in the height-wise direction to electrically connect the switching element and the external electrode,
wherein
the switching element includes a first switching element,
the specified element includes a second switching element connected in series to the first switching element,
an output electrode is formed on the surface of the resin layer,
the semiconductor device further comprises:
an output via conductor disposed in the resin layer, wherein the output via conductor electrically connects the output electrode, the first switching element, and the second switching element,
the first switching element and the second switching element are spaced apart in a direction orthogonal to the height-wise direction,
as viewed in the height-wise direction, the output electrode is disposed between the first switching element and the second switching element, and
the output via conductor is crank-shaped and extends so as to include at least two bending points.

2. The semiconductor device according to claim 1, further comprising:
a support layer that supports the switching element and the specified element, wherein
the resin layer is formed on the support layer,
the switching element includes an element main surface that faces in a direction opposite from the support layer in the height-wise direction,
the element main surface includes a first drive electrode, a second drive electrode, and a control electrode, and
the support layer and the surface of the resin layer on which the external electrode is formed are disposed at opposite sides of the resin layer in the height-wise direction.

3. The semiconductor device according to claim 2, wherein the support layer includes a first metal layer on which the switching element is mounted, a second metal layer on which the specified element is mounted, and an insulation layer that electrically insulates the first metal layer and the second metal layer.

4. The semiconductor device according to claim 1, wherein
as viewed in the height-wise direction, the element drive via conductor is disposed to overlap the external electrode and the switching element, and the element drive via conductor extends in the height-wise direction.

5. The semiconductor device according to claim 1, wherein
each of the first switching element and the second switching element includes a first drive electrode, a second drive electrode, and a control electrode,
the output via conductor includes:
a first output via conductor that connects the second drive electrode of the first switching element and the output electrode; and
a second output via conductor that connects the first drive electrode of the second switching element and the output electrode, and
the first output via conductor and the second output via conductor are spaced apart in an arrangement direction of the first switching element and the second switching element.

6. The semiconductor device according to claim 5, wherein
the resin layer includes
an element encapsulation layer that encapsulates the first switching element and the second switching element, and
a surface-side resin layer formed on the element encapsulation layer,
the first output via conductor includes
a first element connection via electrically connected to the second drive electrode of the first switching element,
a first electrode connection via connected to the output electrode, and
a first via connection wire that connects the first element connection via and the first electrode connection via,
the second output via conductor includes
a second element connection via electrically connected to the first drive electrode of the second switching element,
a second electrode connection via connected to the output electrode, and
a second via connection wire that connects the second element connection via and the second electrode connection via,
the first element connection via and the second element connection via extend through the element encapsulation layer in the height-wise direction,
the first electrode connection via and the second electrode connection via extend through the surface-side resin layer in the height-wise direction, and
the first via connection wire and the second via connection wire are disposed on the element encapsulation layer.

7. The semiconductor device according to claim 1, further comprising:
a support layer that supports the first switching element and the second switching element, wherein
the resin layer is formed on the support layer,
the support layer includes a metal layer on which the second switching element is mounted,
the external electrode includes a ground electrode spaced apart from the output electrode in a direction orthogonal to the height-wise direction, the ground electrode being an electrode connected to ground,
the element drive via conductor includes a ground via conductor that electrically connects the second switching element and the ground electrode,
the ground electrode includes an extension extending out from the second switching element toward a side opposite from the output electrode and overlapping the metal layer as viewed in the height-wise direction, and the semiconductor device further comprises a connection via conductor formed in a portion of the resin layer that overlaps with the extension as viewed in the height-wise direction, the connection via conductor extending through the resin layer in the height-wise direction to connect the extension and the metal layer.

8. The semiconductor device according to claim 1, wherein the first switching element and the second switching element are formed from GaN.

9. The semiconductor device according to claim 1, further comprising a driver configured to control the switching element, wherein the driver and the switching element are spaced apart from each other in a direction orthogonal to the height-wise direction, and the semiconductor device further comprises:

an element control via conductor that electrically connects the switching element and the driver, the element control via conductor being embedded in the resin layer.

10. The semiconductor device according to claim 9, wherein the resin layer includes an element encapsulation layer that encapsulates the switching element, and a surface-side resin layer formed on the element encapsulation layer, the switching element includes a control electrode configured to control the switching element, the element control via conductor includes a driver control via electrically connected to the driver, an element control via electrically connected to the control electrode, and a control connection wire that connects the driver control via and the element control via, the driver control via extends in the height-wise direction through a portion of the element encapsulation layer that covers the driver in the height-wise direction, the element control via extends in the height-wise direction through a portion of the element encapsulation layer that covers the switching element in the height-wise direction, and the control connection wire is disposed on the element encapsulation layer.

11. The semiconductor device according to claim 10, wherein the external electrode includes a driver connection electrode electrically connected to the driver, and the semiconductor device further comprises:

a driver via conductor provided in the resin layer, wherein the driver via conductor electrically connects the driver connection electrode and the driver.

12. The semiconductor device according to claim 11, wherein the driver connection electrode is disposed not to overlap the driver as viewed in the height-wise direction, and the driver via conductor is crank-shaped.

13. The semiconductor device according to claim 12, wherein the driver via conductor includes a driver connection via electrically connected to the driver, a driver electrode connection via connected to the driver connection electrode, and a via connection wire that connects the driver connection via and the driver electrode connection via, the driver connection via extends through the element encapsulation layer in the height-wise direction, the driver electrode connection via extends through the surface-side resin layer in the height-wise direction, and the via connection wire is disposed on the element encapsulation layer.

\* \* \* \* \*